US011696081B2

(12) United States Patent
Bush

(10) Patent No.: US 11,696,081 B2
(45) Date of Patent: Jul. 4, 2023

(54) AUDIO SETTINGS BASED ON ENVIRONMENT

(71) Applicant: Sonos, Inc., Santa Barbara, CA (US)

(72) Inventor: William H. Bush, Santa Clarita, CA (US)

(73) Assignee: Sonos, Inc., Santa Barbara, CA (US)

( * ) Notice: Subject to any disclaimer, the term of this patent is extended or adjusted under 35 U.S.C. 154(b) by 125 days.

(21) Appl. No.: 17/113,799

(22) Filed: Dec. 7, 2020

(65) Prior Publication Data

US 2021/0105568 A1 Apr. 8, 2021

Related U.S. Application Data

(63) Continuation of application No. 16/564,684, filed on Sep. 9, 2019, now Pat. No. 10,863,295, which is a
(Continued)

(51) Int. Cl.
*H04R 29/00* (2006.01)
*H03G 5/16* (2006.01)
(Continued)

(52) U.S. Cl.
CPC .............. *H04R 29/002* (2013.01); *H03G 3/32* (2013.01); *H03G 5/165* (2013.01); *H04R 3/00* (2013.01);
(Continued)

(58) Field of Classification Search
CPC ........ H03G 5/165; H03G 3/32; H04R 29/002; H04R 3/04; H04R 3/00; H04R 29/00; H04R 2430/01; H04S 7/301; H04S 7/305
(Continued)

(56) References Cited

U.S. PATENT DOCUMENTS 4,306,113 A 12/1981 Morton
4,342,104 A 7/1982 Jack
(Continued)

FOREIGN PATENT DOCUMENTS

CN 1369188 A 9/2002
CN 1447624 A 10/2003
(Continued)

OTHER PUBLICATIONS

Non-Final Office Action dated Sep. 16, 2020, issued in connection with U.S. Appl. No. 16/115,525, filed Aug. 28, 2018, 11 pages.
(Continued)

*Primary Examiner* — Ishrat I Sherali
(74) *Attorney, Agent, or Firm* — Fortem IP LLP; Benjamin Urban

(57) ABSTRACT

Techniques described herein may involve audio settings based on an environment. An example implementation may involve a playback device playing back first audio content and during playback of at least a portion of the first audio content, detecting, via the at least one microphone, an audio signal. At least a portion of the detected audio signal may include a reflection of the first audio content played back by the playback device. The playback device may determine an equalization setting based on at least the determined one or more reflection characteristics and apply the determined equalization setting during playback of second audio content.

38 Claims, 9 Drawing Sheets

Related U.S. Application Data continuation of application No. 16/181,213, filed on Nov. 5, 2018, now Pat. No. 10,412,517, which is a continuation of application No. 15/872,979, filed on Jan. 16, 2018, now Pat. No. 10,129,675, which is a continuation of application No. 15/207,682, filed on Jul. 12, 2016, now Pat. No. 9,872,119, which is a continuation of application No. 14/681,465, filed on Apr. 8, 2015, now Pat. No. 9,419,575, which is a continuation of application No. 14/216,306, filed on Mar. 17, 2014, now Pat. No. 9,219,460.

(51) Int. Cl.
*H04R 3/00* (2006.01)
*H04R 3/04* (2006.01)
*H04S 7/00* (2006.01)
*H03G 3/32* (2006.01)

(52) U.S. Cl.
CPC ............. *H04R 3/04* (2013.01); *H04R 29/00* (2013.01); *H04S 7/301* (2013.01); *H04S 7/305* (2013.01); *H04R 2430/01* (2013.01)

(58) Field of Classification Search
USPC ........................................................ 381/103
See application file for complete search history.

(56) References Cited

U.S. PATENT DOCUMENTS

| | | |
|---|---|---|
| 4,504,704 A | 3/1985 | Ohyaba et al. |
| 4,592,088 A | 5/1986 | Shimada |
| 4,628,530 A | 12/1986 | Op De Beek et al. |
| 4,631,749 A | 12/1986 | Rapaich |
| 4,694,484 A | 9/1987 | Atkinson et al. |
| 4,773,094 A | 9/1988 | Dolby |
| 4,995,778 A | 2/1991 | Bruessel |
| 5,218,710 A | 6/1993 | Yamaki et al. |
| 5,255,326 A | 10/1993 | Stevenson |
| 5,323,257 A | 6/1994 | Abe et al. |
| 5,386,478 A | 1/1995 | Plunkett |
| 5,440,644 A | 8/1995 | Farinelli et al. |
| 5,553,147 A | 9/1996 | Pineau |
| 5,581,621 A | 12/1996 | Koyama et al. |
| 5,754,774 A | 5/1998 | Bittinger et al. |
| 5,757,927 A | 5/1998 | Gerzon et al. |
| 5,761,320 A | 6/1998 | Farinelli et al. |
| 5,910,991 A | 6/1999 | Farrar |
| 5,923,902 A | 7/1999 | Inagaki |
| 5,939,656 A | 8/1999 | Suda |
| 6,018,376 A | 1/2000 | Nakatani |
| 6,032,202 A | 2/2000 | Lea et al. |
| 6,072,879 A | 6/2000 | Ouchi et al. |
| 6,111,957 A | 8/2000 | Thomasson |
| 6,256,554 B1 | 7/2001 | Dilorenzo |
| 6,363,155 B1 | 3/2002 | Horbach |
| 6,404,811 B1 | 6/2002 | Cvetko et al. |
| 6,469,633 B1 | 10/2002 | Wachter et al. |
| 6,522,886 B1 | 2/2003 | Youngs et al. |
| 6,573,067 B1 | 6/2003 | Dib-Hajj et al. |
| 6,611,537 B1 | 8/2003 | Edens et al. |
| 6,631,410 B1 | 10/2003 | Kowalski et al. |
| 6,639,989 B1 | 10/2003 | Zacharov et al. |
| 6,643,744 B1 | 11/2003 | Cheng |
| 6,704,421 B1 | 3/2004 | Kitamura |
| 6,721,428 B1 | 4/2004 | Allred et al. |
| 6,731,760 B2 | 5/2004 | Pedersen |
| 6,757,517 B2 | 6/2004 | Chang |
| 6,760,451 B1 | 7/2004 | Craven et al. |
| 6,766,025 B1 | 7/2004 | Levy et al. |
| 6,778,869 B2 | 8/2004 | Champion |
| 6,798,889 B1 | 9/2004 | Dicker et al. |
| 6,862,440 B2 | 3/2005 | Sampath |
| 6,916,980 B2 | 7/2005 | Ishida et al. |
| 6,931,134 B1 | 8/2005 | Waller, Jr. et al. |
| 6,985,694 B1 | 1/2006 | De Bonet et al. |
| 6,990,211 B2 | 1/2006 | Parker |
| 7,031,476 B1 | 4/2006 | Chrisop et al. |
| 7,039,212 B2 | 5/2006 | Poling et al. |
| 7,058,186 B2 | 6/2006 | Tanaka |
| 7,072,477 B1 | 7/2006 | Kincaid |
| 7,092,535 B1 | 8/2006 | Pedersen et al. |
| 7,092,537 B1 | 8/2006 | Allred et al. |
| 7,103,187 B1 | 9/2006 | Neuman |
| 7,130,608 B2 | 10/2006 | Hollstrom et al. |
| 7,130,616 B2 | 10/2006 | Janik |
| 7,143,939 B2 | 12/2006 | Henzerling |
| 7,187,947 B1 | 3/2007 | White et al. |
| 7,236,773 B2 | 6/2007 | Thomas |
| 7,289,637 B2 | 10/2007 | Montag et al. |
| 7,295,548 B2 | 11/2007 | Blank et al. |
| 7,312,785 B2 | 12/2007 | Tsu et al. |
| 7,391,791 B2 | 6/2008 | Balassanian et al. |
| 7,477,751 B2 | 1/2009 | Lyon et al. |
| 7,483,538 B2 | 1/2009 | McCarty et al. |
| 7,483,540 B2 | 1/2009 | Rabinowitz et al. |
| 7,489,784 B2 | 2/2009 | Yoshino |
| 7,490,044 B2 | 2/2009 | Kulkarni |
| 7,492,909 B2 | 2/2009 | Carter et al. |
| 7,519,188 B2 | 4/2009 | Berardi et al. |
| 7,529,377 B2 | 5/2009 | Nackvi et al. |
| 7,571,014 B1 | 8/2009 | Lambourne et al. |
| 7,590,772 B2 | 9/2009 | Marriott et al. |
| 7,630,500 B1 | 12/2009 | Beckman et al. |
| 7,630,501 B2 | 12/2009 | Blank et al. |
| 7,643,894 B2 | 1/2010 | Braithwaite et al. |
| 7,657,910 B1 | 2/2010 | McAulay et al. |
| 7,664,276 B2 | 2/2010 | Mckee |
| 7,676,044 B2 | 3/2010 | Sasaki et al. |
| 7,689,305 B2 | 3/2010 | Kreifeldt et al. |
| 7,697,701 B2 | 4/2010 | Pedersen et al. |
| 7,720,237 B2 | 5/2010 | Bharitkar et al. |
| 7,742,740 B2 | 6/2010 | Goldberg et al. |
| 7,769,183 B2 | 8/2010 | Bharitkar et al. |
| 7,796,068 B2 | 9/2010 | Raz et al. |
| 7,835,689 B2 | 11/2010 | Goldberg et al. |
| 7,853,341 B2 | 12/2010 | McCarty et al. |
| 7,876,903 B2 | 1/2011 | Sauk |
| 7,925,203 B2 | 4/2011 | Lane et al. |
| 7,949,140 B2 | 5/2011 | Kino |
| 7,949,707 B2 | 5/2011 | McDowall et al. |
| 7,961,893 B2 | 6/2011 | Kino |
| 7,970,922 B2 | 6/2011 | Svendsen |
| 7,987,294 B2 | 7/2011 | Bryce et al. |
| 8,005,228 B2 | 8/2011 | Bharitkar et al. |
| 8,014,423 B2 | 9/2011 | Thaler et al. |
| 8,042,961 B2 | 10/2011 | Massara et al. |
| 8,045,721 B2 | 10/2011 | Burgan et al. |
| 8,045,952 B2 | 10/2011 | Qureshey et al. |
| 8,050,652 B2 | 11/2011 | Qureshey et al. |
| 8,063,698 B2 | 11/2011 | Howard |
| 8,074,253 B1 | 12/2011 | Nathan |
| 8,103,009 B2 | 1/2012 | McCarty et al. |
| 8,116,476 B2 | 2/2012 | Inohara |
| 8,126,156 B2 | 2/2012 | Corbett et al. |
| 8,126,172 B2 | 2/2012 | Horbach et al. |
| 8,131,390 B2 | 3/2012 | Braithwaite et al. |
| 8,139,774 B2 | 3/2012 | Berardi et al. |
| 8,144,883 B2 | 3/2012 | Pdersen et al. |
| 8,160,276 B2 | 4/2012 | Liao et al. |
| 8,160,281 B2 | 4/2012 | Kim et al. |
| 8,170,260 B2 | 5/2012 | Reining et al. |
| 8,175,292 B2 | 5/2012 | Aylward et al. |
| 8,175,297 B1 | 5/2012 | Ho et al. |
| 8,194,874 B2 | 6/2012 | Starobin et al. |
| 8,229,125 B2 | 7/2012 | Short |
| 8,233,632 B1 | 7/2012 | MacDonald et al. |
| 8,234,395 B2 | 7/2012 | Millington |
| 8,238,547 B2 | 8/2012 | Ohki et al. |
| 8,238,578 B2 | 8/2012 | Aylward |
| 8,243,961 B1 | 8/2012 | Morrill |
| 8,264,408 B2 | 9/2012 | Kainulainen et al. |
| 8,265,310 B2 | 9/2012 | Berardi et al. |

(56) References Cited

U.S. PATENT DOCUMENTS

| | | |
|---|---|---|
| 8,270,620 B2 | 9/2012 | Christensen et al. |
| 8,279,709 B2 | 10/2012 | Choisel et al. |
| 8,281,001 B2 | 10/2012 | Busam et al. |
| 8,290,185 B2 | 10/2012 | Kim |
| 8,291,349 B1 | 10/2012 | Park et al. |
| 8,300,845 B2 | 10/2012 | Zurek et al. |
| 8,306,235 B2 | 11/2012 | Mahowald |
| 8,325,931 B2 | 12/2012 | Howard et al. |
| 8,325,935 B2 | 12/2012 | Rutschman |
| 8,325,944 B1 | 12/2012 | Duwenhorst et al. |
| 8,331,585 B2 | 12/2012 | Hagen et al. |
| 8,332,414 B2 | 12/2012 | Nguyen et al. |
| 8,379,876 B2 | 2/2013 | Zhang |
| 8,385,557 B2 | 2/2013 | Tashev et al. |
| 8,391,501 B2 | 3/2013 | Khawand et al. |
| 8,392,505 B2 | 3/2013 | Haughay et al. |
| 8,401,202 B2 | 3/2013 | Brooking |
| 8,433,076 B2 | 4/2013 | Zurek et al. |
| 8,452,020 B2 | 5/2013 | Gregg et al. |
| 8,463,184 B2 | 6/2013 | Dua |
| 8,483,853 B1 | 7/2013 | Lambourne |
| 8,488,799 B2 | 7/2013 | Goldstein et al. |
| 8,503,669 B2 | 8/2013 | Mao |
| 8,527,876 B2 | 9/2013 | Wood et al. |
| 8,577,045 B2 | 11/2013 | Gibbs |
| 8,577,048 B2 | 11/2013 | Chaikin et al. |
| 8,600,075 B2 | 12/2013 | Lim |
| 8,620,006 B2 | 12/2013 | Berardi et al. |
| 8,682,002 B2 | 3/2014 | Wihardja et al. |
| 8,731,206 B1 | 5/2014 | Park |
| 8,755,538 B2 | 6/2014 | Kwon |
| 8,798,280 B2 | 8/2014 | Goldberg et al. |
| 8,819,554 B2 | 8/2014 | Basso et al. |
| 8,831,244 B2 | 9/2014 | Apfel |
| 8,855,319 B2 | 10/2014 | Liu et al. |
| 8,862,273 B2 | 10/2014 | Karr |
| 8,879,761 B2 | 11/2014 | Johnson et al. |
| 8,903,526 B2 | 12/2014 | Beckhardt et al. |
| 8,914,559 B2 | 12/2014 | Kalayjian et al. |
| 8,930,005 B2 | 1/2015 | Reimann |
| 8,934,647 B2 | 1/2015 | Joyce et al. |
| 8,934,655 B2 | 1/2015 | Breen et al. |
| 8,942,252 B2 | 1/2015 | Balassanian et al. |
| 8,965,033 B2 | 2/2015 | Wiggins |
| 8,965,546 B2 | 2/2015 | Visser et al. |
| 8,977,974 B2 | 3/2015 | Kraut |
| 8,984,442 B2 | 3/2015 | Pirnack et al. |
| 8,989,406 B2 | 3/2015 | Wong et al. |
| 8,995,687 B2 | 3/2015 | Marino, Jr. et al. |
| 8,995,688 B1 | 3/2015 | Chemtob et al. |
| 8,996,370 B2 | 3/2015 | Ansell |
| 9,020,153 B2 | 4/2015 | Britt, Jr. |
| 9,021,153 B2 | 4/2015 | Lu |
| 9,042,556 B2 | 5/2015 | Kallai et al. |
| 9,065,929 B2 | 6/2015 | Chen et al. |
| 9,084,058 B2 | 7/2015 | Reilly et al. |
| 9,100,766 B2 | 8/2015 | Soulodre et al. |
| 9,106,192 B2 | 8/2015 | Sheen et al. |
| 9,179,233 B2 | 11/2015 | Kang |
| 9,215,545 B2 | 12/2015 | Dublin et al. |
| 9,219,460 B2 | 12/2015 | Bush |
| 9,231,545 B2 | 1/2016 | Agustin et al. |
| 9,247,365 B1 | 1/2016 | Ellis et al. |
| 9,264,839 B2 | 2/2016 | Oishi et al. |
| 9,286,384 B2 | 3/2016 | Kuper et al. |
| 9,288,597 B2 | 3/2016 | Carlsson et al. |
| 9,300,266 B2 | 3/2016 | Grokop |
| 9,307,340 B2 | 4/2016 | Seefeldt |
| 9,319,816 B1 | 4/2016 | Narayanan |
| 9,398,392 B2 | 7/2016 | Ridihalgh et al. |
| 9,451,377 B2 | 9/2016 | Massey et al. |
| 9,462,399 B2 | 10/2016 | Bharitkar et al. |
| 9,467,779 B2 | 10/2016 | Iyengar et al. |
| 9,472,201 B1 | 10/2016 | Sleator |
| 9,473,207 B2 | 10/2016 | McCormack et al. |
| 9,489,948 B1 | 11/2016 | Chu et al. |
| 9,524,098 B2 | 12/2016 | Griffiths et al. |
| 9,538,305 B2 | 1/2017 | Lehnert et al. |
| 9,538,308 B2 | 1/2017 | Isaac et al. |
| 9,544,701 B1 | 1/2017 | Rappoport |
| 9,560,449 B2 | 1/2017 | Carlsson et al. |
| 9,560,460 B2 | 1/2017 | Chaikin et al. |
| 9,584,915 B2 | 2/2017 | Fullam et al. |
| 9,609,383 B1 | 3/2017 | Hirst |
| 9,615,171 B1 | 4/2017 | O'Neill et al. |
| 9,648,422 B2 | 5/2017 | Sheen et al. |
| 9,654,073 B2 | 5/2017 | Apodaca |
| 9,674,625 B2 | 6/2017 | Armstrong-Muntner et al. |
| 9,686,625 B2 | 6/2017 | Patel |
| 9,689,960 B1 | 6/2017 | Barton et al. |
| 9,690,271 B2 | 6/2017 | Sheen et al. |
| 9,690,539 B2 | 6/2017 | Sheen et al. |
| 9,693,165 B2 | 6/2017 | Downing et al. |
| 9,699,582 B2 | 7/2017 | Sheerin et al. |
| 9,706,323 B2 | 7/2017 | Sheen et al. |
| 9,715,365 B2 | 7/2017 | Kusano et al. |
| 9,723,420 B2 | 8/2017 | Family et al. |
| 9,729,984 B2 | 8/2017 | Tan et al. |
| 9,736,584 B2 | 8/2017 | Sheen et al. |
| 9,743,207 B1 | 8/2017 | Hartung |
| 9,743,208 B2 | 8/2017 | Oishi et al. |
| 9,749,763 B2 | 8/2017 | Sheen |
| 9,763,018 B1 | 9/2017 | McPherson et al. |
| 9,781,532 B2 | 10/2017 | Sheen |
| 9,788,113 B2 | 10/2017 | Wilberding et al. |
| 9,794,722 B2 | 10/2017 | Petrov |
| 9,807,536 B2 | 10/2017 | Liu et al. |
| 9,810,784 B2 | 11/2017 | Altman et al. |
| 9,860,662 B2 | 1/2018 | Jarvis et al. |
| 9,864,574 B2 | 1/2018 | Hartung et al. |
| 9,910,634 B2 | 3/2018 | Sheen et al. |
| 9,913,056 B2 | 3/2018 | Master et al. |
| 9,916,126 B2 | 3/2018 | Lang |
| 9,952,825 B2 | 4/2018 | Sheen |
| 9,984,703 B2 | 5/2018 | Ur et al. |
| 10,045,142 B2 | 8/2018 | McPherson et al. |
| 10,111,002 B1 * | 10/2018 | Poulad .................. H04H 60/04 |
| 10,125,006 B2 | 11/2018 | Jacobsen et al. |
| 10,127,006 B2 | 11/2018 | Sheen |
| 10,154,359 B2 | 12/2018 | Sheen |
| 10,206,052 B2 | 2/2019 | Perianu |
| 10,299,054 B2 | 5/2019 | McPherson et al. |
| 10,299,061 B1 | 5/2019 | Sheen |
| 10,402,154 B2 | 9/2019 | Hartung et al. |
| 10,791,407 B2 | 9/2020 | Oishi et al. |
| 2001/0038702 A1 | 11/2001 | Lavoie et al. |
| 2001/0042107 A1 | 11/2001 | Palm |
| 2001/0043592 A1 | 11/2001 | Jimenez et al. |
| 2001/0053228 A1 | 12/2001 | Jones |
| 2002/0022453 A1 | 2/2002 | Balog et al. |
| 2002/0026442 A1 | 2/2002 | Lipscomb et al. |
| 2002/0072816 A1 | 6/2002 | Shdema et al. |
| 2002/0078161 A1 | 6/2002 | Cheng |
| 2002/0089529 A1 | 7/2002 | Robbin |
| 2002/0124097 A1 | 9/2002 | Isely et al. |
| 2002/0126852 A1 | 9/2002 | Kashani et al. |
| 2002/0136414 A1 | 9/2002 | Jordan et al. |
| 2002/0146136 A1 | 10/2002 | Carter, Jr. |
| 2003/0002689 A1 | 1/2003 | Folio |
| 2003/0031334 A1 | 2/2003 | Layton et al. |
| 2003/0081115 A1 | 5/2003 | Curry et al. |
| 2003/0108212 A1 | 6/2003 | Yun |
| 2003/0157951 A1 | 8/2003 | Hasty |
| 2003/0159569 A1 | 8/2003 | Ohta |
| 2003/0161479 A1 | 8/2003 | Yang et al. |
| 2003/0161492 A1 | 8/2003 | Miller et al. |
| 2003/0179891 A1 | 9/2003 | Rabinowitz et al. |
| 2003/0235311 A1 | 12/2003 | Grancea et al. |
| 2004/0024478 A1 | 2/2004 | Hans et al. |
| 2004/0071294 A1 | 4/2004 | Halgas, Jr. et al. |
| 2004/0114771 A1 | 6/2004 | Vaughan et al. |
| 2004/0131338 A1 | 7/2004 | Asada et al. |
| 2004/0237750 A1 | 12/2004 | Smith et al. |
| 2005/0021470 A1 | 1/2005 | Martin et al. |

(56) References Cited

U.S. PATENT DOCUMENTS

| | | |
|---|---|---|
| 2005/0031143 A1 | 2/2005 | Devantier et al. |
| 2005/0063554 A1 | 3/2005 | Devantier et al. |
| 2005/0147261 A1 | 7/2005 | Yeh |
| 2005/0157885 A1 | 7/2005 | Olney et al. |
| 2005/0276425 A1 | 12/2005 | Forrester et al. |
| 2006/0008256 A1 | 1/2006 | Khedouri et al. |
| 2006/0026521 A1 | 2/2006 | Hotelling et al. |
| 2006/0032357 A1 | 2/2006 | Roovers et al. |
| 2006/0104454 A1 | 5/2006 | Guitarte Perez et al. |
| 2006/0147057 A1 | 7/2006 | Aggarwal et al. |
| 2006/0153391 A1 | 7/2006 | Hooley et al. |
| 2006/0195480 A1 | 8/2006 | Spiegelman et al. |
| 2006/0225097 A1 | 10/2006 | Lawrence-Apfelbaum |
| 2007/0003067 A1 | 1/2007 | Gierl et al. |
| 2007/0025559 A1 | 2/2007 | Mihelich et al. |
| 2007/0032895 A1 | 2/2007 | Nackvi et al. |
| 2007/0038999 A1 | 2/2007 | Millington |
| 2007/0086597 A1 | 4/2007 | Kino |
| 2007/0087686 A1 | 4/2007 | Holm et al. |
| 2007/0116254 A1 | 5/2007 | Looney et al. |
| 2007/0121955 A1 | 5/2007 | Johnston et al. |
| 2007/0142944 A1 | 6/2007 | Goldberg et al. |
| 2007/0217619 A1* | 9/2007 | Hall .................. H04S 7/307 381/59 |
| 2008/0002839 A1 | 1/2008 | Eng |
| 2008/0014989 A1 | 1/2008 | Sandegard et al. |
| 2008/0065247 A1 | 3/2008 | Igoe |
| 2008/0069378 A1 | 3/2008 | Rabinowitz et al. |
| 2008/0077261 A1* | 3/2008 | Baudino ......... H04M 1/72412 700/94 |
| 2008/0098027 A1 | 4/2008 | Aarts |
| 2008/0136623 A1 | 6/2008 | Calvarese |
| 2008/0144864 A1 | 6/2008 | Huon et al. |
| 2008/0175411 A1 | 7/2008 | Greve |
| 2008/0214160 A1 | 9/2008 | Jonsson |
| 2008/0232603 A1 | 9/2008 | Soulodre |
| 2008/0266385 A1 | 10/2008 | Smith et al. |
| 2008/0281523 A1 | 11/2008 | Dahl et al. |
| 2009/0003613 A1 | 1/2009 | Christensen et al. |
| 2009/0024662 A1 | 1/2009 | Park et al. |
| 2009/0047993 A1 | 2/2009 | Vasa |
| 2009/0063274 A1 | 3/2009 | Dublin, III et al. |
| 2009/0089054 A1 | 4/2009 | Wang et al. |
| 2009/0110218 A1* | 4/2009 | Swain .................. H03G 5/165 381/300 |
| 2009/0138507 A1 | 5/2009 | Burckart et al. |
| 2009/0147134 A1 | 6/2009 | Iwamatsu |
| 2009/0175476 A1 | 7/2009 | Bottum |
| 2009/0180632 A1 | 7/2009 | Goldberg et al. |
| 2009/0196428 A1 | 8/2009 | Kim |
| 2009/0202082 A1 | 8/2009 | Bharitkar et al. |
| 2009/0252481 A1 | 10/2009 | Ekstrand |
| 2009/0285404 A1 | 11/2009 | Hsu et al. |
| 2009/0304194 A1 | 12/2009 | Eggleston et al. |
| 2009/0304205 A1 | 12/2009 | Hardacker et al. |
| 2009/0316923 A1 | 12/2009 | Tashev et al. |
| 2010/0013550 A1 | 1/2010 | Tanaka |
| 2010/0095332 A1 | 4/2010 | Gran et al. |
| 2010/0104114 A1 | 4/2010 | Chapman |
| 2010/0128902 A1 | 5/2010 | Liu et al. |
| 2010/0135501 A1 | 6/2010 | Corbett et al. |
| 2010/0142735 A1 | 6/2010 | Yoon et al. |
| 2010/0146445 A1 | 6/2010 | Kraut |
| 2010/0162117 A1 | 6/2010 | Basso et al. |
| 2010/0189203 A1 | 7/2010 | Wilhelmsson et al. |
| 2010/0195846 A1 | 8/2010 | Yokoyama |
| 2010/0272270 A1 | 10/2010 | Chaikin et al. |
| 2010/0296659 A1 | 11/2010 | Tanaka |
| 2010/0303248 A1 | 12/2010 | Tawada |
| 2010/0303250 A1 | 12/2010 | Goldberg et al. |
| 2010/0323793 A1 | 12/2010 | Andall |
| 2011/0007904 A1 | 1/2011 | Tomoda et al. |
| 2011/0007905 A1 | 1/2011 | Sato et al. |
| 2011/0029111 A1 | 2/2011 | Sabin et al. |
| 2011/0087842 A1 | 4/2011 | Lu et al. |
| 2011/0091055 A1 | 4/2011 | Leblanc |
| 2011/0135103 A1 | 6/2011 | Sun et al. |
| 2011/0150228 A1 | 6/2011 | Yoon et al. |
| 2011/0150230 A1 | 6/2011 | Tanaka |
| 2011/0150247 A1 | 6/2011 | Oliveras |
| 2011/0170710 A1 | 7/2011 | Son |
| 2011/0216924 A1 | 9/2011 | Berardi et al. |
| 2011/0234480 A1 | 9/2011 | Fino et al. |
| 2011/0235808 A1 | 9/2011 | Kon |
| 2011/0268281 A1 | 11/2011 | Florencio et al. |
| 2011/0293123 A1 | 12/2011 | Neumeyer et al. |
| 2012/0032928 A1 | 2/2012 | Alberth et al. |
| 2012/0051558 A1 | 3/2012 | Kim et al. |
| 2012/0057724 A1 | 3/2012 | Rabinowitz et al. |
| 2012/0063615 A1 | 3/2012 | Crockett et al. |
| 2012/0093320 A1 | 4/2012 | Flaks et al. |
| 2012/0114152 A1 | 5/2012 | Nguyen et al. |
| 2012/0127831 A1 | 5/2012 | Gicklhorn et al. |
| 2012/0140936 A1 | 6/2012 | Bonnick et al. |
| 2012/0148075 A1 | 6/2012 | Goh et al. |
| 2012/0183156 A1 | 7/2012 | Schlessinger et al. |
| 2012/0184335 A1 | 7/2012 | Kim et al. |
| 2012/0213391 A1 | 8/2012 | Usami et al. |
| 2012/0215530 A1 | 8/2012 | Harsch et al. |
| 2012/0237037 A1 | 9/2012 | Ninan et al. |
| 2012/0243697 A1 | 9/2012 | Frye et al. |
| 2012/0263325 A1 | 10/2012 | Freeman et al. |
| 2012/0268145 A1 | 10/2012 | Chandra et al. |
| 2012/0269356 A1 | 10/2012 | Sheerin et al. |
| 2012/0275613 A1 | 11/2012 | Soulodre et al. |
| 2012/0283593 A1 | 11/2012 | Searchfield et al. |
| 2012/0288124 A1 | 11/2012 | Fejzo et al. |
| 2013/0003981 A1 | 1/2013 | Lane |
| 2013/0010970 A1 | 1/2013 | Hegarty et al. |
| 2013/0019193 A1 | 1/2013 | Rhee et al. |
| 2013/0028443 A1 | 1/2013 | Pance et al. |
| 2013/0051572 A1 | 2/2013 | Goh et al. |
| 2013/0066453 A1* | 3/2013 | Seefeldt .................. H04S 7/301 700/94 |
| 2013/0108055 A1 | 5/2013 | Hanna et al. |
| 2013/0129102 A1 | 5/2013 | Li et al. |
| 2013/0129122 A1 | 5/2013 | Johnson et al. |
| 2013/0166227 A1 | 6/2013 | Hermann et al. |
| 2013/0170647 A1* | 7/2013 | Reilly .................. G06F 3/165 381/17 |
| 2013/0173794 A1 | 7/2013 | Agerbak et al. |
| 2013/0179535 A1 | 7/2013 | Baalu et al. |
| 2013/0202131 A1 | 8/2013 | Kemmochi et al. |
| 2013/0211843 A1 | 8/2013 | Clarkson |
| 2013/0216071 A1* | 8/2013 | Maher .................. H04R 5/02 381/303 |
| 2013/0223642 A1 | 8/2013 | Warren et al. |
| 2013/0230175 A1 | 9/2013 | Bech et al. |
| 2013/0259254 A1 | 10/2013 | Xiang et al. |
| 2013/0279706 A1 | 10/2013 | Marti et al. |
| 2013/0305152 A1 | 11/2013 | Griffiths et al. |
| 2013/0315405 A1 | 11/2013 | Kanishima et al. |
| 2013/0329896 A1 | 12/2013 | Krishnaswamy et al. |
| 2013/0331970 A1 | 12/2013 | Beckhardt et al. |
| 2013/0346559 A1 | 12/2013 | Van Erven et al. |
| 2014/0003611 A1 | 1/2014 | Mohammad et al. |
| 2014/0003622 A1 | 1/2014 | Ikizyan et al. |
| 2014/0003623 A1 | 1/2014 | Lang |
| 2014/0003625 A1 | 1/2014 | Sheen et al. |
| 2014/0003626 A1 | 1/2014 | Holman et al. |
| 2014/0003635 A1 | 1/2014 | Mohammad et al. |
| 2014/0006587 A1 | 1/2014 | Kusano |
| 2014/0016784 A1 | 1/2014 | Sen et al. |
| 2014/0016786 A1 | 1/2014 | Sen |
| 2014/0016802 A1 | 1/2014 | Sen |
| 2014/0023196 A1 | 1/2014 | Xiang et al. |
| 2014/0029201 A1 | 1/2014 | Yang et al. |
| 2014/0032709 A1 | 1/2014 | Saussy et al. |
| 2014/0037097 A1 | 2/2014 | Labosco |
| 2014/0037107 A1 | 2/2014 | Marino, Jr. et al. |
| 2014/0052770 A1 | 2/2014 | Gran et al. |
| 2014/0064501 A1 | 3/2014 | Olsen et al. |
| 2014/0079242 A1 | 3/2014 | Nguyen et al. |
| 2014/0084014 A1 | 3/2014 | Sim et al. |

(56) References Cited

U.S. PATENT DOCUMENTS

| | | |
|---|---|---|
| 2014/0086423 A1 | 3/2014 | Domingo et al. |
| 2014/0112481 A1 | 4/2014 | Li et al. |
| 2014/0119551 A1 | 5/2014 | Bharitkar et al. |
| 2014/0126730 A1 | 5/2014 | Crawley et al. |
| 2014/0161265 A1 | 6/2014 | Chaikin et al. |
| 2014/0169569 A1 | 6/2014 | Toivanen et al. |
| 2014/0180684 A1 | 6/2014 | Strub |
| 2014/0192986 A1 | 7/2014 | Lee et al. |
| 2014/0219456 A1 | 8/2014 | Morrell et al. |
| 2014/0219483 A1 | 8/2014 | Hong |
| 2014/0226823 A1 | 8/2014 | Sen et al. |
| 2014/0226837 A1* | 8/2014 | Grokop .............. H04S 7/307 381/103 |
| 2014/0242913 A1 | 8/2014 | Pang |
| 2014/0267148 A1 | 9/2014 | Luna et al. |
| 2014/0270202 A1 | 9/2014 | Ivanov et al. |
| 2014/0270282 A1 | 9/2014 | Tammi et al. |
| 2014/0273859 A1 | 9/2014 | Luna et al. |
| 2014/0274212 A1 | 9/2014 | Zurek et al. |
| 2014/0279889 A1 | 9/2014 | Luna et al. |
| 2014/0285313 A1 | 9/2014 | Luna et al. |
| 2014/0286496 A1 | 9/2014 | Luna et al. |
| 2014/0294200 A1 | 10/2014 | Baumgarte et al. |
| 2014/0294201 A1 | 10/2014 | Johnson et al. |
| 2014/0310269 A1 | 10/2014 | Zhang et al. |
| 2014/0321670 A1 | 10/2014 | Nystrom et al. |
| 2014/0323036 A1 | 10/2014 | Daley et al. |
| 2014/0334644 A1 | 11/2014 | Selig et al. |
| 2014/0341399 A1 | 11/2014 | Dusse |
| 2014/0344689 A1 | 11/2014 | Scott et al. |
| 2014/0355768 A1 | 12/2014 | Sen et al. |
| 2014/0355794 A1 | 12/2014 | Morrell et al. |
| 2014/0364056 A1 | 12/2014 | Belk et al. |
| 2014/0369519 A1* | 12/2014 | Leschka .............. G06F 16/683 381/74 |
| 2015/0011195 A1 | 1/2015 | Li |
| 2015/0016642 A1 | 1/2015 | Walsh et al. |
| 2015/0023509 A1 | 1/2015 | Devantier et al. |
| 2015/0031287 A1 | 1/2015 | Pang et al. |
| 2015/0032844 A1 | 1/2015 | Tarr et al. |
| 2015/0036847 A1 | 2/2015 | Donaldson |
| 2015/0036848 A1 | 2/2015 | Donaldson |
| 2015/0043736 A1 | 2/2015 | Olsen et al. |
| 2015/0063610 A1 | 3/2015 | Mossner |
| 2015/0078586 A1 | 3/2015 | Ang et al. |
| 2015/0078596 A1 | 3/2015 | Sprogis et al. |
| 2015/0100991 A1 | 4/2015 | Risberg et al. |
| 2015/0146886 A1 | 5/2015 | Baumgarte |
| 2015/0149943 A1 | 5/2015 | Nguyen et al. |
| 2015/0161360 A1 | 6/2015 | Paruchuri et al. |
| 2015/0195666 A1 | 7/2015 | Massey et al. |
| 2015/0201274 A1 | 7/2015 | Ellner et al. |
| 2015/0208184 A1 | 7/2015 | Tan et al. |
| 2015/0220558 A1 | 8/2015 | Snibbe et al. |
| 2015/0223002 A1 | 8/2015 | Mehta et al. |
| 2015/0223004 A1 | 8/2015 | Deprez et al. |
| 2015/0229699 A1 | 8/2015 | Liu |
| 2015/0260754 A1 | 9/2015 | Perotti et al. |
| 2015/0263692 A1 | 9/2015 | Bush |
| 2015/0264023 A1 | 9/2015 | Reno |
| 2015/0271616 A1 | 9/2015 | Kechichian et al. |
| 2015/0271620 A1 | 9/2015 | Lando et al. |
| 2015/0281866 A1 | 10/2015 | Williams et al. |
| 2015/0286360 A1 | 10/2015 | Wachter |
| 2015/0289064 A1 | 10/2015 | Jensen et al. |
| 2015/0358756 A1 | 12/2015 | Harma et al. |
| 2015/0382128 A1 | 12/2015 | Ridihalgh et al. |
| 2016/0007116 A1 | 1/2016 | Holman |
| 2016/0011846 A1 | 1/2016 | Sheen |
| 2016/0011850 A1 | 1/2016 | Sheen et al. |
| 2016/0014509 A1 | 1/2016 | Hansson et al. |
| 2016/0014510 A1 | 1/2016 | Sheen |
| 2016/0014511 A1 | 1/2016 | Sheen et al. |
| 2016/0014534 A1 | 1/2016 | Sheen |
| 2016/0014536 A1 | 1/2016 | Sheen |
| 2016/0021458 A1 | 1/2016 | Johnson et al. |
| 2016/0021473 A1 | 1/2016 | Riggi et al. |
| 2016/0021481 A1 | 1/2016 | Johnson et al. |
| 2016/0027467 A1 | 1/2016 | Proud |
| 2016/0029142 A1 | 1/2016 | Isaac et al. |
| 2016/0035337 A1 | 2/2016 | Aggarwal et al. |
| 2016/0036404 A1* | 2/2016 | Fleischmann .......... H03G 5/005 381/103 |
| 2016/0036881 A1 | 2/2016 | Tembey et al. |
| 2016/0037277 A1 | 2/2016 | Matsumoto et al. |
| 2016/0061597 A1 | 3/2016 | De et al. |
| 2016/0070525 A1 | 3/2016 | Sheen et al. |
| 2016/0070526 A1 | 3/2016 | Sheen |
| 2016/0073210 A1 | 3/2016 | Sheen |
| 2016/0088438 A1 | 3/2016 | O'Keeffe |
| 2016/0119730 A1 | 4/2016 | Virtanen |
| 2016/0140969 A1 | 5/2016 | Srinivasan et al. |
| 2016/0142849 A1 | 5/2016 | Satheesh et al. |
| 2016/0165297 A1 | 6/2016 | Jamal-Syed et al. |
| 2016/0192098 A1 | 6/2016 | Oishi et al. |
| 2016/0192099 A1 | 6/2016 | Oishi et al. |
| 2016/0212535 A1 | 7/2016 | Le Nerriec et al. |
| 2016/0239255 A1 | 8/2016 | Chavez et al. |
| 2016/0246449 A1 | 8/2016 | Jarske |
| 2016/0254696 A1 | 9/2016 | Plumb et al. |
| 2016/0260140 A1 | 9/2016 | Shirley et al. |
| 2016/0309276 A1 | 10/2016 | Ridihalgh et al. |
| 2016/0330562 A1 | 11/2016 | Crockett |
| 2016/0342201 A1 | 11/2016 | Jehan |
| 2016/0353018 A1 | 12/2016 | Anderson et al. |
| 2016/0366517 A1 | 12/2016 | Chandran et al. |
| 2016/0373860 A1 | 12/2016 | Leschka et al. |
| 2017/0026769 A1 | 1/2017 | Patel |
| 2017/0041724 A1 | 2/2017 | Master et al. |
| 2017/0069338 A1 | 3/2017 | Elliot et al. |
| 2017/0083279 A1 | 3/2017 | Sheen |
| 2017/0086003 A1 | 3/2017 | Rabinowitz et al. |
| 2017/0105084 A1 | 4/2017 | Holman |
| 2017/0133011 A1 | 5/2017 | Chen et al. |
| 2017/0142532 A1 | 5/2017 | Pan |
| 2017/0207762 A1 | 7/2017 | Porter et al. |
| 2017/0215017 A1 | 7/2017 | Hartung et al. |
| 2017/0223447 A1 | 8/2017 | Johnson et al. |
| 2017/0230772 A1 | 8/2017 | Johnson et al. |
| 2017/0257722 A1 | 9/2017 | Kerdranvat et al. |
| 2017/0280265 A1 | 9/2017 | Po |
| 2017/0286052 A1 | 10/2017 | Hartung et al. |
| 2017/0303039 A1 | 10/2017 | Iyer et al. |
| 2017/0311108 A1 | 10/2017 | Patel |
| 2017/0374482 A1 | 12/2017 | McPherson et al. |
| 2018/0122378 A1 | 5/2018 | Mixter et al. |
| 2018/0376268 A1 | 12/2018 | Kerdranvat et al. |
| 2019/0037328 A1 | 1/2019 | McPherson et al. |
| 2019/0058942 A1 | 2/2019 | Garner et al. |
| 2019/0320278 A1 | 10/2019 | McPherson et al. |
| 2020/0005830 A1 | 1/2020 | Wasada et al. |
| 2020/0249346 A1 | 8/2020 | Lim et al. |
| 2020/0382888 A1 | 12/2020 | McPherson et al. |
| 2021/0141050 A1 | 5/2021 | Janssen et al. |

FOREIGN PATENT DOCUMENTS

| | | |
|---|---|---|
| CN | 1622694 A | 6/2005 |
| CN | 1984507 A | 6/2007 |
| CN | 101032187 A | 9/2007 |
| CN | 101047777 A | 10/2007 |
| CN | 101366177 A | 2/2009 |
| CN | 101478296 A | 7/2009 |
| CN | 101491116 A | 7/2009 |
| CN | 101681219 A | 3/2010 |
| CN | 101754087 A | 6/2010 |
| CN | 101800051 A | 8/2010 |
| CN | 102004823 A | 4/2011 |
| CN | 102318325 A | 1/2012 |
| CN | 102823277 A | 12/2012 |
| CN | 102893633 A | 1/2013 |
| CN | 103491397 A | 1/2014 |
| CN | 103811010 A | 5/2014 |
| CN | 103988523 A | 8/2014 |

(56) References Cited

FOREIGN PATENT DOCUMENTS

| | | |
|---|---|---|
| CN | 104219604 A | 12/2014 |
| CN | 104247461 A | 12/2014 |
| CN | 104284291 A | 1/2015 |
| CN | 104584061 A | 4/2015 |
| CN | 104967953 A | 10/2015 |
| CN | 105163221 A | 12/2015 |
| DE | 102007032281 A1 | 1/2009 |
| EP | 0505949 A1 | 9/1992 |
| EP | 0772374 A2 | 5/1997 |
| EP | 1133896 B1 | 8/2002 |
| EP | 1349427 A2 | 10/2003 |
| EP | 1389853 A1 | 2/2004 |
| EP | 2043381 A2 | 4/2009 |
| EP | 1349427 B1 | 12/2009 |
| EP | 2161950 A2 | 3/2010 |
| EP | 2194471 A1 | 6/2010 |
| EP | 2197220 A2 | 6/2010 |
| EP | 2288178 A1 | 2/2011 |
| EP | 2429155 A1 | 3/2012 |
| EP | 1825713 B1 | 10/2012 |
| EP | 2613573 A1 | 7/2013 |
| EP | 2591617 B1 | 6/2014 |
| EP | 2747081 A1 | 6/2014 |
| EP | 2835989 A2 | 2/2015 |
| EP | 2860992 A1 | 4/2015 |
| EP | 2874413 A1 | 5/2015 |
| EP | 3128767 A2 | 2/2017 |
| EP | 2974382 B1 | 4/2017 |
| EP | 2986034 B1 | 5/2017 |
| EP | 3285502 A1 | 2/2018 |
| JP | H02280199 A | 11/1990 |
| JP | H05199593 A | 8/1993 |
| JP | H05211700 A | 8/1993 |
| JP | H06327089 A | 11/1994 |
| JP | H0723490 A | 1/1995 |
| JP | H1069280 A | 3/1998 |
| JP | H10307592 A | 11/1998 |
| JP | 2002502193 A | 1/2002 |
| JP | 2002101500 A | 4/2002 |
| JP | 2003143252 A | 5/2003 |
| JP | 2003304590 A | 10/2003 |
| JP | 2005086686 A | 3/2005 |
| JP | 2005538633 A | 12/2005 |
| JP | 2006017893 A | 1/2006 |
| JP | 2006180039 A | 7/2006 |
| JP | 2006191562 A | 7/2006 |
| JP | 2006340285 A | 12/2006 |
| JP | 2007068125 A | 3/2007 |
| JP | 2007271802 A | 10/2007 |
| JP | 2007325073 A | 12/2007 |
| JP | 2008035254 A | 2/2008 |
| JP | 2008228133 A | 9/2008 |
| JP | 2009188474 A | 8/2009 |
| JP | 2010056970 A | 3/2010 |
| JP | 2010081124 A | 4/2010 |
| JP | 2010141892 A | 6/2010 |
| JP | 2011123376 A | 6/2011 |
| JP | 2011130212 A | 6/2011 |
| JP | 2011164166 A | 8/2011 |
| JP | 2011215378 A | 10/2011 |
| JP | 2011217068 A | 10/2011 |
| JP | 2013247456 A | 12/2013 |
| JP | 2013253884 A | 12/2013 |
| JP | 2014523165 A | 9/2014 |
| JP | 6356331 B2 | 7/2018 |
| JP | 6567735 B2 | 8/2019 |
| KR | 1020060116383 | 11/2006 |
| KR | 1020080011831 | 2/2008 |
| WO | 200153994 | 7/2001 |
| WO | 0182650 A2 | 11/2001 |
| WO | 200182650 | 11/2001 |
| WO | 2003093950 A2 | 11/2003 |
| WO | 2004066673 A1 | 8/2004 |
| WO | 2007016465 A2 | 2/2007 |
| WO | 2011139502 A1 | 11/2011 |
| WO | 2013006323 A2 | 1/2013 |
| WO | 2013016500 A1 | 1/2013 |
| WO | 2013126603 A1 | 8/2013 |
| WO | 2014032709 | 3/2014 |
| WO | 2014032709 A1 | 3/2014 |
| WO | 2014036121 A1 | 3/2014 |
| WO | 2015024881 A1 | 2/2015 |
| WO | 2015108794 A1 | 7/2015 |
| WO | 2015178950 A1 | 11/2015 |
| WO | 2016040324 A1 | 3/2016 |
| WO | 2016054090 A1 | 4/2016 |
| WO | 2017049169 A1 | 3/2017 |

OTHER PUBLICATIONS

Non-Final Office Action dated Aug. 18, 2020, issued in connection with U.S. Appl. No. 16/827,143, filed Mar. 23, 2020, 8 pages.
Non-Final Office Action dated Dec. 18, 2018, issued in connection with U.S. Appl. No. 16/011,402, filed Jun. 18, 2018, 10 pages.
Non-Final Office Action dated Feb. 18, 2016, issued in connection with U.S. Appl. No. 14/644,136, filed Mar. 10, 2015, 10 pages.
Non-Final Office Action dated Jun. 18, 2019, issued in connection with U.S. Appl. No. 15/005,496, filed Jan. 25, 2016, 15 pages.
Non-Final Office Action dated Feb. 19, 2020, issued in connection with U.S. Appl. No. 16/665,415, filed Oct. 28, 2019, 53 pages.
Non-Final Office Action dated Jun. 19, 2020, issued in connection with U.S. Appl. No. 16/403,077, filed May 3, 2019, 6 pages.
Non-Final Office Action dated Sep. 19, 2017, issued in connection with U.S. Appl. No. 15/056,553, filed Feb. 29, 2016, 7 pages.
Non-Final Office Action dated Apr. 2, 2018, issued in connection with U.S. Appl. No. 15/872,979, filed Jan. 16, 2018, 6 pages.
Non-Final Office Action dated Aug. 2, 2017, issued in connection with U.S. Appl. No. 15/298,115, filed Oct. 19, 2016, 22 pages.
Non-Final Office Action dated Apr. 20, 2017, issued in connection with U.S. Appl. No. 15/005,853, filed Jan. 25, 2016, 8 pages.
Non-Final Office Action dated Jul. 20, 2016, issued in connection with U.S. Appl. No. 14/682,182, filed Apr. 9, 2015, 13 pages.
Non-Final Office Action dated Jun. 20, 2017, issued in connection with U.S. Appl. No. 15/207,682, filed Jul. 12, 2016, 17 pages.
Non-Final Office Action dated Dec. 21, 2018, issued in connection with U.S. Appl. No. 16/181,213, filed Nov. 5, 2018, 13 pages.
Non-Final Office Action dated Jun. 21, 2016, issued in connection with U.S. Appl. No. 14/678,248, filed Apr. 3, 2015, 10 pages.
Non-Final Office Action dated Jun. 21, 2019, issued in connection with U.S. Appl. No. 16/181,865, filed Nov. 6, 2018, 12 pages.
Non-Final Office Action dated Nov. 21, 2014, issued in connection with U.S. Appl. No. 13/536,493, filed Jun. 28, 2012, 20 pages.
Non-Final Office Action dated Jun. 22, 2018, issued in connection with U.S. Appl. No. 15/217,399, filed Jul. 22, 2016, 33 pages.
Non-Final Office Action dated Jun. 22, 2020, issued in connection with U.S. Appl. No. 16/555,832, filed Aug. 29, 2019, 15 pages.
Non-Final Office Action dated Oct. 22, 2019, issued in connection with U.S. Appl. No. 16/416,619, filed May 20, 2019, 12 pages.
Non-Final Office Action dated Jan. 23, 2019, issued in connection with U.S. Appl. No. 16/113,032, filed Aug. 27, 2018, 8 pages.
Non-Final Office Action dated May 24, 2019, issued in connection with U.S. Appl. No. 16/401,981, filed May 2, 2019, 14 pages.
Non-Final Office Action dated Oct. 25, 2016, issued in connection with U.S. Appl. No. 14/864,506, filed Sep. 24, 2015, 9 pages.
Non-Final Office Action dated Sep. 26, 2018, issued in connection with U.S. Appl. No. 15/229,693, filed Aug. 5, 2016, 25 pages.
Non-Final Office Action dated Dec. 27, 2017, issued in connection with U.S. Appl. No. 15/357,520, filed Nov. 21, 2016, 28 pages.
Non-Final Office Action dated Feb. 27, 2018, issued in connection with U.S. Appl. No. 14/864,393, filed Sep. 24, 2015, 19 pages.
Non-Final Office Action dated Feb. 27, 2018, issued in connection with U.S. Appl. No. 15/718,556, filed Sep. 28, 2017, 19 pages.
Non-Final Office Action dated Jul. 27, 2016, issued in connection with U.S. Appl. No. 14/696,014, filed Apr. 24, 2015, 11 pages.
Non-Final Office Action dated Mar. 27, 2017, issued in connection with U.S. Appl. No. 15/211,835, filed Jul. 15, 2016, 30 pages.
Non-Final Office Action dated Mar. 27, 2018, issued in connection with U.S. Appl. No. 15/785,088, filed Oct. 16, 2017, 11 pages.

(56) References Cited

OTHER PUBLICATIONS

Non-Final Office Action dated Jul. 28, 2016, issued in connection with U.S. Appl. No. 14/884,001, filed Oct. 15, 2015, 8 pages.
Non-Final Office Action dated Nov. 28, 2017, issued in connection with U.S. Appl. No. 15/673,170, filed Aug. 9, 2017, 7 pages.
Non-Final Office Action dated Sep. 28, 2018, issued in connection with U.S. Appl. No. 15/588,186, filed May 5, 2017, 12 pages.
Non-Final Office Action dated Sep. 28, 2018, issued in connection with U.S. Appl. No. 15/595,519, filed May 15, 2017, 12 pages.
Non-Final Office Action dated Mar. 29, 2018, issued in connection with U.S. Appl. No. 15/716,313, filed Sep. 26, 2017, 16 pages.
Non-Final Office Action dated Aug. 30, 2019, issued in connection with U.S. Appl. No. 16/115,525, filed Aug. 28, 2018, 13 pages.
Non-Final Office Action dated May 30, 2017, issued in connection with U.S. Appl. No. 15/478,770, filed Apr. 4, 2017, 9 pages.
Non-Final Office Action dated May 31, 2019, issued in connection with U.S. Appl. No. 16/185,906, filed Nov. 9, 2018, 7 pages.
Non-Final Office Action dated Mar. 4, 2020, issued in connection with U.S. Appl. No. 15/966,534, filed Apr. 30, 2018, 11 pages.
Non-Final Office Action dated Jan. 5, 2021, issued in connection with U.S. Appl. No. 17/078,382, filed Oct. 23, 2020, 11 pages.
Non-Final Office Action dated Jul. 6, 2020, issued in connection with U.S. Appl. No. 16/812,618, filed Mar. 9, 2020, 15 pages.
Non-Final Office Action dated Nov. 6, 2018, issued in connection with U.S. Appl. No. 15/235,598, filed Aug. 12, 2016, 13 pages.
Non-Final Office Action dated Feb. 7, 2019, issued in connection with U.S. Appl. No. 15/859,311, filed Dec. 29, 2017, 9 pages.
Non-Final Office Action dated Feb. 7, 2019, issued in connection with U.S. Appl. No. 15/865,221, filed Jan. 8, 2018, 10 pages.
Non-Final Office Action dated Jan. 9, 2018, issued in connection with U.S. Appl. No. 15/698,283, filed Sep. 7, 2017, 18 pages.
Non-Final Office Action dated Jan. 9, 2018, issued in connection with U.S. Appl. No. 15/727,913, filed Oct. 9, 2017, 8 pages.
Notice of Allowance dated May 1, 2017, issued in connection with U.S. Appl. No. 14/805,140, filed Jul. 21, 2015, 13 pages.
Notice of Allowance dated Nov. 2, 2016, issued in connection with U.S. Appl. No. 14/884,001, filed Oct. 15, 2015, 8 pages.
Notice of Allowance dated Jun. 3, 2016, issued in connection with U.S. Appl. No. 14/921,799, filed Oct. 23, 2015, 8 pages.
Notice of Allowance dated Nov. 4, 2016, issued in connection with U.S. Appl. No. 14/481,514, filed Sep. 9, 2014, 10 pages.
Notice of Allowance dated Feb. 4, 2019, issued in connection with U.S. Appl. No. 15/166,241, filed Aug. 26, 2016, 8 pages.
Notice of Allowance dated Feb. 4, 2019, issued in connection with U.S. Appl. No. 16/181,583, filed Nov. 6, 2018, 9 pages.
Notice of Allowance dated Feb. 4, 2020, issued in connection with U.S. Appl. No. 16/416,619, filed May 20, 2019, 7 pages.
Notice of Allowance dated Oct. 4, 2018, issued in connection with U.S. Appl. No. 15/166,241, filed May 26, 2016, 7 pages.
Notice of Allowance dated Apr. 5, 2018, issued in connection with U.S. Appl. No. 15/681,640, filed Aug. 21, 2017, 8 pages.
Notice of Allowance dated Feb. 5, 2021, issued in connection with U.S. Appl. No. 16/827,143, filed Mar. 23, 2020, 9 pages.
Notice of Allowance dated Jun. 5, 2019, issued in connection with U.S. Appl. No. 15/859,311, filed Dec. 29, 2017, 8 pages.
Notice of Allowance dated Jun. 5, 2019, issued in connection with U.S. Appl. No. 15/865,221, filed Jan. 3, 2018, 8 pages.
Notice of Allowance dated Mar. 5, 2019, issued in connection with U.S. Appl. No. 16/102,499, filed Aug. 13, 2018, 8 pages.
Notice of Allowance dated May 5, 2017, issued in connection with U.S. Appl. No. 14/826,873, filed Aug. 14, 2015, 5 pages.
Notice of Allowance dated Oct. 5, 2018, issued in connection with U.S. Appl. No. 16/115,524, filed Aug. 28, 2018, 10 pages.
Notice of Allowance dated Aug. 6, 2020, issued in connection with U.S. Appl. No. 16/564,684, filed Sep. 9, 2019, 8 pages.
Notice of Allowance dated Feb. 6, 2019, issued in connection with U.S. Appl. No. 15/996,878, filed Jun. 4, 2018, 8 pages.
Notice of Allowance dated Apr. 8, 2019, issued in connection with U.S. Appl. No. 16/011,402, filed Jun. 18, 2018, 8 pages.
Notice of Allowance dated Jul. 8, 2019, issued in connection with U.S. Appl. No. 15/856,791, filed Dec. 28, 2017, 5 pages.
Notice of Allowance dated Jun. 8, 2020, issued in connection with U.S. Appl. No. 16/658,896, filed Oct. 21, 2019, 8 pages.
Notice of Allowance dated May 8, 2018, issued in connection with U.S. Appl. No. 15/650,386, filed Jul. 14, 2017, 13 pages.
Notice of Allowance dated Apr. 9, 2020, issued in connection with U.S. Appl. No. 16/416,593, filed May 20, 2019, 9 pages.
Notice of Allowance dated Jun. 9, 2020, issued in connection with U.S. Appl. No. 15/966,534, filed Apr. 30, 2018, 16 pages.
Notice of Allowance dated May 9, 2019, issued in connection with U.S. Appl. No. 15/996,878, filed Jun. 4, 2018, 7 pages.
Notice of Allowance dated Apr. 19, 2017, issued in connection with U.S. Appl. No. 14/481,511, filed Sep. 9, 2014, 10 pages.
Palm, Inc., "Handbook for the Palm VII Handheld," May 2000, 311 pages.
Papp Istvan et al. "Adaptive Microphone Array for Unknown Desired Speaker's Transfer Function", The Journal of the Acoustical Society of America, American Institute of Physics for the Acoustical Society of America, New York, NY vol. 122, No. 2, Jul. 19, 2007, pp. 44-49.
Pre-Brief Appeal Conference Decision mailed on Mar. 19, 2019, issued in connection with U.S. Appl. No. 15/806,126, filed Nov. 7, 2017, 2 pages.
Preinterview First Office Action dated Oct. 6, 2016, issued in connection with U.S. Appl. No. 14/726,921, filed Jun. 1, 2015, 6 pages.
Preinterview First Office Action dated Jul. 12, 2017, issued in connection with U.S. Appl. No. 14/793,205, filed Jul. 7, 2015, 5 pages.
Preinterview First Office Action dated May 17, 2016, issued in connection with U.S. Appl. No. 14/481,505, filed Sep. 9, 2014, 7 pages.
Preinterview First Office Action dated May 25, 2016, issued in connection with U.S. Appl. No. 14/481,514, filed Sep. 9, 2014, 7 pages.
Presentations at WinHEC 2000, May 2000, 138 pages.
PRISMIQ, Inc., "PRISMIQ Media Player User Guide," 2003, 44 pages.
Ross, Alex, "Wizards of Sound: Retouching acoustics, from the restaurant to the concert hall," The New Yorker, Feb. 23, 2015. Web. Feb. 26, 2015, 9 pages.
Supplemental Notice of Allowability dated Oct. 27, 2016, issued in connection with U.S. Appl. No. 14/481,511, filed Sep. 9, 2014, 6 pages.
United States Patent and Trademark Office, U.S. Appl. No. 60/490,768, filed Jul. 28, 2003, entitled "Method for synchronizing audio playback between multiple networked devices," 13 pages.
United States Patent and Trademark Office, U.S. Appl. No. 60/825,407, filed Sep. 12, 2006, entitled "Controlling and manipulating groupings in a multi-zone music or media system," 82 pages.
UPnP; "Universal Plug and Play Device Architecture," Jun. 8, 2000; version 1.0; Microsoft Corporation; pp. 1-54.
Wikipedia, Server(Computing) https://web.archive.org/web/20160703173710/https://en.wikipedia.org/wiki/Server_(computing), published Jul. 3, 2016, 7 pages.
Yamaha DME 64 Owner's Manual; copyright 2004, 80 pages.
Yamaha DME Designer 3.0 Owner's Manual; Copyright 2008, 501 pages.
Yamaha DME Designer 3.5 setup manual guide; copyright 2004, 16 pages.
Yamaha DME Designer 3.5 User Manual; Copyright 2004, 507 pages.
European Patent Office, European Extended Search Report dated Jun. 26, 2018, issued in connection with European Application No. 18171206.8, 9 pages.
European Patent Office, European Extended Search Report dated Sep. 8, 2017, issued in connection with European Application No. 17000460.0, 8 pages.
European Patent Office, European Office Action dated Nov. 10, 2020, issued in connection with European Application No. 19168800.1, 5 pages.

(56) References Cited

OTHER PUBLICATIONS

European Patent Office, European Office Action dated Dec. 11, 2018, issued in connection with European Application No. 15778787.0, 6 pages.
European Patent Office, European Office Action dated Jul. 11, 2019, issued in connection with European Application No. 15778787.0, 10 pages.
European Patent Office, European Office Action dated Sep. 16, 2020, issued in connection with European Application No. 15778787.0, 7 pages.
European Patent Office, European Office Action dated Aug. 19, 2020, issued in connection with European Application No. 17754501.9, 6 pages.
European Patent Office, European Office Action dated Nov. 2, 2018, issued in connection with European Application No. 18171206.8, 6 pages.
European Patent Office, European Office Action dated Jan. 3, 2020, issued in connection with European Application No. 17703876.7, 8 pages.
European Patent Office, European Office Action dated Feb. 4, 2019, issued in connection with European Application No. 17703876.7, 9 pages.
European Patent Office, European Office Action dated Sep. 7, 2020, issued in connection with European Application No. 19161826.3, 6 pages.
European Patent Office, European Office Action dated Jul. 9, 2020, issued in connection with European Application No. 19167365.6, 4 pages.
European Patent Office, European Office Action dated May 9, 2019, issued in connection with European Application No. 18171206.8, 7 pages.
European Patent Office, European Partial Search Report dated Jun. 7, 2019, issued in connection with European Application No. 19161826.3, 17 pages.
European Patent Office, European Search Report dated Jun. 13, 2019, issued in connection with European Application No. 18204450.3, 11 pages.
European Patent Office, European Search Report dated Sep. 13, 2019, issued in connection with European Application No. 19161826.3, 13 pages.
European Patent Office, European Search Report dated Jan. 18, 2018, issued in connection with European Patent Application No. 17185193.4, 9 pages.
European Patent Office, European Search Report dated Jul. 9, 2019, issued in connection with European Application No. 19168800.1, 12 pages.
European Patent Office, Extended European Search Report dated Jan. 5, 2017, issued in connection with European Patent Application No. 15765555.6, 8 pages.
European Patent Office, Extended Search Report dated Jan. 25, 2017, issued in connection with European Application No. 15765548.1, 7 pages.
European Patent Office, Extended Search Report dated Apr. 26, 2017, issued in connection with European Application No. 15765548.1, 10 pages.
European Patent Office, Office Action dated Nov. 12, 2018, issued in connection with European Application No. 17000460.0, 6 pages.
European Patent Office, Office Action dated Jun. 13, 2017, issued in connection with European patent application No. 17000484.0, 10 pages.
European Patent Office, Office Action dated Dec. 15, 2016, issued in connection with European Application No. 15766998.7, 7 pages.
European Patent Office, Summons to Attend Oral Proceedings dated Nov. 15, 2018, issued in connection with European Application No. 16748186.0, 57 pages.
European Patent Office, Summons to Attend Oral Proceedings dated Sep. 24, 2019, issued in connection with European Application No. 17000460.0, 5 pages.

Ex Parte Quayle Office Action dated Apr. 15, 2019, issued in connection with U.S. Appl. No. 15/235,598, filed Aug. 12, 2016, 7 pages.
Ex Parte Quayle Office Action dated Dec. 26, 2019, issued in connection with U.S. Appl. No. 16/542,418, filed Aug. 16, 2019, 7 pages.
Final Office Action dated Dec. 2, 2019, issued in connection with U.S. Appl. No. 15/005,496, filed Jan. 25, 2016, 19 pages.
Final Office Action dated Apr. 3, 2017, issued in connection with U.S. Appl. No. 14/678,248, filed Apr. 3, 2015, 22 pages.
Final Office Action dated Jul. 13, 2017, issued in connection with U.S. Appl. No. 14/726,921, filed Jun. 1, 2015, 10 pages.
Final Office Action dated Jun. 13, 2017, issued in connection with U.S. Appl. No. 14/481,505, filed Sep. 9, 2014, 22 pages.
Final Office Action dated Dec. 14, 2020, issued in connection with U.S. Appl. No. 16/812,618, filed Mar. 9, 2020, 17 pages.
Final Office Action dated Feb. 14, 2019, issued in connection with U.S. Appl. No. 15/005,496, filed Jan. 25, 2016, 16 pages.
Final Office Action dated Feb. 14, 2019, issued in connection with U.S. Appl. No. 15/217,399, filed Jul. 22, 2016, 37 pages.
Final Office Action dated Oct. 14, 2016, issued in connection with U.S. Appl. No. 14/682,182, filed Apr. 9, 2015, 16 pages.
Final Office Action dated Oct. 17, 2016, issued in connection with U.S. Appl. No. 14/678,248, filed Apr. 3, 2015, 22 pages.
Final Office Action dated Apr. 18, 2017, issued in connection with U.S. Appl. No. 14/678,263, filed Apr. 3, 2015, 16 pages.
Final Office Action dated Apr. 18, 2018, issued in connection with U.S. Appl. No. 15/056,553, filed Feb. 29, 2016, 8 pages.
Final Office Action dated Dec. 18, 2014, issued in connection with U.S. Appl. No. 13/340,126, filed Dec. 29, 2011, 12 pages.
Final Office Action dated Jan. 19, 2017, issued in connection with U.S. Appl. No. 14/940,779, filed Nov. 13, 2015, 15 pages.
Final Office Action dated Apr. 2, 2018, issued in connection with U.S. Appl. No. 15/166,241, filed May 26, 2016, 14 pages.
Final Office Action dated Oct. 21, 2016, issued in connection with U.S. Appl. No. 14/696,014, filed Apr. 24, 2015, 13 pages.
Final Office Action dated Sep. 22, 2020, issued in connection with U.S. Appl. No. 15/005,496, filed Jan. 25, 2016, 17 pages.
Final Office Action dated Jan. 25, 2018, issued in connection with U.S. Appl. No. 15/005,496, filed Jan. 25, 2016, 17 pages.
Final Office Action dated Mar. 25, 2019, issued in connection with U.S. Appl. No. 15/856,791, filed Dec. 28, 2017, 11 pages.
Final Office Action dated Oct. 28, 2019, issued in connection with U.S. Appl. No. 16/181,865, filed Nov. 6, 2018, 17 pages.
Final Office Action dated Apr. 3, 2018, issued in connection with U.S. Appl. No. 15/235,598, filed Aug. 12, 2016, 12 pages.
Final Office Action dated Mar. 3, 2020, issued in connection with U.S. Appl. No. 16/115,525, filed Aug. 28, 2018, 13 pages.
Final Office Action dated Feb. 5, 2018, issued in connection with U.S. Appl. No. 15/229,693, filed Aug. 5, 2016, 21 pages.
Advisory Action dated Nov. 22, 2021, issued in connection with U.S. Appl. No. 16/919,467, filed Jul. 2, 2020, 4 pages.
"AV Amplifier DSP-Z7," Yamaha, 2008 [retrieved on Jan. 3, 2022]. Retrieved from the Internet: URL: https://de.yamaha.com/files/download/other_assets/6/318616/DSP-Z7_en.pdf, pp. 1-154.
BeoLab5 User Manual. Bang & Olufsen. Version 1.0, 20 pages [produced by Google in WDTX Case No. 6:20-cv-00881 Answer on Jan. 8, 2021].
Chinese Patent Office, Chinese Office Action and Translation dated Apr. 1, 2021, issued in connection with Chinese Application No. 201910395715.4, 8 pages.
Chinese Patent Office, First Office Action and Translation dated Nov. 3, 2021, issued in connection with Chinese Application No. 202011278502.2, 10 pages.
Co-pending U.S. Pat. No. 201916530324, inventor Wilberding; Dayn, filed Aug. 2, 2019.
European Patent Office, European EPC Article 94.3 dated Aug. 16, 2021, issued in connection with European Application No. 19765920.4, 5 pages.
European Patent Office, European EPC Article 94.3 dated Oct. 29, 2021, issued in connection with European Application No. 20196286.7, 5 pages.

(56) References Cited

OTHER PUBLICATIONS

European Patent Office, European EPC Article 94.3 dated Apr. 30, 2021, issued in connection with European Application No. 20196286.7, 5 pages.
European Patent Office, European Extended Search Report dated Jun. 10, 2022, issued in connection with European Application No. 22155834.9, 8 pages.
European Patent Office, European Extended Search Report dated Jan. 14, 2022, issued in connection with European Application No. 21171959.6, 12 pages.
European Patent Office, Examination Report dated Jul. 12, 2021, issued in connection with European Patent Application No. 17754501.9 6 pages.
European Patent Office, Summons to Attend Oral Proceedings mailed on Apr. 22, 2022, issued in connection with European Application No. 15778787.0, 6 pages.
Excerpts from Andrew Tanenbaum, Computer Networks. 4th Edition. Copyright 2003, 87 pages [produced by Google in IPR of U.S. Pat. No. 9,219,460, IPR2021-00475 on Feb. 5, 2021].
Excerpts from Morfey, Christopher L., Dictionary of Acoustics. Copyright 2001, 4 pages [produced by Google in IPR of U.S. Pat. No. 9,219,460, IPR2021-00475 on Feb. 5, 2021].
Final Office Action dated Sep. 17, 2021, issued in connection with U.S. Appl. No. 16/564,766, filed Sep. 9, 2019, 8 pages.
Final Office Action dated Aug. 20, 2021, issued in connection with U.S. Appl. No. 16/919,467, filed Jul. 2, 2020, 22 pages.
*Google LLC* v. *Sonos, Inc.*, Declaration of Jeffery S. Vipperman, PHD. In Support of Petition for Inter Partes Review of U.S. Pat. No. 9,219,460, IPR2021-00475, Feb. 2, 2021, 92 pages.
*Google LLC* v. *Sonos, Inc.*, Declaration of Michael T. Johnson, Ph.D. Exhibit 2016 in Patent Owner Response to Petition for Inter Partes Review of U.S. Pat. No. 9,219,460, IPR2021-00475, Jun. 13, 2022, 117 pages.
*Google LLC* v. *Sonos, Inc.*, Deposition of Jeffrey S. Vipperman, Ph.D. Exhibit 2017 in Patent Owner Response to Petition for Inter Partes Review of U.S. Pat. No. 9,219,460, IPR2021-00475, Jun. 13, 2022, 183 pages.
*Google LLC* v. *Sonos, Inc.*, File History of U.S. Appl. No. 61/601,529 Maher. Exhibit 2018 in Patent Owner Response to Petition for Inter Partes Review of U.S. Pat. No. 9,219,460, IPR2021-00475, Jun. 13, 2022, 14 pages.
*Google LLC* v. *Sonos, Inc.*, Patent Owner Response to Petition for Inter Partes Review of U.S. Pat. No. 9,219,460, IPR2021-00475, Jun. 13, 2022, 49 pages.
*Google LLC* v. *Sonos, Inc.*, Petition for IPR of U.S. Pat. No. 9,219,460, IPR2021-00475, Feb. 5, 2021, 88 pages.
International Bureau, International Preliminary Report on Patentability and Written Opinion, dated Jan. 15, 2019, issued in connection with International Application No. PCT/US2017/042191, filed on Jul. 14, 2017, 10 pages.
International Bureau, International Preliminary Report on Patentability and Written Opinion, dated Mar. 20, 2018, issued in connection with International Application No. PCT/US2016/052264, filed on Sep. 16, 2016, 10 pages.
International Bureau, International Preliminary Report on Patentability and Written Opinion, dated Mar. 20, 2018, issued in connection with International Application No. PCT/US2016/052266, filed on Sep. 16, 2016, 7 pages.
International Bureau, International Preliminary Report on Patentability and Written Opinion, dated Jan. 23, 2018, issued in connection with International Application No. PCT/US2016/043109, filed on Jul. 20, 2016, 7 pages.
International Bureau, International Preliminary Report on Patentability and Written Opinion, dated Jan. 23, 2018, issued in connection with International Application No. PCT/US2016/043116, filed on Jul. 20, 2016, 8 pages.
International Bureau, International Preliminary Report on Patentability and Written Opinion, dated Oct. 24, 2017, issued in connection with International Application No. PCT/US2016/028997, filed on Apr. 22, 2016, 7 pages.

International Bureau, International Preliminary Report on Patentability and Written Opinion, dated Jan. 9, 2018, issued in connection with International Application No. PCT/US2016/041179, filed on Jul. 6, 2016, 6 pages.
International Bureau, International Preliminary Report on Patentability, dated Mar. 2, 2021, issued in connection with International Application No. PCT/US2019/048366, filed on Aug. 27, 2019, 7 pages.
International Bureau, International Preliminary Report on Patentability, dated Mar. 2, 2021, issued in connection with International Application No. PCT/US2019/048569, filed on Aug. 28, 2019, 11 pages.
International Bureau, International Search Report and Written Opinion dated Nov. 25, 2019, issued in connection with International Application No. PCT/US2019/048569, filed on Aug. 28, 2019, 13 pages.
International Bureau, International Search Report and Written Opinion dated Nov. 7, 2019, issued in connection with International Application No. PCT/US2019/048366, filed on Aug. 27, 2019, 9 pages.
Japanese Patent Office, Office Action dated Dec. 7, 2021, issued in connection with Japanese Patent Application No. 2020-185230, 8 pages.
Japanese Patent Office, Examination Report and Translation dated Dec. 7, 2021, issued in connection with Japanese Patent Application No. 2020-185230, 10 pages.
Japanese Patent Office, Notice of Reasons for Refusal and Translation dated Oct. 5, 2021, issued in connection with Japanese Patent Application No. 2020-134012, 10 pages.
Japanese Patent Office, Office Action and Translation dated Apr. 13, 2021, issued in connection with Japanese Patent Application No. 2020-048867, 4 pages.
Non-Final Office Action dated Sep. 16, 2021, issued in connection with U.S. Appl. No. 17/098,134, filed Nov. 13, 2020, 10 pages.
Non-Final Office Action dated Jul. 21, 2021, issued in connection with U.S. Appl. No. 16/570,679, filed Sep. 13, 2019, 18 pages.
Non-Final Office Action dated Sep. 7, 2021, issued in connection with U.S. Appl. No. 16/994,627, filed Aug. 16, 2020, 11 pages.
Non-Final Office Action dated Aug. 13, 2021, issued in connection with U.S. Appl. No. 16/994,874, filed Aug. 17, 2020, 10 pages.
Non-Final Office Action dated Nov. 15, 2021, issued in connection with U.S. Appl. No. 17/135,308, filed Dec. 28, 2020, 19 pages.
Non-Final Office Action dated Mar. 18, 2022, issued in connection with U.S. Appl. No. 17/033,818, filed Sep. 27, 2020, 12 pages.
Non-Final Office Action dated Aug. 19, 2021, issued in connection with U.S. Appl. No. 17/357,302, filed Jun. 24, 2021, 16 pages.
Non-Final Office Action dated Oct. 22, 2021, issued in connection with U.S. Appl. No. 16/949,951, filed Nov. 20, 2020, 10 pages.
Non-Final Office Action dated Jun. 24, 2022, issued in connection with U.S. Appl. No. 17/373,179, filed Jul. 12, 2021, 8 pages.
Non-Final Office Action dated Feb. 25, 2022, issued in connection with U.S. Appl. No. 17/107,157, filed Nov. 30, 2020, 30 pages.
Non-Final Office Action dated May 28, 2021, issued in connection with U.S. Appl. No. 17/098,134, filed Nov. 13, 2020, 14 pages.
Non-Final Office Action dated May 3, 2021, issued in connection with U.S. Appl. No. 16/564,766, filed Sep. 9, 2019, 16 pages.
Non-Final Office Action dated Mar. 31, 2021, issued in connection with U.S. Appl. No. 16/919,467, filed Jul. 2, 2020, 10 pages.
Non-Final Office Action dated Jun. 8, 2021, issued in connection with U.S. Appl. No. 17/207,640, filed Mar. 20, 2021, 17 pages.
Notice of Allowance dated Jul. 21, 2021, issued in connection with U.S. Appl. No. 16/944,884, filed Jul. 31, 2020, 8 pages.
Notice of Allowance dated Aug. 4, 2021, issued in connection with U.S. Appl. No. 17/104,466, filed Nov. 25, 2020, 9 pages.
Notice of Allowance dated Nov. 1, 2021, issued in connection with U.S. Appl. No. 17/103,556, filed Nov. 24, 2020, 5 pages.
Notice of Allowance dated Jan. 12, 2022, issued in connection with U.S. Appl. No. 16/994,627, filed Aug. 16, 2020, 7 pages.
Notice of Allowance dated Oct. 14, 2021, issued in connection with U.S. Appl. No. 16/115,525, filed Aug. 28, 2018, 5 pages.
Notice of Allowance dated Nov. 15, 2021, issued in connection with U.S. Appl. No. 16/994,874, filed Aug. 17, 2020, 9 pages.

(56) References Cited

OTHER PUBLICATIONS

Notice of Allowance dated Feb. 16, 2022, issued in connection with U.S. Appl. No. 16/919,467, filed Jul. 2, 2020, 9 pages.
Notice of Allowance dated Mar. 18, 2021, issued in connection with U.S. Appl. No. 15/005,496, filed Jan. 25, 2016, 8 pages.
Notice of Allowance dated Oct. 18, 2021, issued in connection with U.S. Appl. No. 16/570,679, filed Sep. 13, 2019, 9 pages.
Notice of Allowance dated Jan. 19, 2022, issued in connection with U.S. Appl. No. 17/399,294, filed Aug. 11, 2021, 11 pages.
Notice of Allowance dated Feb. 2, 2022, issued in connection with U.S. Appl. No. 16/949,951, filed Nov. 20, 2020, 8 pages.
Notice of Allowance dated Sep. 2, 2021, issued in connection with U.S. Appl. No. 17/357,302, filed Jun. 24, 2021, 10 pages.
Notice of Allowance dated Apr. 20, 2022, issued in connection with U.S. Appl. No. 17/098,134, filed Nov. 13, 2020, 5 pages.
Notice of Allowance dated Apr. 22, 2021, issued in connection with U.S. Appl. No. 16/812,618, filed Mar. 9, 2020, 12 pages.
Notice of Allowance dated Oct. 27, 2021, issued in connection with U.S. Appl. No. 17/135,293, filed Dec. 28, 2020, 11 pages.
Notice of Allowance dated Sep. 29, 2021, issued in connection with U.S. Appl. No. 17/207,640, filed Mar. 20, 2021, 13 pages.
Notice of Allowance dated Mar. 3, 2022, issued in connection with U.S. Appl. No. 17/135,308, filed Dec. 28, 2020, 7 pages.
Notice of Allowance dated Aug. 31, 2021, issued in connection with U.S. Appl. No. 16/944,884, filed Jul. 31, 2020, 8 pages.
Notice of Allowance dated May 5, 2022, issued in connection with U.S. Appl. No. 17/316,371, filed May 10, 2021, 10 pages.
Notice of Allowance dated Jun. 8, 2021, issued in connection with U.S. Appl. No. 17/104,466, filed Nov. 25, 2020, 8 pages.
*Sonos, Inc.* v. *Google LLC*, WDTX Case No. 6:20-cv-00881, Google's Answer and Counterclaims; dated Jan. 8, 2021, 39 pages.
Final Office Action dated Jul. 1, 2022, issued in connection with U.S. Appl. No. 17/033,818, filed Sep. 27, 2020, 13 pages.
Final Office Action dated Aug. 30, 2022, issued in connection with U.S. Appl. No. 17/107,157, filed Nov. 30, 2020, 32 pages.
*Google LLC* v. *Sonos, Inc.*, Patent Owner Sur-Reply to Petitioner's Reply for Inter Partes Review of U.S. Pat. No. 9,219,460, IPR2021-00475, Oct. 12, 2022, 32 pages.
*Google LLC* v. *Sonos, Inc.*, Petitioner's Reply for Inter Partes Review of U.S. Pat. No. 9,219,460, IPR2021-00475, Sep. 6, 2022, 30 pages.
*Google LLC* v. *Sonos, Inc.*, Record of Oral Hearing for IPR of U.S. Pat. No. 9,219,460, IPR2021-00475, Dec. 14, 2022, 60 pages.
Non-Final Office Action dated Sep. 29, 2022, issued in connection with U.S. Appl. No. 17/340,353, filed Jun. 7, 2021, 8 pages.
Notice of Allowance dated Oct. 6, 2022, issued in connection with U.S. Appl. No. 17/582,317, filed Jan. 24, 2022, 9 pages.
Notice of Allowance dated Jul. 13, 2022, issued in connection with U.S. Appl. No. 17/033,821, filed Sep. 27, 2020, 8 pages.
Notice of Allowance dated Sep. 15, 2022, issued in connection with U.S. Appl. No. 17/033,818, filed Sep. 27, 2020, 7 pages.
Notice of Allowance dated Aug. 17, 2022, issued in connection with U.S. Appl. No. 17/316,371, filed May 10, 2021, 9 pages.
Notice of Allowance dated Aug. 18, 2022, issued in connection with U.S. Appl. No. 17/660,185, filed Apr. 21, 2022, 11 pages.
Notice of Allowance dated Sep. 23, 2022, issued in connection with U.S. Appl. No. 17/373,179, filed Jul. 12, 2021, 5 pages.
Advisory Action dated Jul. 1, 2019, issued in connection with U.S. Appl. No. 15/229,693, filed Aug. 5, 2016, 2 pages.
Advisory Action dated Jul. 10, 2018, issued in connection with U.S. Appl. No. 15/056,553, filed Feb. 29, 2016, 3 pages.
Advisory Action dated Dec. 11, 2020, issued in connection with U.S. Appl. No. 15/005,496, filed Jan. 25, 2016, 3 pages.
Advisory Action dated Jul. 12, 2018, issued in connection with U.S. Appl. No. 15/166,241, filed May 26, 2016, 3 pages.
Advisory Action dated Jul. 12, 2018, issued in connection with U.S. Appl. No. 15/235,598, filed Aug. 12, 2016, 3 pages.
Advisory Action dated Aug. 16, 2017, issued in connection with U.S. Appl. No. 14/481,505, filed Sep. 9, 2014, 3 pages.

Advisory Action dated Jun. 19, 2018, issued in connection with U.S. Appl. No. 15/229,693, filed Aug. 5, 2016, 3 pages.
Advisory Action dated Sep. 19, 2017, issued in connection with U.S. Appl. No. 14/726,921, filed Jun. 1, 2015, 3 pages.
Advisory Action dated Jun. 3, 2020, issued in connection with U.S. Appl. No. 16/115,525, filed Aug. 28, 2018, 3 pages.
Advisory Action dated Apr. 30, 2019, issued in connection with U.S. Appl. No. 15/005,496, filed Jan. 25, 2016, 3 pages.
Advisory Action dated Feb. 7, 2019, issued in connection with U.S. Appl. No. 15/806,126, filed Nov. 7, 2017, 3 pages.
AudioTron Quick Start Guide, Version 1.0, Mar. 2001, 24 pages.
AudioTron Reference Manual, Version 3.0, May 2002, 70 pages.
AudioTron Setup Guide, Version 3.0, May 2002, 38 pages.
Bluetooth. "Specification of the Bluetooth System: The ad hoc SCATTERNET for affordable and highly functional wireless connectivity," Core, Version 1.0 A, Jul. 26, 1999, 1068 pages.
Bluetooth. "Specification of the Bluetooth System: Wireless connections made easy," Core, Version 1.0 B, Dec. 1, 1999, 1076 pages.
Burger, Dennis, "Automated Room Correction Explained," hometheaterreview.com, Nov. 18, 2013, http://hometheaterreview.com/automated-room-correction-explained/ Retrieved Oct. 10, 2014, 3 pages.
Chen, Trista P. et al. VRAPS: Visual Rhythm-Based Audio Playback System. IEEE, Gracenote, Inc., 2010, pp. 721-722.
Chinese Patent Office, First Office Action and Translation dated Jun. 19, 2019, issued in connection with Chinese Application No. 201680054189.X, 11 pages.
Chinese Patent Office, First Office Action and Translation dated Feb. 22, 2021, issued in connection with Chinese Application No. 202010187024.8, 11 pages.
Chinese Patent Office, First Office Action and Translation dated Jun. 29, 2020, issued in connection with Chinese Application No. 201780057093.3, 11 pages.
Chinese Patent Office, First Office Action and Translation dated Feb. 3, 2021, issued in connection with Chinese Application No. 202010095178.4, 15 pages.
Chinese Patent Office, First Office Action and Translation dated Aug. 4, 2020, issued in connection with Chinese Application No. 201910395715.4, 22 pages.
Chinese Patent Office, First Office Action dated Aug. 11, 2017, issued in connection with Chinese Patent Application No. 201580013837.2, 8 pages.
Chinese Patent Office, First Office Action dated Nov. 20, 2018, issued in connection with Chinese Application No. 201580047998.3, 21 pages.
Chinese Patent Office, First Office Action dated Sep. 25, 2017, issued in connection with Chinese Patent Application No. 201580013894.0, 9 pages.
Chinese Patent Office, First Office Action dated Jan. 28, 2021, issued in connection with Chinese Application No. 201680054164.X, 9 pages.
Chinese Patent Office, First Office Action dated Nov. 5, 2018, issued in connection with Chinese Application No. 201680044080.8, 5 pages.
Chinese Patent Office, Office Action dated Nov. 14, 2019, issued in connection with Chinese Application No. 201680040086.8, 9 pages.
Chinese Patent Office, Office Action dated Dec. 24, 2020, issued in connection with Chinese Application No. 201910978233.1, 8 pages.
Chinese Patent Office, Second Office Action and Translation dated Aug. 26, 2019, issued in connection with Chinese Application No. 201580047998.3, 25 pages.
Chinese Patent Office, Second Office Action dated Jan. 11, 2019, issued in connection with Chinese Application No. 201680044080.8, 4 pages.
Chinese Patent Office, Second Office Action dated Feb. 3, 2019, issued in connection with Chinese Application No. 201580048594.6, 11 pages.
Chinese Patent Office, Second Office Action dated May 6, 2020, issued in connection with Chinese Application No. 201680040086.8, 3 pages.
Chinese Patent Office, Second Office Action with Translation dated Jan. 9, 2018, issued in connection with Chinese Patent Application No. 201580013837.2, 10 pages.

(56) References Cited

OTHER PUBLICATIONS

Chinese Patent Office, Third Office Action dated Apr. 11, 2019, issued in connection with Chinese Application No. 201580048594. 6, 4 pages.
"Constellation Acoustic System: a revolutionary breakthrough in acoustical design," Meyer Sound Laboratories, Inc. 2012, 32 pages.
"Constellation Microphones," Meyer Sound Laboratories, Inc. 2013, 2 pages.
Corrected Notice of Allowability dated Jan. 19, 2017, issued in connection with U.S. Appl. No. 14/826,873, filed Aug. 14, 2015, 11 pages.
Daddy, B., "Calibrating Your Audio with a Sound Pressure Level (SPL) Meter," Blue-ray.com, Feb. 22, 2008 Retrieved Oct. 10, 2014, 15 pages.
Dell, Inc. "Dell Digital Audio Receiver: Reference Guide," Jun. 2000, 70 pages.
Dell, Inc. "Start Here," Jun. 2000, 2 pages.
"Denon 2003-2004 Product Catalog," Denon, 2003-2004, 44 pages.
European Patent Office, European Examination Report dated May 11, 2018, issued in connection with European Application No. 16748186.0, 6 pages.
European Patent Office, European Extended Search Report dated Dec. 11, 2020, issued in connection with European Application No. 20196286.7, 6 pages.
European Patent Office, European Extended Search Report dated Mar. 16, 2020, issued in connection with European Application No. 19209551.1, 7 pages.
European Patent Office, European Extended Search Report dated Oct. 16, 2018, issued in connection with European Application No. 17185193.4, 6 pages.
European Patent Office, European Extended Search Report dated Jul. 17, 2019, issued in connection with European Application No. 19167365.6, 7 pages.
European Patent Office, European Extended Search Report dated Mar. 25, 2020, issued in connection with European Application No. 19215348.4, 10 pages.
Jones, Stephen, "Dell Digital Audio Receiver: Digital upgrade for your analog stereo," Analog Stereo, Jun. 24, 2000 http://www.reviewsonline.com/articles/961906864.htm retrieved Jun. 18, 2014, 2 pages.
"auEQ for the iPhone," Mar. 25, 2015, retrieved from the internet: URL:https://web.archive.org/web20150325152629/http://www.hotto.de/mobileapps/iphoneaueq.html [retrieved on Jun. 24, 2016], 6 pages.
Lei et al. An Audio Frequency Acquision and Release System Based on TMS320VC5509, Instrumentation Technology, Editorial Department Email, Issue 02, 2007, 4 pages.
Louderback, Jim, "Affordable Audio Receiver Furnishes Homes With MP3," TechTV Vault. Jun. 28, 2000 retrieved Jul. 10, 2014, 2 pages.
Microsoft Corporation, "Using Microsoft Outlook 2003," Cambridge College, 2003.
Motorola, "Simplefi, Wireless Digital Audio Receiver, Installation and User Guide," Dec. 31, 2001, 111 pages.
Mulcahy, John, "Room EQ Wizard: Room Acoustics Software," REW, 2014, retrieved Oct. 10, 2014, 4 pages.
Non-Final Action dated Jan. 29, 2016, issued in connection with U.S. Appl. No. 14/481,511, filed Sep. 9, 2014, 10 pages.
Non-Final Office Action dated Mar. 1, 2017, issued in connection with U.S. Appl. No. 15/344,069, filed Nov. 4, 2016, 20 pages.
Non-Final Office Action dated Nov. 1, 2017, issued in connection with U.S. Appl. No. 15/235,598, filed Aug. 12, 2016, 15 pages.
Non-Final Office Action dated Jun. 2, 2014, issued in connection with U.S. Appl. No. 13/340,126, filed Dec. 29, 2011, 14 pages.
Non-Final Office Action dated Jun. 2, 2017, issued in connection with U.S. Appl. No. 15/229,693, filed Aug. 5, 2016, 18 pages.
Non-Final Office Action dated Nov. 2, 2017, issued in connection with U.S. Appl. No. 15/166,241, filed May 26, 2016, 12 pages.
Non-Final Office Action dated Oct. 2, 2017, issued in connection with U.S. Appl. No. 15/005,853, filed Jan. 25, 2016, 8 pages.
Non-Final Office Action dated Feb. 3, 2016, issued in connection with U.S. Appl. No. 14/481,522, filed Sep. 9, 2014, 12 pages.
Non-Final Office Action dated Jul. 3, 2018, issued in connection with U.S. Appl. No. 15/909,327, filed Mar. 1, 2018, 30 pages.
Non-Final Office Action dated Jan. 4, 2017, issued in connection with U.S. Appl. No. 15/207,682, filed Jul. 12, 2016, 6 pages.
Non-Final Office Action dated Nov. 4, 2016, issued in connection with U.S. Appl. No. 14/826,856, filed Aug. 14, 2015, 10 pages.
Non-Final Office Action dated Sep. 4, 2019, issued in connection with U.S. Appl. No. 16/213,552, filed Dec. 7, 2018, 16 pages.
Non-Final Office Action dated Jul. 5, 2017, issued in connection with U.S. Appl. No. 14/481,522, filed Sep. 9, 2014, 8 pages.
Non-Final Office Action dated Jul. 6, 2016, issued in connection with U.S. Appl. No. 15/070,160, filed Mar. 15, 2016, 6 pages.
Non-Final Office Action dated Oct. 6, 2016, issued in connection with U.S. Appl. No. 14/678,263, filed Apr. 3, 2015, 30 pages.
Non-Final Office Action dated Jun. 6, 2018, issued in connection with U.S. Appl. No. 15/005,496, filed Jan. 25, 2016, 16 pages.
Non-Final Office Action dated Dec. 7, 2015, issued in connection with U.S. Appl. No. 14/921,762, filed Oct. 23, 2015, 5 pages.
Non-Final Office Action dated Jul. 7, 2016, issued in connection with U.S. Appl. No. 15/066,049, filed Mar. 10, 2016, 6 pages.
Non-Final Office Action dated Mar. 7, 2017, issued in connection with U.S. Appl. No. 14/481,514, filed Sep. 9, 2014, 24 pages.
Non-Final Office Action dated Sep. 7, 2016, issued in connection with U.S. Appl. No. 14/826,873, filed Aug. 14, 2015, 12 pages.
Non-Final Office Action dated Jul. 8, 2016, issued in connection with U.S. Appl. No. 15/066,072, filed Mar. 10, 2016, 6 pages.
Non-Final Office Action dated Dec. 9, 2016, issued in connection with U.S. Appl. No. 14/678,248, filed Apr. 3, 2015, 22 pages.
Non-Final Office Action dated Apr. 10, 2018, issued in connection with U.S. Appl. No. 15/909,529, filed Mar. 1, 2018, 8 pages.
Non-Final Office Action dated Mar. 10, 2017, issued in connection with U.S. Appl. No. 14/997,868, filed Jan. 18, 2016, 10 pages.
Non-Final Office Action dated Sep. 10, 2018, issued in connection with U.S. Appl. No. 15/056,553, filed Feb. 29, 2016, 8 pages.
Non-Final Office Action dated Apr. 11, 2017, issued in connection with U.S. Appl. No. 15/088,994, filed Apr. 1, 2016, 13 pages.
Non-Final Office Action dated Apr. 11, 2017, issued in connection with U.S. Appl. No. 15/089,004, filed Apr. 1, 2016, 9 pages.
Non-Final Office Action dated Dec. 11, 2019, issued in connection with U.S. Appl. No. 16/556,297, filed Aug. 30, 2019, 9 pages.
Non-Final Office Action dated Dec. 11, 2019, issued in connection with U.S. Appl. No. 16/658,896, filed Oct. 21, 2019, 14 pages.
Non-Final Office Action dated Feb. 11, 2021, issued in connection with U.S. Appl. No. 17/104,466, filed Nov. 25, 2020, 39 pages.
Non-Final Office Action dated Oct. 11, 2017, issued in connection with U.S. Appl. No. 15/480,265, filed Apr. 5, 2017, 8 pages.
Non-Final Office Action dated Oct. 11, 2018, issued in connection with U.S. Appl. No. 15/856,791, filed Dec. 28, 2017, 13 pages.
Non-Final Office Action dated Mar. 12, 2020, issued in connection with U.S. Appl. No. 16/796,496, filed Feb. 20, 2020, 13 pages.
Non-Final Office Action dated Sep. 12, 2016, issued in connection with U.S. Appl. No. 14/811,587, filed Jul. 28, 2015, 24 pages.
Non-Final Office Action dated Jul. 13, 2016, issued in connection with U.S. Appl. No. 14/940,779, filed Nov. 13, 2015, 16 pages.
Non-Final Office Action dated Mar. 13, 2020, issued in connection with U.S. Appl. No. 15/005,496, filed Jan. 25, 2016, 20 pages.
Non-Final Office Action dated Dec. 14, 2016, issued in connection with U.S. Appl. No. 14/481,505, filed Sep. 9, 2014, 19 pages.
Non-Final Office Action dated Mar. 14, 2017, issued in connection with U.S. Appl. No. 15/096,827, filed Apr. 12, 2016, 12 pages.
Non-Final Office Action dated May 14, 2019, issued in connection with U.S. Appl. No. 15/955,545, filed Apr. 17, 2018, 15 pages.
Non-Final Office Action dated Oct. 14, 2015, issued in connection with U.S. Appl. No. 14/216,325, filed Mar. 17, 2014, 7 pages.
Non-Final Office Action dated May 15, 2018, issued in connection with U.S. Appl. No. 15/806,126, filed Nov. 7, 2017, 17 pages.
Non-Final Office Action dated Jun. 16, 2017, issued in connection with U.S. Appl. No. 15/005,496, filed Jan. 25, 2016, 15 pages.
Non-Final Office Action dated Nov. 16, 2018, issued in connection with U.S. Appl. No. 15/996,878, filed Jun. 4, 2018, 8 pages.

(56) References Cited

OTHER PUBLICATIONS

Final Office Action dated Mar. 5, 2019, issued in connection with U.S. Appl. No. 15/056,553, filed Feb. 29, 2016, 9 pages.
Final Office Action dated Dec. 6, 2018, issued in connection with U.S. Appl. No. 15/806,126, filed Nov. 7, 2017, 18 pages.
Final Office Action dated Apr. 9, 2019, issued in connection with U.S. Appl. No. 15/229,693, filed Aug. 5, 2016, 33 pages.
First Action Interview Office Action dated Mar. 3, 2017, issued in connection with U.S. Appl. No. 14/726,921, filed Jun. 1, 2015, 9 pages.
First Action Interview Office Action dated Jul. 12, 2016, issued in connection with U.S. Appl. No. 14/481,514, filed Sep. 9, 2014, 10 pages.
First Action Interview Office Action dated Jun. 30, 2016, issued in connection with U.S. Appl. No. 14/481,505, filed Sep. 9, 2014, 9 pages.
First Action Interview Pilot Program Pre-Interview Communication dated Apr. 5, 2017, issued in connection with U.S. Appl. No. 14/793,190, filed Jul. 7, 2015, 4 pages.
First Action Interview Pilot Program Pre-Interview Communication dated Oct. 7, 2015, issued in connection with U.S. Appl. No. 14/216,306, filed Mar. 17, 2014, 5 pages.
First Action Interview Pilot Program Pre-Interview Communication dated Feb. 16, 2016, issued in connection with U.S. Appl. No. 14/681,465, filed Apr. 8, 2015, 5 pages.
Gonzalez et al., "Simultaneous Measurement of Multichannel Acoustic Systems," J. Audio Eng. Soc., 2004, pp. 26-42, vol. 52, No. 1/2.
International Bureau, International Preliminary Report on Patentability, dated Sep. 24, 2015, issued in connection with International Application No. PCT/US2014/030560, filed on Mar. 17, 2014, 7 pages.
International Bureau, International Preliminary Report on Patentability dated Sep. 29, 2016, issued in connection with International Application No. PCT/US2015/020993, filed on Mar. 17, 2015, 8 pages.
International Bureau, International Preliminary Report on Patentability dated Sep. 29, 2016, issued in connection with International Application No. PCT/US2015/021000, filed on Mar. 17, 2015, 9 pages.
International Bureau, International Preliminary Report on Patentability, dated Aug. 9, 2018, issued in connection with International Application No. PCT/US2017/014596, filed on Jan. 23, 2017, 11 pages.
International Bureau, International Search Report and Written Opinion dated Dec. 15, 2020, issued in connection with International Application No. PCT/US2020/045746, filed on Aug. 11, 2020, 23 pages.
International Searching Authority, International Preliminary Report on Patentability dated Mar. 23, 2017, issued in connection with International Patent Application No. PCT/US2015/048944, filed on Sep. 8, 2015, 8 pages.
International Searching Authority, International Preliminary Report on Patentability dated Oct. 24, 2017, issued in connection with International Application No. PCT/US2016/028994 filed on Apr. 22, 2016, 7 pages.
International Searching Authority, International Search Report and Written Opinion dated Jul. 4, 2016, issued in connection with International Application No. PCT/US2016/028994, filed on Apr. 22, 2016, 12 pages.
International Searching Authority, International Search Report and Written Opinion dated Jul. 5, 2016, issued in connection with International Application No. PCT/US2016/028997, filed on Apr. 22, 2016, 13 pages.
International Searching Authority, International Search Report and Written Opinion dated Jun. 5, 2015, issued in connection with International Application No. PCT/US2015/021000, filed on Mar. 17, 2015, 12 pages.
International Searching Authority, International Search Report and Written Opinion dated Oct. 12, 2016, issued in connection with International Application No. PCT/US2016/041179 filed on Jul. 6, 2016, 9 pages.
International Searching Authority, International Search Report and Written Opinion dated Jun. 16, 2015, issued in connection with International Application No. PCT/US2015/020993, filed on Mar. 17, 2015, 11 pages.
International Searching Authority, International Search Report and Written Opinion dated Nov. 18, 2015, issued in connection with International Application No. PCT/US2015/048954, filed on Sep. 8, 2015, 11 pages.
International Searching Authority, International Search Report and Written Opinion dated Oct. 18, 2016, issued in connection with International Application No. PCT/US2016/043116, filed on Jul. 20, 2016, 14 pages.
International Searching Authority, International Search Report and Written Opinion dated Oct. 18, 2016, issued in connection with International Application No. PCT/US2016/043840, filed on Jul. 25, 2016, 14 pages.
International Searching Authority, International Search Report and Written Opinion dated Nov. 23, 2015, issued in connection with International Application No. PCT/US2015/048942, filed on Sep. 8, 2015, 14 pages.
International Searching Authority, International Search Report and Written Opinion dated Nov. 23, 2015, issued in connection with International Application No. PCT/US2015/048944, filed on Sep. 8, 2015, 12 pages.
International Searching Authority, International Search Report and Written Opinion dated Nov. 23, 2016, issued in connection with International Patent Application No. PCT/US2016/052266, filed on Sep. 16, 2016, 11 pages.
International Searching Authority, International Search Report and Written Opinion dated Jan. 24, 2017, issued in connection with International Application No. PCT/US2016/052264, filed on Sep. 16, 2016, 17 pages.
International Searching Authority, International Search Report and Written Opinion dated Oct. 25, 2016, issued in connection with International Application No. PCT/US2016/043109, filed on Jul. 20, 2016, 12 pages.
International Searching Authority, International Search Report and Written Opinion dated Sep. 25, 2017, issued in connection with International Application No. PCT/US2017/042191, filed on Jul. 14, 2017, 16 pages.
International Searching Authority, International Search Report and Written Opinion dated Aug. 3, 2017, in connection with International Application No. PCT/US2017014596, 20 pages.
Japanese Patent Office, English Translation of Office Action dated May 8, 2018, issued in connection with Japanese Application No. 2017-513241, 4 pages.
Japanese Patent Office, Japanese Office Action dated Oct. 3, 2017, issued in connection with Japanese Application No. 2017-501082, 7 pages.
Japanese Patent Office, Non-Final Office Action and Translation dated Dec. 10, 2019, issued in connection with Japanese Patent Application No. 2018-213477, 8 pages.
Japanese Patent Office, Non-Final Office Action with Translation dated Apr. 25, 2017, issued in connection with Japanese Patent Application No. 2016-568888, 7 pages.
Japanese Patent Office, Non-Final Office Action with Translation dated Oct. 3, 2017, issued in connection with Japanese Patent Application No. 2017-501082, 3 pages.
Japanese Patent Office, Office Action and Translation dated Jun. 12, 2020, issued in connection with Japanese Patent Application No. 2019-056360, 6 pages.
Japanese Patent Office, Office Action and Translation dated Nov. 4, 2020, issued in connection with Japanese Patent Application No. 2019-141349, 6 pages.
Japanese Patent Office, Office Action dated Jun. 12, 2018, issued in connection with Japanese Application No. 2018-502729, 4 pages.
Japanese Patent Office, Office Action dated May 14, 2019, issued in connection with Japanese Patent Application No. 2018-500529, 8 pages.

(56) References Cited

OTHER PUBLICATIONS

Japanese Patent Office, Office Action dated Aug. 21, 2018, issued in connection with Japanese Application No. 2018-514418, 7 pages.
Japanese Patent Office, Office Action dated Jul. 24, 2018, issued in connection with Japanese Application No. 2018-514419, 5 pages.
Japanese Patent Office, Office Action dated Feb. 4, 2020, issued in connection with Japanese Patent Application No. 2018-500529, 6 pages.
Japanese Patent Office, Office Action dated Jun. 4, 2019, issued in connection with Japanese Patent Application No. 2018-112810, 4 pages.
Japanese Patent Office, Office Action dated May 8, 2018, issued in connection with Japanese Application No. 2017-513241, 8 pages.
Japanese Patent Office, Office Action with English Summary dated Jul. 18, 2017, issued in connection with Japanese Patent Application No. 2017-513171, 4 pages.
Japanese Patent Office, Translation of Office Action dated May 14, 2019, issued in connection with Japanese Patent Application No. 2018-500529, 5 pages.
Jo et al., "Synchronized One-to-many Media Streaming with Adaptive Playout Control," Proceedings of SPIE, 2002, pp. 71-82, vol. 4861.
Notice of Allowance dated Jun. 21, 2019, issued in connection with U.S. Appl. No. 15/235,598, filed Aug. 12, 2016, 11 pages.
Notice of Allowance dated Oct. 21, 2019, issued in connection with U.S. Appl. No. 16/182,886, filed Nov. 7, 2018, 10 pages.
Notice of Allowance dated Feb. 22, 2021, issued in connection with U.S. Appl. No. 16/944,884, filed Jul. 31, 2020, 9 pages.
Notice of Allowance dated Jun. 22, 2017, issued in connection with U.S. Appl. No. 14/644,136, filed Mar. 10, 2015, 12 pages.
Notice of Allowance dated Aug. 23, 2018, issued in connection with U.S. Appl. No. 15/909,529, filed Mar. 1, 2018, 8 pages.
Notice of Allowance dated Feb. 23, 2021, issued in connection with U.S. Appl. No. 16/115,525, filed Aug. 28, 2018, 8 pages.
Notice of Allowance dated Jun. 23, 2016, issued in connection with U.S. Appl. No. 14/921,781, filed Oct. 23, 2015, 8 pages.
Notice of Allowance dated Mar. 23, 2020, issued in connection with U.S. Appl. No. 16/542,418, filed Aug. 16, 2019, 5 pages.
Notice of Allowance dated May 23, 2018, issued in connection with U.S. Appl. No. 15/698,283, filed Sep. 7, 2017, 8 pages.
Notice of Allowance dated Nov. 23, 2020, issued in connection with U.S. Appl. No. 16/403,077, filed May 3, 2019, 6 pages.
Notice of Allowance dated Oct. 23, 2017, issued in connection with U.S. Appl. No. 14/481,522, filed Sep. 9, 2014, 16 pages.
Notice of Allowance dated Oct. 23, 2020, issued in connection with U.S. Appl. No. 16/555,846, filed Aug. 29, 2019, 5 pages.
Notice of Allowance dated Sep. 23, 2016, issued in connection with U.S. Appl. No. 15/070,160, filed Mar. 15, 2016, 7 pages.
Notice of Allowance dated Jul. 24, 2019, issued in connection with U.S. Appl. No. 15/229,693, filed Aug. 5, 2016, 13 pages.
Notice of Allowance dated Jul. 24, 2020, issued in connection with U.S. Appl. No. 16/665,415, filed Oct. 28, 2019, 12 pages.
Notice of Allowance dated May 24, 2017, issued in connection with U.S. Appl. No. 14/997,868, filed Jan. 18, 2016, 5 pages.
Notice of Allowance dated Nov. 24, 2017, issued in connection with U.S. Appl. No. 15/681,640, filed Aug. 21, 2017, 8 pages.
Notice of Allowance dated Apr. 25, 2017, issued in connection with U.S. Appl. No. 14/696,014, filed Apr. 24, 2015, 7 pages.
Notice of Allowance dated Apr. 25, 2017, issued in connection with U.S. Appl. No. 15/207,682, filed Jul. 12, 2016, 7 pages.
Notice of Allowance dated Apr. 25, 2019, issued in connection with U.S. Appl. No. 15/806,126, filed Nov. 7, 2017, 8 pages.
Notice of Allowance dated Jan. 25, 2021, issued in connection with U.S. Appl. No. 17/129,670, filed Dec. 21, 2020, 10 pages.
Notice of Allowance dated Oct. 25, 2016, issued in connection with U.S. Appl. No. 14/826,873, filed Aug. 14, 2015, 5 pages.
Notice of Allowance dated Feb. 26, 2016, issued in connection with U.S. Appl. No. 14/921,762, filed Oct. 23, 2015, 7 pages.
Notice of Allowance dated Jul. 26, 2016, issued in connection with U.S. Appl. No. 14/481,511, filed Sep. 9, 2014, 12 pages.
Notice of Allowance dated Oct. 26, 2016, issued in connection with U.S. Appl. No. 14/811,587, filed Jul. 28, 2015, 11 pages.
Notice of Allowance dated Feb. 27, 2017, issued in connection with U.S. Appl. No. 14/805,340, filed Jul. 21, 2015, 9 pages.
Notice of Allowance dated Jul. 27, 2017, issued in connection with U.S. Appl. No. 15/005,853, filed Jan. 25, 2016, 5 pages.
Notice of Allowance dated Jun. 27, 2017, issued in connection with U.S. Appl. No. 15/344,069, filed Nov. 4, 2016, 8 pages.
Notice of Allowance dated Oct. 27, 2020, issued in connection with U.S. Appl. No. 16/555,832, filed Aug. 29, 2019, 5 pages.
Notice of Allowance dated Aug. 28, 2017, issued in connection with U.S. Appl. No. 15/089,004, filed Apr. 1, 2016, 5 pages.
Notice of Allowance dated Jul. 28, 2017, issued in connection with U.S. Appl. No. 14/678,263, filed Apr. 3, 2015, 10 pages.
Notice of Allowance dated Jul. 28, 2017, issued in connection with U.S. Appl. No. 15/211,822, filed Jul. 15, 2016, 9 pages.
Notice of Allowance dated Mar. 28, 2018, issued in connection with U.S. Appl. No. 15/673,170, filed Aug. 9, 2017, 5 pages.
Notice of Allowance dated Aug. 29, 2018, issued in connection with U.S. Appl. No. 15/357,520, filed Nov. 21, 2016, 11 pages.
Notice of Allowance dated Aug. 29, 2018, issued in connection with U.S. Appl. No. 15/718,556, filed Sep. 28, 2017, 8 pages.
Notice of Allowance dated Aug. 29, 2019, issued in connection with U.S. Appl. No. 16/185,906, filed Nov. 9, 2018, 8 pages.
Notice of Allowance dated Dec. 29, 2017, issued in connection with U.S. Appl. No. 14/793,205, filed Jul. 7, 2015, 5 pages.
Notice of Allowance dated Jul. 29, 2016, issued in connection with U.S. Appl. No. 14/481,522, filed Sep. 9, 2014, 11 pages.
Notice of Allowance dated Oct. 29, 2015, issued in connection with U.S. Appl. No. 14/216,306, filed Mar. 17, 2014, 9 pages.
Notice of Allowance dated Mar. 3, 2021, issued in connection with U.S. Appl. No. 16/403,077, filed May 3, 2019, 6 pages.
Notice of Allowance dated Mar. 3, 2021, issued in connection with U.S. Appl. No. 17/078,382, filed Oct. 23, 2020, 9 pages.
Notice of Allowance dated May 3, 2019, issued in connection with U.S. Appl. No. 15/217,399, filed Jul. 22, 2016, 7 pages.
Notice of Allowance dated May 3, 2019, issued in connection with U.S. Appl. No. 16/181,583, filed Nov. 6, 2018, 7 pages.
Notice of Allowance dated Aug. 30, 2017, issued in connection with U.S. Appl. No. 15/088,994, filed Apr. 1, 2016, 10 pages.
Notice of Allowance dated Dec. 30, 2016, issued in connection with U.S. Appl. No. 14/696,014, filed Apr. 24, 2015, 13 pages.
Notice of Allowance dated Jan. 30, 2017, issued in connection with U.S. Appl. No. 15/339,260, filed Oct. 31, 2016, 8 pages.
Notice of Allowance dated Aug. 31, 2018, issued in connection with U.S. Appl. No. 15/872,979, filed Jan. 16, 2018, 7 pages.
Notice of Allowance dated Aug. 31, 2018, issued in connection with U.S. Appl. No. 16/055,884, filed Aug. 6, 2018, 8 pages.
Notice of Allowance dated Mar. 31, 2020, issued in connection with U.S. Appl. No. 16/538,629, filed Aug. 12, 2019, 9 pages.
Notice of Allowance dated Apr. 4, 2017, issued in connection with U.S. Appl. No. 14/682,182, filed Apr. 9, 2015, 8 pages.
Notice of Allowance dated Jun. 6, 2018, issued in connection with U.S. Appl. No. 15/727,913, filed Oct. 9, 2017, 5 pages.
Notice of Allowance dated Dec. 7, 2015, issued in connection with U.S. Appl. No. 14/216,325, filed Mar. 17, 2014, 7 pages.
Notice of Allowance dated Nov. 9, 2016, issued in connection with U.S. Appl. No. 14/805,340, filed Jul. 21, 2015, 13 pages.
Notice of Allowance dated Feb. 1, 2018, issued in connection with U.S. Appl. No. 15/480,265, filed Apr. 5, 2017, 8 pages.
Notice of Allowance dated Apr. 10, 2015, issued in connection with U.S. Appl. No. 13/536,493, filed Jun. 28, 2012, 8 pages.
Notice of Allowance dated Aug. 10, 2018, issued in connection with U.S. Appl. No. 15/785,088, filed Oct. 16, 2017, 6 pages.
Notice of Allowance dated Jul. 10, 2018, issued in connection with U.S. Appl. No. 15/673,170, filed Aug. 9, 2017, 2 pages.
Notice of Allowance dated Jun. 10, 2020, issued in connection with U.S. Appl. No. 16/713,858, filed Dec. 13, 2019, 8 pages.
Notice of Allowance dated Dec. 11, 2018, issued in connection with U.S. Appl. No. 15/909,327, filed Mar. 1, 2018, 10 pages.
Notice of Allowance dated Feb. 11, 2019, issued in connection with U.S. Appl. No. 15/588,186, filed May 5, 2017, 5 pages.

(56) References Cited

OTHER PUBLICATIONS

Notice of Allowance dated Jul. 11, 2017, issued in connection with U.S. Appl. No. 14/678,248, filed Apr. 3, 2015, 11 pages.
Notice of Allowance dated Mar. 11, 2015, issued in connection with U.S. Appl. No. 13/340,126, filed Dec. 29, 2011, 7 pages.
Notice of Allowance dated Apr. 12, 2016, issued in connection with U.S. Appl. No. 14/681,465, filed Apr. 8, 2015, 13 pages.
Notice of Allowance dated Aug. 12, 2019, issued in connection with U.S. Appl. No. 16/416,648, filed May 20, 2019, 7 pages.
Notice of Allowance dated Dec. 12, 2016, issued in connection with U.S. Appl. No. 14/805,140, filed Jul. 21, 2015, 24 pages.
Notice of Allowance dated Dec. 12, 2017, issued in connection with U.S. Appl. No. 14/481,505, filed Sep. 9, 2014, 9 pages.
Notice of Allowance dated Nov. 12, 2019, issued in connection with U.S. Appl. No. 15/955,545, filed Apr. 17, 2018, 9 pages.
Notice of Allowance dated Sep. 12, 2016, issued in connection with U.S. Appl. No. 15/066,072, filed Mar. 10, 2016, 7 pages.
Notice of Allowance dated Sep. 12, 2017, issued in connection with U.S. Appl. No. 15/207,682, filed Jul. 12, 2016, 8 pages.
Notice of Allowance dated Apr. 13, 2020, issued in connection with U.S. Appl. No. 16/181,865, filed Nov. 3, 2018, 10 pages.
Notice of Allowance dated Feb. 13, 2017, issued in connection with U.S. Appl. No. 14/864,506, filed Sep. 24, 2015, 8 pages.
Notice of Allowance dated Nov. 13, 2017, issued in connection with U.S. Appl. No. 14/726,921, filed Jun. 1, 2015, 8 pages.
Notice of Allowance dated Jul. 14, 2020, issued in connection with U.S. Appl. No. 16/556,297, filed Aug. 30, 2019, 11 pages.
Notice of Allowance dated Mar. 14, 2019, issued in connection with U.S. Appl. No. 15/343,996, filed Nov. 4, 2016, 8 pages.
Notice of Allowance dated Jan. 15, 2019, issued in connection with U.S. Appl. No. 16/115,524, filed Aug. 28, 2018, 8 pages.
Notice of Allowance dated Jun. 15, 2017, issued in connection with U.S. Appl. No. 15/096,827, filed Apr. 12, 2016, 5 pages.
Notice of Allowance dated Mar. 15, 2017, issued in connection with U.S. Appl. No. 14/826,856, filed Aug. 14, 2015, 7 pages.
Notice of Allowance dated May 15, 2019, issued in connection with U.S. Appl. No. 16/113,032, filed Aug. 27, 2018, 9 pages.
Notice of Allowance dated Oct. 15, 2018, issued in connection with U.S. Appl. No. 15/716,313, filed Sep. 26, 2017, 10 pages.
Notice of Allowance dated Jul. 16, 2020, issued in connection with U.S. Appl. No. 16/530,324, filed Aug. 2, 2019, 9 pages.
Notice of Allowance dated Jun. 16, 2017, issued in connection with U.S. Appl. No. 14/884,001, filed Oct. 15, 2015, 8 pages.
Notice of Allowance dated May 16, 2019, issued in connection with U.S. Appl. No. 16/181,213, filed Nov. 5, 2018, 10 pages.
Notice of Allowance dated Oct. 16, 2017, issued in connection with U.S. Appl. No. 15/478,770, filed Apr. 4, 2017, 10 pages.
Notice of Allowance dated Oct. 16, 2019, issued in connection with U.S. Appl. No. 16/401,981, filed May 2, 2019, 8 pages.
Notice of Allowance dated Sep. 16, 2016, issued in connection with U.S. Appl. No. 15/066,049, filed Mar. 10, 2016, 7 pages.
Notice of Allowance dated Dec. 17, 2018, issued in connection with U.S. Appl. No. 16/055,884, filed Aug. 6, 2018, 5 pages.
Notice of Allowance dated May 17, 2017, issued in connection with U.S. Appl. No. 15/339,260, filed Oct. 31, 2016, 7 pages.
Notice of Allowance dated Oct. 17, 2019, issued in connection with U.S. Appl. No. 16/542,433, filed Aug. 16, 2019, 9 pages.
Notice of Allowance dated Mar. 18, 2019, issued in connection with U.S. Appl. No. 16/056,862, filed Aug. 7, 2018, 12 pages.
Notice of Allowance dated Aug. 19, 2016, issued in connection with U.S. Appl. No. 14/644,136, filed Mar. 10, 2015, 12 pages.
Notice of Allowance dated Jun. 19, 2017, issued in connection with U.S. Appl. No. 14/793,190, filed Jul. 7, 2015, 5 pages.
Notice of Allowance dated Sep. 19, 2017, issued in connection with U.S. Appl. No. 14/793,205, filed Jul. 7, 2015, 16 pages.
Notice of Allowance dated Sep. 19, 2018, issued in connection with U.S. Appl. No. 14/864,393, filed Sep. 24, 2015, 10 pages.
Notice of Allowance dated Mar. 2, 2020, issued in connection with U.S. Appl. No. 16/213,552, filed Dec. 7, 2018, 9 pages.
Notice of Allowance dated Apr. 20, 2017, issued in connection with U.S. Appl. No. 14/940,779, filed Nov. 13, 2015, 11 pages.
Notice of Allowance dated Nov. 20, 2017, issued in connection with U.S. Appl. No. 15/298,115, filed Oct. 19, 2016, 10 pages.
Notice of Allowance dated Sep. 20, 2017, issued in connection with U.S. Appl. No. 14/481,514, filed Sep. 9, 2014, 10 pages.
Notice of Allowance dated Dec. 21, 2016, issued in connection with U.S. Appl. No. 14/682,182, filed Apr. 9, 2015, 8 pages.
Notice of Allowance dated Feb. 21, 2018, issued in connection with U.S. Appl. No. 15/005,853, filed Jan. 25, 2016, 5 pages.
Notice of Allowance dated Jul. 21, 2017, issued in connection with U.S. Appl. No. 15/211,835, filed Jul. 15, 2016, 10 pages.
*Google LLC* v. *Sonos, Inc.*, Judgment, Final Written Decision Determining All Challenged Claims Unpatentable 35 U.S.C. § 318(a), IPR2021-00475, Feb. 15, 2023, 45 pages.

\* cited by examiner

AUDIO SETTINGS BASED ON ENVIRONMENT

CROSS REFERENCE TO RELATED APPLICATIONS

This application claims priority under 35 U.S.C. § 120 to, and is a continuation of, U.S. non-provisional patent application Ser. No. 16/564,684, filed on Sep. 9, 2019, entitled "Indoor/Outdoor Playback Device Calibration," which is incorporated herein by reference in its entirety.

U.S. non-provisional patent application Ser. No. 16/564,684 claims priority under 35 U.S.C. § 120 to, and is a continuation of, U.S. non-provisional patent application Ser. No. 16/181,213, filed on Nov. 5, 2018, entitled "Calibration of Playback Device to Target Curve," and issued as U.S. Pat. No. 10,412,517 on Sep. 10, 2019, which is incorporated herein by reference in its entirety.

U.S. non-provisional patent application Ser. No. 16/181,213 claims priority under 35 U.S.C. § 120 to, and is a continuation of, U.S. non-provisional patent application Ser. No. 15/872,979, filed on Jan. 15, 2018, entitled "Audio Settings of Multiple Speakers in a Playback Device," and issued as U.S. Pat. No. 10,129,675 on Nov. 13, 2018, which is incorporated herein by reference in its entirety.

U.S. non-provisional patent application Ser. No. 15/872,979 claims priority under 35 U.S.C. § 120 to, and is a continuation of U.S. non-provisional patent application Ser. No. 15/207,682, filed on Jul. 12, 2016, entitled "Audio Settings of Multiple Speakers in a Playback Device," issued as U.S. Pat. No. 9,872,119 on Jan. 16, 2018, which is incorporated herein by reference in its entirety.

U.S. non-provisional patent application Ser. No. 15/207,682 claims priority under 35 U.S.C. § 120 to, and is a continuation of U.S. non-provisional patent application Ser. No. 14/681,465, filed on Apr. 8, 2015, entitled "Audio Settings Based On Environment," issued as U.S. Pat. No. 9,419,575 on Aug. 16, 2016, which is incorporated herein by reference in its entirety.

U.S. non-provisional patent application Ser. No. 14/681,465 claims priority under 35 U.S.C. § 120 to, and is a continuation of U.S. non-provisional patent application Ser. No. 14/216,306, filed on Mar. 17, 2014, entitled "Audio Settings Based On Environment," issued as U.S. Pat. No. 9,219,460 on Dec. 22, 2015, which is incorporated herein by reference in its entirety.

FIELD OF THE DISCLOSURE

The disclosure is related to consumer goods and, more particularly, to methods, systems, products, features, services, and other elements directed to media playback or some aspect thereof.

BACKGROUND

Options for accessing and listening to digital audio in an out-loud setting were limited until in 2003, when SONOS, Inc. filed for one of its first patent applications, entitled "Method for Synchronizing Audio Playback between Multiple Networked Devices," and began offering a media playback system for sale in 2005. The Sonos Wireless HiFi System enables people to experience music from many sources via one or more networked playback devices. Through a software control application installed on a smartphone, tablet, or computer, one can play what he or she wants in any room that has a networked playback device. Additionally, using the controller, for example, different songs can be streamed to each room with a playback device, rooms can be grouped together for synchronous playback, or the same song can be heard in all rooms synchronously.

Given the ever growing interest in digital media, there continues to be a need to develop consumer-accessible technologies to further enhance the listening experience.

BRIEF DESCRIPTION OF THE DRAWINGS

Features, aspects, and advantages of the presently disclosed technology may be better understood with regard to the following description, appended claims, and accompanying drawings where:

Figure 1:
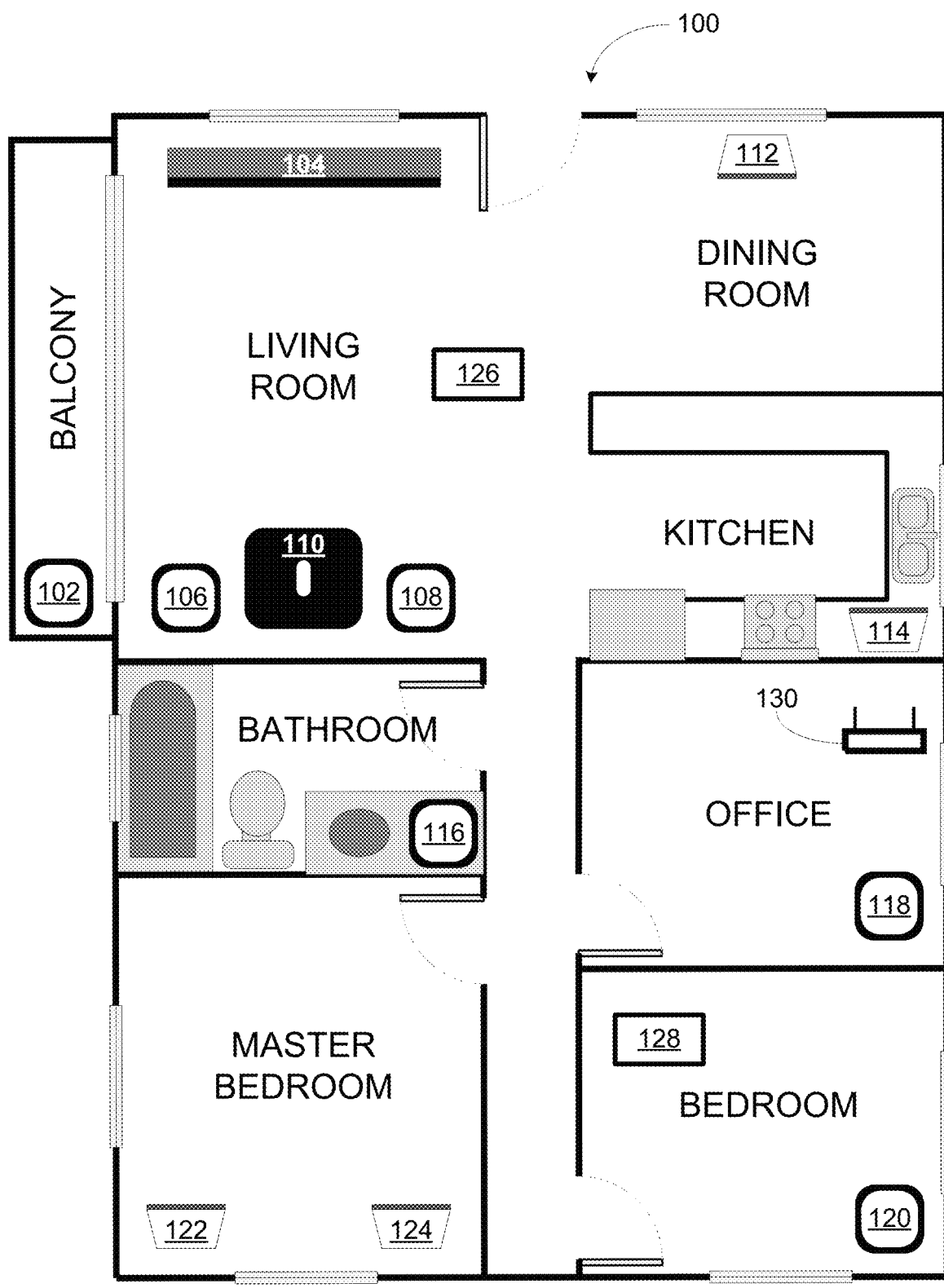
FIG. 1 shows an example media playback system configuration in which certain embodiments may be practiced.

The drawings are for the purpose of illustrating example embodiments, but it is understood that the inventions are not limited to the arrangements and instrumentality shown in the drawings.

DETAILED DESCRIPTION

I. Overview

Embodiments described herein involve dynamically adjusting the equalization of a playback device based on the environment in which the playback device is operating. While a playback device may be factory configured to perform advantageously in a typical operating environment, the factory configuration may not be ideal for all environments. Therefore, adjusting the equalization of the playback device based on the current operating environment may improve the listening experience for some listeners.

Consider that, as one example, a playback device may be configured to perform advantageously in a small room, but nonetheless may come to be positioned outdoors. When operating outdoors, boosting the bass levels of the playback may result in an improved listening experience for some users. Other such examples may exist as well.

Some audio playback systems implement a manual approach for adjustment of equalization based on environment. Under this approach, a microphone is cabled to a given component of an audio system, such as an amplifier or an audio-video receiver. A user is then expected to position the microphone in a position in which the user would typically listen to the audio system. The given component of the audio system then drives audio output to one or more speakers. Then, the speaker output is detected by the microphone. Playback of the audio component is then adjusted based on the speaker output detected by the microphone.

Such a manual approach has several disadvantages. First, the adjustment process is often overlooked by the user because, for example, the user may be required to initiate the adjustment and position the microphone. Second, the adjustment process requires a separate microphone, which may not be included with any of the components of the audio system. Third, the manual approach does not lend itself to frequent adjustment when one or more of the speakers may be re-positioned in different locations throughout a home or outdoors. Therefore, an improved, dynamic approach to adjustment based on environment is desired.

Described herein are example methods and systems for dynamically adjusting equalization of a playback device based on the environment in which the playback device is operating. An example playback device may include a speaker, a microphone, and a processor. The playback device may emit an audio signal, such as a pulse, from the speaker. As the audio signal propagates, the signal may encounter various objects, such as walls and furniture, throughout the environment. When an object is encountered, the object may variably reflect or absorb portions of the audio signal. For instance, when the audio signal encounters an interior wall, a portion of the audio signal may be reflected by the interior wall. The portion of the audio signal may then encounter other objects that variably reflect or absorb some of the portion in turn. At some point, a portion of the reflected audio signal may reflect back toward the playback device from which the audio signal was emitted. The microphone of the playback device may then detect at least a portion of the reflected audio signal.

In response to detecting the reflected audio signal, the playback device may determine one or more reflection characteristics based on the reflected audio signal. For example, the playback device may determine an amount of time from when the playback device emitted the first audio signal to when the playback device detected the reflected audio signal. The amount of time may indicate the nature of the environment. For instance, a relatively short amount of time may indicate that the playback device is in a small room while a relatively amount of time may indicate that the playback device is in a large room. Alternatively, the playback device may determine the sound pressure level of the second audio signal. A relatively low sound pressure level may indicate that there is relatively more absorptive material in the environment as compared with a relatively higher sound pressure level. Or the relatively low sound pressure level may indicate that the first audio signal travelled a relatively longer distance before reflecting. Other reflection characteristics may exist, as may many other examples of indications regarding the nature of the environment.

The playback device may then adjust an equalization setting of the playback device based on the one or more reflection characteristics. Further, two or more reflection characteristics may be used in combination. For instance, a relatively long amount of time and a relatively low sound pressure level may indicate that the playback device is either presumed to be outside or in a very large room. In either case, the playback device may adjust the equalization setting based on that environment. In the above instance, where the playback device is either outside or in a very large room, the bass frequencies of the playback device may be increased, which may, to some listeners, improve enjoyment of the audio played by the playback device in the more spacious environment. In contrast, where the reflection characteristics indicate that the playback device is in a small room, the bass frequencies of the playback device may be decreased, which may improve enjoyment of the audio played by the playback device in the small room. Once the equalization setting is adjusted, the playback device may then play an audio track according to the equalization setting.

As indicated above, the present application involves dynamically adjusting the equalization of a playback device based on the environment in which the playback device is operating. In one aspect, a method is provided. The method involves emitting, by a playback device, a first audio signal, detecting, by the playback device, a second audio signal, where at least a portion of the second audio signal is a reflection of the first audio signal, in response to the detecting, determining one or more reflection characteristics, where each of the one or more reflection characteristics are based on at least the second audio signal, adjusting an equalization setting of the playback device based on the one or more reflection characteristics; and causing an audio track to play according to the adjusted equalization setting.

In another aspect, a second method is provided. The second method is operable in a media playback system comprising a plurality of playback devices, where each playback device comprises a respective microphone and a respective speaker. The second method involves receiving an indication of a first audio signal, detecting, by a microphone of the first playback device, a second audio signal, where at least a portion of the second audio signal is indicative of the first audio signal, in response to the detecting, determining a first reflection characteristic based on the second audio signal, adjusting an equalization setting of the first playback device based on at least the first reflection characteristic, and sending to a second media playback device an indication of the first reflection characteristic.

In another aspect, a device is provided. The device includes a speaker, a microphone that is physically coupled to the speaker, a processor, a network interface, a data storage, and a program logic stored in the data storage. The program logic is executable by the processor to emit a first audio signal from the speaker, detect, via the microphone, a second audio signal, wherein at least a portion of the second audio signal is a reflection of the first audio signal, in response to the detecting, determine a first reflection characteristic based on at least the second audio signal, adjust an equalization setting of the playback device based on at least the first reflection characteristic, and play, via the speaker, an audio track according to the equalization setting.

In yet another aspect, a non-transitory computer readable memory is provided. The non-transitory computer readable memory has stored thereon instructions executable by a computing device to cause the computing device to perform functions. The functions include emitting, by a playback device, a first audio signal, detecting, by the playback device, a second audio signal, wherein at least a portion of the second audio signal is a reflection of the first audio signal, in response to the detecting, determining one or more reflection characteristics, wherein each of the one or more reflection characteristics are based on at least the second audio signal, adjusting an equalization setting of the playback device based on the one or more reflection characteristics; and causing an audio track to play according to the adjusted equalization setting.

It will be understood by one of ordinary skill in the art that this disclosure includes numerous other embodiments.

II. Example Operating Environment

FIG. 1 shows an example configuration of a media playback system 100 in which one or more embodiments disclosed herein may be practiced or implemented. The media playback system 100 as shown is associated with an example home environment having several rooms and spaces, such as for example, a master bedroom, an office, a dining room, and a living room. As shown in the example of FIG. 1, the media playback system 100 includes playback devices 102-124, control devices 126 and 128, and a wired or wireless network router 130.

Further discussions relating to the different components of the example media playback system 100 and how the different components may interact to provide a user with a media experience may be found in the following sections. While discussions herein may generally refer to the example media playback system 100, technologies described herein are not limited to applications within, among other things, the home environment as shown in FIG. 1. For instance, the technologies described herein may be useful in environments where multi-zone audio may be desired, such as, for example, a commercial setting like a restaurant, mall or airport, a vehicle like a sports utility vehicle (SUV), bus or car, a ship or boat, an airplane, and so on.

a. Example Playback Devices

Figure 2:
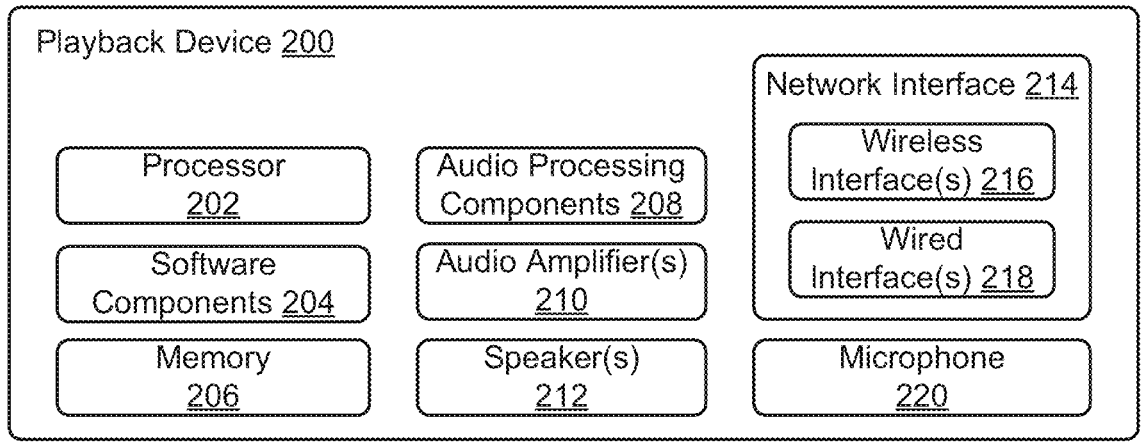
FIG. 2 shows a functional block diagram of an example playback device.

FIG. 2 shows a functional block diagram of an example playback device 200 that may be configured to be one or more of the playback devices 102-124 of the media playback system 100 of FIG. 1. The playback device 200 may include a processor 202, software components 204, memory 206, audio processing components 208, audio amplifier(s) 210, speaker(s) 212, a network interface 214 including wireless interface(s) 216 and wired interface(s) 218 and a microphone 220. In one case, the playback device 200 may not include the speaker(s) 212, but rather a speaker interface for connecting the playback device 200 to external speakers. In another case, the playback device 200 may include neither the speaker(s) 212 nor the audio amplifier(s) 210, but rather an audio interface for connecting the playback device 200 to an external audio amplifier or audio-visual receiver.

In one example, the processor 202 may be a clock-driven computing component configured to process input data according to instructions stored in the memory 206. The memory 206 may be a tangible computer-readable medium configured to store instructions executable by the processor 202. For instance, the memory 206 may be data storage that can be loaded with one or more of the software components 204 executable by the processor 202 to achieve certain functions. In one example, the functions may involve the playback device 200 retrieving audio data from an audio source or another playback device. In another example, the functions may involve the playback device 200 sending audio data to another device or playback device on a network. In yet another example, the functions may involve pairing of the playback device 200 with one or more playback devices to create a multi-channel audio environment.

Certain functions may involve the playback device 200 synchronizing playback of audio content with one or more other playback devices. During synchronous playback, a listener will preferably not be able to perceive time-delay differences between playback of the audio content by the playback device 200 and the one or more other playback devices. U.S. Pat. No. 8,234,395 entitled, "System and method for synchronizing operations among a plurality of independently clocked digital data processing devices," which is hereby incorporated by reference, provides in more detail some examples for audio playback synchronization among playback devices.

The memory 206 may further be configured to store data associated with the playback device 200, such as one or more zones and/or zone groups the playback device 200 is a part of, audio sources accessible by the playback device 200, or a playback queue that the playback device 200 (or some other playback device) may be associated with. The data may be stored as one or more state variables that are periodically updated and used to describe the state of the playback device 200. The memory 206 may also include the data associated with the state of the other devices of the media system, and shared from time to time among the devices so that one or more of the devices have the most recent data associated with the system. Other embodiments are also possible.

The audio processing components 208 may include one or more digital-to-analog converters (DAC), an audio preprocessing component, an audio enhancement component or a digital signal processor (DSP), and so on. In one embodiment, one or more of the audio processing components 208 may be a subcomponent of the processor 202. In one example, audio content may be processed and/or intentionally altered by the audio processing components 208 to produce audio signals. The produced audio signals may then be provided to the audio amplifier(s) 210 for amplification and playback through speaker(s) 212. Particularly, the audio amplifier(s) 210 may include devices configured to amplify audio signals to a level for driving one or more of the speakers 212. The speaker(s) 212 may include an individual transducer (e.g., a "driver") or a complete speaker system involving an enclosure with one or more drivers. A particular driver of the speaker(s) 212 may include, for example, a subwoofer (e.g., for low frequencies), a mid-range driver (e.g., for middle frequencies), and/or a tweeter (e.g., for high frequencies). In some cases, each transducer in the one or more speakers 212 may be driven by an individual corresponding audio amplifier of the audio amplifier(s) 210. In addition to producing analog signals for playback by the playback device 200, the audio processing components 208 may be configured to process audio content to be sent to one or more other playback devices for playback.

Audio content to be processed and/or played back by the playback device 200 may be received from an external source, such as via an audio line-in input connection (e.g., an auto-detecting 3.5 mm audio line-in connection) or the network interface 214.

The network interface 214 may be configured to facilitate a data flow between the playback device 200 and one or more other devices on a data network. As such, the playback device 200 may be configured to receive audio content over the data network from one or more other playback devices in communication with the playback device 200, network devices within a local area network, or audio content sources over a wide area network such as the Internet. In one example, the audio content and other signals transmitted and received by the playback device 200 may be transmitted in the form of digital packet data containing an Internet Protocol (IP)-based source address and IP-based destination addresses. In such a case, the network interface 214 may be configured to parse the digital packet data such that the data destined for the playback device 200 is properly received and processed by the playback device 200.

As shown, the network interface 214 may include wireless interface(s) 216 and wired interface(s) 218. The wireless interface(s) 216 may provide network interface functions for the playback device 200 to wirelessly communicate with other devices (e.g., other playback device(s), speaker(s), receiver(s), network device(s), control device(s) within a data network the playback device 200 is associated with) in accordance with a communication protocol (e.g., any wireless standard including IEEE 802.11a, 802.11b, 802.11g, 802.11n, 802.11ac, 802.15, 4G mobile communication standard, and so on). The wired interface(s) 218 may provide network interface functions for the playback device 200 to communicate over a wired connection with other devices in accordance with a communication protocol (e.g., IEEE 802.3). While the network interface 214 shown in FIG. 2 includes both wireless interface(s) 216 and wired interface(s) 218, the network interface 214 may in some embodiments include only wireless interface(s) or only wired interface(s).

The microphone 220 may be arranged to detect sound in the environment of the playback device 200. For instance, the microphone may be mounted on an exterior wall of a housing of the playback device. The microphone may be any type of microphone now known or later developed such as a condenser microphone, electret condenser microphone, or a dynamic microphone. The microphone may be sensitive to a portion of the frequency range of the speaker(s) 220. One or more of the speaker(s) 220 may operate in reverse as the microphone 220.

In one example, the playback device 200 and one other playback device may be paired to play two separate audio components of audio content. For instance, playback device 200 may be configured to play a left channel audio component, while the other playback device may be configured to play a right channel audio component, thereby producing or enhancing a stereo effect of the audio content. The paired playback devices (also referred to as "bonded playback devices") may further play audio content in synchrony with other playback devices.

In another example, the playback device 200 may be sonically consolidated with one or more other playback devices to form a single, consolidated playback device. A consolidated playback device may be configured to process and reproduce sound differently than an unconsolidated playback device or playback devices that are paired, because a consolidated playback device may have additional speaker drivers through which audio content may be rendered. For instance, if the playback device 200 is a playback device designed to render low frequency range audio content (i.e. a subwoofer), the playback device 200 may be consolidated with a playback device designed to render full frequency range audio content. In such a case, the full frequency range playback device, when consolidated with the low frequency playback device 200, may be configured to render only the mid and high frequency components of audio content, while the low frequency range playback device 200 renders the low frequency component of the audio content. The consolidated playback device may further be paired with a single playback device or yet another consolidated playback device.

By way of illustration, SONOS, Inc. presently offers (or has offered) for sale certain playback devices including a "PLAY:1," "PLAY:3," "PLAY:5," "PLAYBAR," "CONNECT:AMP," "CONNECT," and "SUB." Any other past, present, and/or future playback devices may additionally or alternatively be used to implement the playback devices of example embodiments disclosed herein. Additionally, it is understood that a playback device is not limited to the example illustrated in FIG. 2 or to the SONOS product offerings. For example, a playback device may include a wired or wireless headphone. In another example, a playback device may include or interact with a docking station for personal mobile media playback devices. In yet another example, a playback device may be integral to another device or component such as a television, a lighting fixture, or some other device for indoor or outdoor use.

b. Example Playback Zone Configurations

Referring back to the media playback system 100 of FIG. 1, the environment may have one or more playback zones, each with one or more playback devices. The media playback system 100 may be established with one or more playback zones, after which one or more zones may be added, or removed to arrive at the example configuration shown in FIG. 1. Each zone may be given a name according to a different room or space such as an office, bathroom, master bedroom, bedroom, kitchen, dining room, living room, and/or balcony. In one case, a single playback zone may include multiple rooms or spaces. In another case, a single room or space may include multiple playback zones.

As shown in FIG. 1, the balcony, dining room, kitchen, bathroom, office, and bedroom zones each have one playback device, while the living room and master bedroom zones each have multiple playback devices. In the living room zone, playback devices 104, 106, 108, and 110 may be configured to play audio content in synchrony as individual playback devices, as one or more bonded playback devices, as one or more consolidated playback devices, or any combination thereof. Similarly, in the case of the master bedroom, playback devices 122 and 124 may be configured to play audio content in synchrony as individual playback devices, as a bonded playback device, or as a consolidated playback device.

In one example, one or more playback zones in the environment of FIG. 1 may each be playing different audio content. For instance, the user may be grilling in the balcony zone and listening to hip hop music being played by the playback device 102 while another user may be preparing food in the kitchen zone and listening to classical music being played by the playback device 114. In another example, a playback zone may play the same audio content in synchrony with another playback zone. For instance, the user may be in the office zone where the playback device 118 is playing the same rock music that is being playing by playback device 102 in the balcony zone. In such a case, playback devices 102 and 118 may be playing the rock music in synchrony such that the user may seamlessly (or at least substantially seamlessly) enjoy the audio content that is being played out-loud while moving between different playback zones. Synchronization among playback zones may be achieved in a manner similar to that of synchronization among playback devices, as described in previously referenced U.S. Pat. No. 8,234,395.

As suggested above, the zone configurations of the media playback system 100 may be dynamically modified, and in some embodiments, the media playback system 100 supports numerous configurations. For instance, if a user physically moves one or more playback devices to or from a zone, the media playback system 100 may be reconfigured to accommodate the change(s). For instance, if the user physically moves the playback device 102 from the balcony zone to the office zone, the office zone may now include both the playback device 118 and the playback device 102. The playback device 102 may be paired or grouped with the office zone and/or renamed if so desired via a control device such as the control devices 126 and 128. On the other hand, if the one or more playback devices are moved to a particular area in the home environment that is not already a playback zone, a new playback zone may be created for the particular area.

Further, different playback zones of the media playback system 100 may be dynamically combined into zone groups or split up into individual playback zones. For instance, the dining room zone and the kitchen zone 114 may be combined into a zone group for a dinner party such that playback devices 112 and 114 may render audio content in synchrony. On the other hand, the living room zone may be split into a television zone including playback device 104, and a listening zone including playback devices 106, 108, and 110, if the user wishes to listen to music in the living room space while another user wishes to watch television.

c. Example Control Devices

Figure 3:
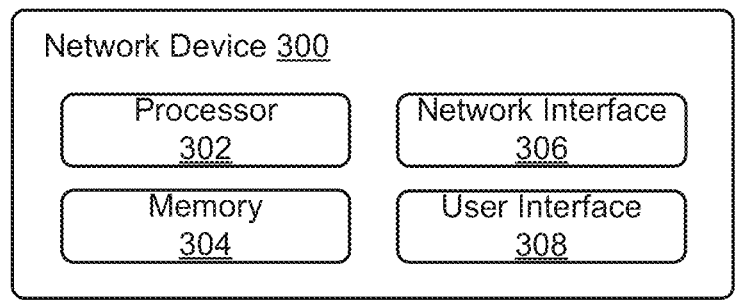
FIG. 3 shows a functional block diagram of an example control device.

FIG. 3 shows a functional block diagram of an example control device 300 that may be configured to be one or both of the control devices 126 and 128 of the media playback system 100. As shown, the control device 300 may include a processor 302, memory 304, a network interface 306, and a user interface 308. In one example, the control device 300 may be a dedicated controller for the media playback system 100. In another example, the control device 300 may be a network device on which media playback system controller application software may be installed, such as for example, an iPhone™, iPad™ or any other smart phone, tablet or network device (e.g., a networked computer such as a PC or Mac™).

The processor 302 may be configured to perform functions relevant to facilitating user access, control, and configuration of the media playback system 100. The memory 304 may be configured to store instructions executable by the processor 302 to perform those functions. The memory 304 may also be configured to store the media playback system controller application software and other data associated with the media playback system 100 and the user.

In one example, the network interface 306 may be based on an industry standard (e.g., infrared, radio, wired standards including IEEE 802.3, wireless standards including IEEE 802.11a, 802.11b, 802.11g, 802.11n, 802.11ac, 802.15, 4G mobile communication standard, and so on). The network interface 306 may provide a means for the control device 300 to communicate with other devices in the media playback system 100. In one example, data and information (e.g., such as a state variable) may be communicated between control device 300 and other devices via the network interface 306. For instance, playback zone and zone group configurations in the media playback system 100 may be received by the control device 300 from a playback device or another network device, or transmitted by the control device 300 to another playback device or network device via the network interface 306. In some cases, the other network device may be another control device.

Playback device control commands such as volume control and audio playback control may also be communicated from the control device 300 to a playback device via the network interface 306. As suggested above, changes to configurations of the media playback system 100 may also be performed by a user using the control device 300. The configuration changes may include adding/removing one or more playback devices to/from a zone, adding/removing one or more zones to/from a zone group, forming a bonded or consolidated player, separating one or more playback devices from a bonded or consolidated player, among others. Accordingly, the control device 300 may sometimes be referred to as a controller, whether the control device 300 is a dedicated controller or a network device on which media playback system controller application software is installed.

Figure 4:
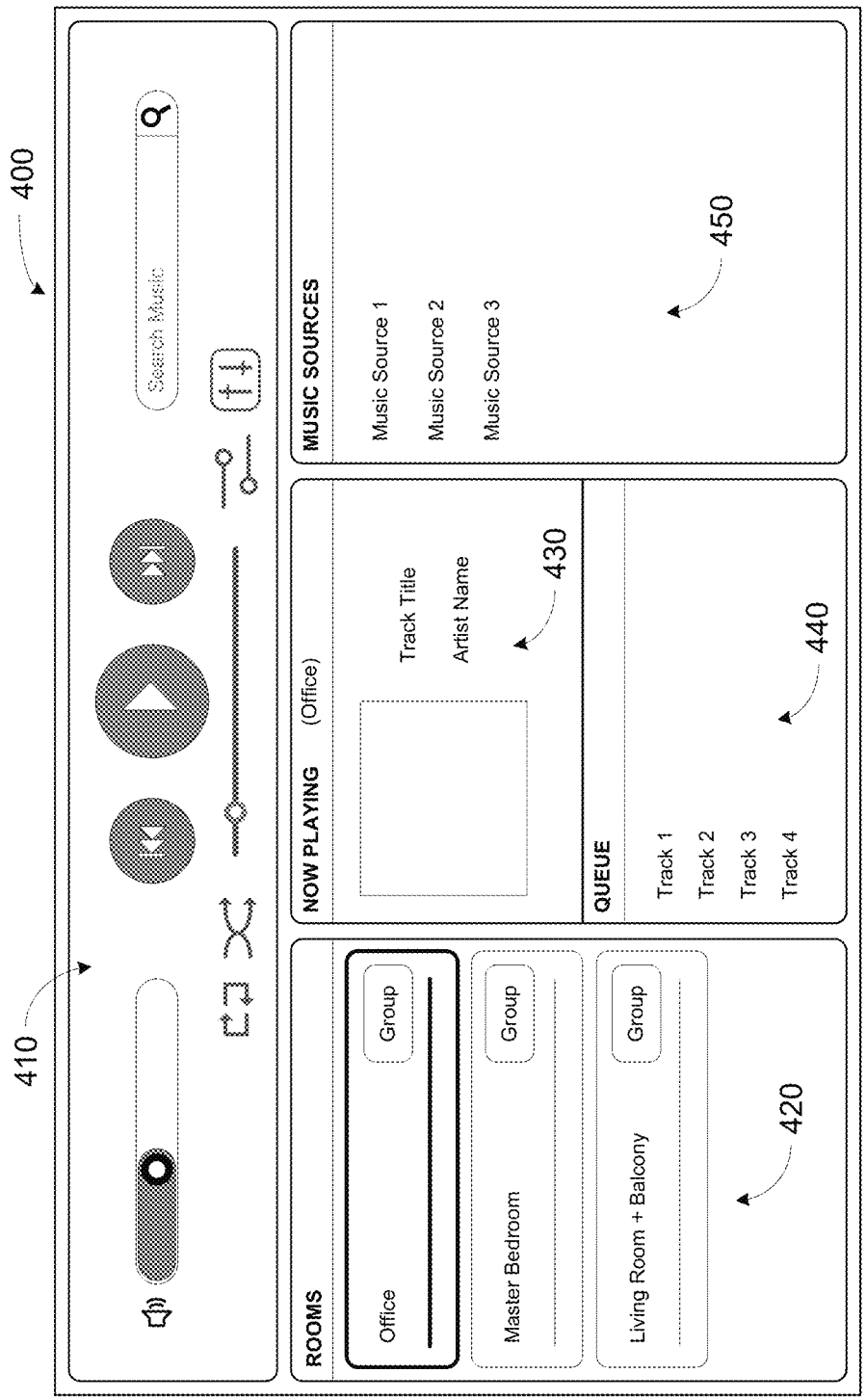
FIG. 4 shows an example controller interface.

The user interface 308 of the control device 300 may be configured to facilitate user access and control of the media playback system 100, by providing a controller interface such as the controller interface 400 shown in FIG. 4. The controller interface 400 includes a playback control region 410, a playback zone region 420, a playback status region 430, a playback queue region 440, and an audio content sources region 450. The user interface 400 as shown is just one example of a user interface that may be provided on a network device such as the control device 300 of FIG. 3 (and/or the control devices 126 and 128 of FIG. 1) and accessed by users to control a media playback system such as the media playback system 100. Other user interfaces of varying formats, styles, and interactive sequences may alternatively be implemented on one or more network devices to provide comparable control access to a media playback system.

The playback control region 410 may include selectable (e.g., by way of touch or by using a cursor) icons to cause playback devices in a selected playback zone or zone group to play or pause, fast forward, rewind, skip to next, skip to previous, enter/exit shuffle mode, enter/exit repeat mode, enter/exit cross fade mode. The playback control region 410 may also include selectable icons to modify equalization settings, and playback volume, among other possibilities.

The playback zone region 420 may include representations of playback zones within the media playback system 100. In some embodiments, the graphical representations of playback zones may be selectable to bring up additional selectable icons to manage or configure the playback zones in the media playback system, such as a creation of bonded zones, creation of zone groups, separation of zone groups, and renaming of zone groups, among other possibilities.

For example, as shown, a "group" icon may be provided within each of the graphical representations of playback zones. The "group" icon provided within a graphical representation of a particular zone may be selectable to bring up options to select one or more other zones in the media playback system to be grouped with the particular zone. Once grouped, playback devices in the zones that have been grouped with the particular zone will be configured to play audio content in synchrony with the playback device(s) in the particular zone. Analogously, a "group" icon may be provided within a graphical representation of a zone group. In this case, the "group" icon may be selectable to bring up options to deselect one or more zones in the zone group to be removed from the zone group. Other interactions and implementations for grouping and ungrouping zones via a user interface such as the user interface 400 are also possible. The representations of playback zones in the playback zone region 420 may be dynamically updated as playback zone or zone group configurations are modified.

The playback status region 430 may include graphical representations of audio content that is presently being played, previously played, or scheduled to play next in the selected playback zone or zone group. The selected playback zone or zone group may be visually distinguished on the user interface, such as within the playback zone region 420 and/or the playback status region 430. The graphical representations may include track title, artist name, album name, album year, track length, and other relevant information that may be useful for the user to know when controlling the media playback system via the user interface 400.

The playback queue region 440 may include graphical representations of audio content in a playback queue associated with the selected playback zone or zone group. In some embodiments, each playback zone or zone group may be associated with a playback queue containing information corresponding to zero or more audio items for playback by the playback zone or zone group. For instance, each audio item in the playback queue may comprise a uniform resource identifier (URI), a uniform resource locator (URL) or some other identifier that may be used by a playback device in the playback zone or zone group to find and/or retrieve the audio item from a local audio content source or a networked audio content source, possibly for playback by the playback device.

In one example, a playlist may be added to a playback queue, in which case information corresponding to each audio item in the playlist may be added to the playback queue. In another example, audio items in a playback queue may be saved as a playlist. In a further example, a playback queue may be empty, or populated but "not in use" when the playback zone or zone group is playing continuously streaming audio content, such as Internet radio that may continue to play until otherwise stopped, rather than discrete audio items that have playback durations. In an alternative embodiment, a playback queue can include Internet radio and/or other streaming audio content items and be "in use" when the playback zone or zone group is playing those items. Other examples are also possible.

When playback zones or zone groups are "grouped" or "ungrouped," playback queues associated with the affected playback zones or zone groups may be cleared or re-associated. For example, if a first playback zone including a first playback queue is grouped with a second playback zone including a second playback queue, the established zone group may have an associated playback queue that is initially empty, that contains audio items from the first playback queue (such as if the second playback zone was added to the first playback zone), that contains audio items from the second playback queue (such as if the first playback zone was added to the second playback zone), or a combination of audio items from both the first and second playback queues. Subsequently, if the established zone group is ungrouped, the resulting first playback zone may be re-associated with the previous first playback queue, or be associated with a new playback queue that is empty or contains audio items from the playback queue associated with the established zone group before the established zone group was ungrouped. Similarly, the resulting second playback zone may be re-associated with the previous second playback queue, or be associated with a new playback queue that is empty, or contains audio items from the playback queue associated with the established zone group before the established zone group was ungrouped. Other examples are also possible.

Referring back to the user interface 400 of FIG. 4, the graphical representations of audio content in the playback queue region 440 may include track titles, artist names, track lengths, and other relevant information associated with the audio content in the playback queue. In one example, graphical representations of audio content may be selectable to bring up additional selectable icons to manage and/or manipulate the playback queue and/or audio content represented in the playback queue. For instance, a represented audio content may be removed from the playback queue, moved to a different position within the playback queue, or selected to be played immediately, or after any currently playing audio content, among other possibilities. A playback queue associated with a playback zone or zone group may be stored in a memory on one or more playback devices in the playback zone or zone group, on a playback device that is not in the playback zone or zone group, and/or some other designated device.

The audio content sources region 450 may include graphical representations of selectable audio content sources from which audio content may be retrieved and played by the selected playback zone or zone group. Discussions pertaining to audio content sources may be found in the following section.

d. Example Audio Content Sources

As indicated previously, one or more playback devices in a zone or zone group may be configured to retrieve for playback audio content (e.g. according to a corresponding URI or URL for the audio content) from a variety of available audio content sources. In one example, audio content may be retrieved by a playback device directly from a corresponding audio content source (e.g., a line-in connection). In another example, audio content may be provided to a playback device over a network via one or more other playback devices or network devices.

Example audio content sources may include a memory of one or more playback devices in a media playback system such as the media playback system 100 of FIG. 1, local music libraries on one or more network devices (such as a control device, a network-enabled personal computer, or a networked-attached storage (NAS), for example), streaming audio services providing audio content via the Internet (e.g., the cloud), or audio sources connected to the media playback system via a line-in input connection on a playback device or network devise, among other possibilities.

In some embodiments, audio content sources may be regularly added or removed from a media playback system such as the media playback system 100 of FIG. 1. In one example, an indexing of audio items may be performed whenever one or more audio content sources are added, removed or updated. Indexing of audio items may involve scanning for identifiable audio items in all folders/directory shared over a network accessible by playback devices in the media playback system, and generating or updating an audio content database containing metadata (e.g., title, artist, album, track length, among others) and other associated information, such as a URI or URL for each identifiable audio item found. Other examples for managing and maintaining audio content sources may also be possible.

The above discussions relating to playback devices, controller devices, playback zone configurations, and media content sources provide only some examples of operating environments within which functions and methods described below may be implemented. Other operating environments and configurations of media playback systems, playback devices, and network devices not explicitly described herein may also be applicable and suitable for implementation of the functions and methods.

III. Example Method For Adjusting Equalization Based on Environment

As discussed above, embodiments described herein may involve dynamically adjusting the equalization of a playback device based on the environment in which the playback device is operating.

Figure 5:
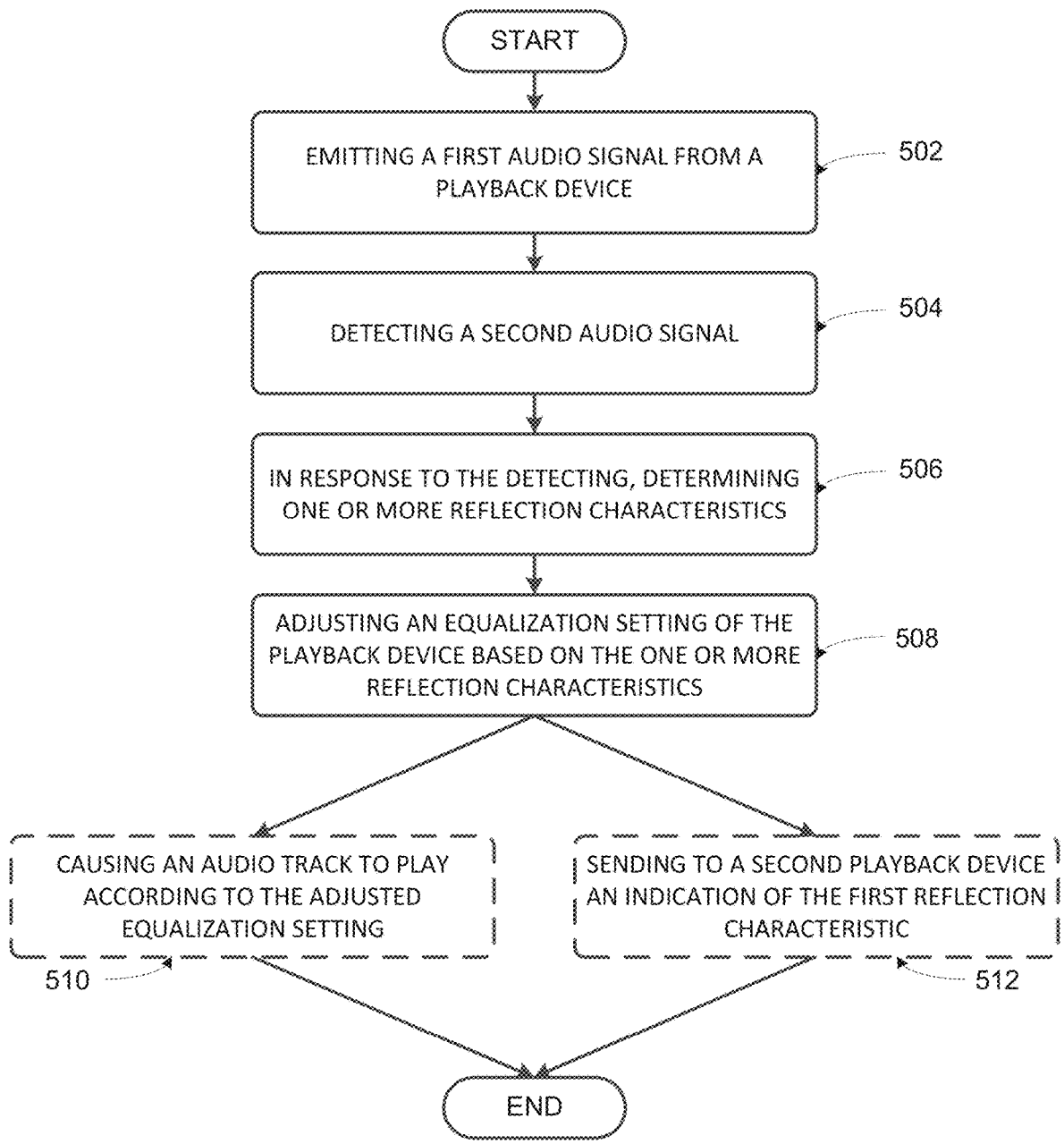
FIG. 5 shows an example flow diagram for dynamically adjusting the equalization of a playback device based on the environment in which the playback device is operating.

Method 500 shown in FIG. 5 presents an embodiment of a method that can be implemented within an operating environment involving, for example, the media playback system 100 of FIG. 1, one or more of the playback device 200 of FIG. 2, and one or more of the control device 300 of FIG. 3. Method 500 may include one or more operations, functions, or actions as illustrated by one or more of blocks 502-510. Although the blocks are illustrated in sequential order, these blocks may also be performed in parallel, and/or in a different order than those described herein. Also, the various blocks may be combined into fewer blocks, divided into additional blocks, and/or removed based upon the desired implementation.

In addition, for the method 500 and other processes and methods disclosed herein, the flowchart shows functionality and operation of one possible implementation of present embodiments. In this regard, each block may represent a module, a segment, or a portion of program code, which includes one or more instructions executable by a processor for implementing specific logical functions or steps in the process. The program code may be stored on any type of computer readable medium, for example, such as a storage device including a disk or hard drive. The computer readable medium may include non-transitory computer readable medium, for example, such as computer-readable media that stores data for short periods of time like register memory, processor cache and Random Access Memory (RAM). The computer readable medium may also include non-transitory media, such as secondary or persistent long term storage, like read only memory (ROM), optical or magnetic disks, compact-disc read only memory (CD-ROM), for example. The computer readable media may also be any other volatile or non-volatile storage systems. The computer readable medium may be considered a computer readable storage medium, for example, or a tangible storage device. In addition, for the method 500 and other processes and methods disclosed herein, each block in FIG. 5 may represent circuitry that is wired to perform the specific logical functions in the process.

a. Emitting a First Audio Signal from a Playback Device.

At block 502, the playback device emits a first audio signal from the playback device. For instance, playback device 200 of FIG. 2 may output the first audio signal from speaker(s) 212.

The first audio signal may take a variety of different forms. For instance, the first audio signal may include a pulse. Such a pulse may be a recording of a brief audio pulse that approximates an audio impulse signal. Some examples include recordings of an electric spark, a starter pistol shot, or the bursting of a balloon. In some examples, the first audio signal may include a signal that varies over frequency, such as a logarithmic chirp, a sine sweep, a pink noise signal, or a maximum length sequence. Such signals may be chosen for relatively broader-range coverage of the frequency spectrum or for other reasons. The first audio signal may involve other types of audio signals as well.

The first audio signal may have a particular waveform. For instance, the waveform may correspond to any of these example audio signals described above, such as, an electric spark, a starter pistol shot, or the bursting of a balloon. Such a waveform may be represented digitally, such as in an array of data points (i.e. samples) representing the changes in sound pressure over time. The waveform of the first audio signal may be referred to as the first waveform.

The playback device may store the first audio signal as a recording. Then, when emitting the first audio signal, the playback device may playback the recording. The recording may take a variety of audio file formats, such as a waveform audio file format (WAV) or an MPEG-2 audio layer III (MP3), among other examples.

Alternatively, the playback device may dynamically generate the first audio signal. For instance, the playback device may generate a signal that varies over frequency according to a mathematical equation. Other examples are possible as well.

The playback device may emit the first audio signal at a particular sound pressure level (i.e. magnitude). The particular sound pressure level may reflect the peak magnitude of the first audio signal. For instance, the playback device may emit a pulse signal having a peak magnitude of 60 dB (with reference to 20 µPa). The sound pressure level may be configurable. For instance, user input to playback device 200 (or a controller thereof, such as network device 300) may configure the sound pressure of the first audio signal at a particular sound pressure level. Alternatively, the sound pressure level may be pre-determined.

The playback device may emit the first audio signal in response to a trigger. Further, the trigger may cause the playback device to carry out additional functions of the present method. For instance, user input to playback device 200 (or a controller thereof, such as network device 300) may trigger playback device 200 to carry out the present method to adjust the equalization of the playback device. As another example, movement of the playback device (i.e. a change of positioning or in location) may trigger the playback device 200 to carry out the present method. The playback device may detect such a movement via an accelerometer. Other types of triggers are possible as well.

As described above, the playback device may be arranged as part of a media playback system that may include a plurality of playback devices. Each playback device of the media playback system may emit a respective first audio signal. Further, each playback device may perform one or more of the functions described below. For instance, each playback device may emit a respective first audio signal, detect a respective second audio signal, determine one or more respective reflection characteristics, adjust an equalization setting, and cause an audio track to play.

In one instance, a media playback system may include a first playback device and a second playback device. The first playback device may emit the first audio signal and then detect the second audio signal (as discussed below). In addition, the second playback device may emit a third audio signal. The third audio signal may take a variety of forms, including, for instance, any of the example audio signals described above in relation to the first audio signal. In some embodiments, the second playback device may emit the third audio signal in response to receiving an instruction, from the first playback device, to emit the third audio signal. Alternatively, the second playback device may receive the instruction from a controller. Other examples are possible as well.

b. Detecting, by the Playback Device, a Second Audio Signal.

At block 504, the playback device detects, by a microphone, a second audio signal. A portion of the second audio signal may be a reflection of the first audio signal. For instance, playback device 200 may emit the first audio signal, the first audio signal may reflect off of one or more objects (collectively these reflections may be referred to as reverberation), and microphone 220 may detect these reflections as the second audio signal. Another portion of the second audio signal may be a direct propagation of the first audio signal.

The microphone may be communicatively coupled to the processor. For instance, microphone 220 may be coupled to an analog input of processor 202 of playback device 200. Alternatively, microphone 220 may be coupled to an analog-to-digital converter that is coupled, in turn, to processor 202. Other arrangements are possible as well.

Detecting the second audio signal may involve recording the second audio signal. For instance, processor 202 may record the second audio signal and then store the second audio signal in memory 206. Processor 202 may begin recording when the speaker emits the first audio signal. Alternatively, processor 202 may begin recording before or after the speaker emits the first audio signal such that reflections of the first audio signal may be detected by the microphone. The recording may be represented digitally, such as in an array of data points (i.e. samples) representing the changes in sound pressure over time. Further, the second audio signal may have a waveform that may be referred to as the second waveform.

In some circumstances, the second audio signal may include environmental noise. In some circumstances, significant environmental noise within the second audio signal may interfere with or otherwise affect determining the one or more reflection characteristics. For instance, environmental noise may mask or degrade the first audio signal, which may cause the playback device to determine one or more reflection characteristics that may not accurately reflect the environment because of the degradation caused by the environmental noise. Further, in some circumstances, an aspect of the environmental noise may be incorrectly detected as the first audio signal. While the second audio signal may include, as one portion, some background noise, the intention is that at least a portion of the second audio signal is the reflection of the first audio signal.

Accordingly, to reduce the possible effects of environmental noise, detecting the second audio signal may involve determining that the portion of the second audio signal is the reflection of the first audio signal based on the first waveform and the second waveform. For instance, the processor 202 may determine a difference between the first waveform and the second waveform by comparing the two waveforms. The playback device may then determine that the difference is less than a threshold which may indicate that the portion of the second audio signal is the reflection of the first audio signal. The threshold may be set such that a particular degree of similarity between the first waveform and the second waveform indicates that the portion of the second audio signal is a reflection of the first audio signal. Alternatively, several characteristics of the first waveform, such as the magnitude and duration, may be predetermined. The playback device may determine the same characteristics of the second waveform and compare the characteristics to determine that the portion of the second audio signal is the reflection of the first audio signal. As another example, the playback device may perform a deconvolution determination using the first audio signal and the second audio signal. Some embodiments may involve repeating the process described herein to reduce any effect caused by noise in a particular iteration.

The processor may determine the sound pressure level (i.e. magnitude) of the second audio signal. The sound pressure level of the second audio signal may be determined at each point along the waveform of the second audio signal or the sound pressure level may be determined at a subset of points, such as at the point having peak magnitude. For instance, the processor may determine that the second audio signal has a peak magnitude of 50 dB.

In some embodiments, the speaker and microphone may be physically coupled. For instance, a housing may contain both the speaker and the microphone. Further, the housing may additionally contain one or more other components of the playback device, such as a processor, a memory, a network interface, an audio amplifier(s), and/or various audio processing components. Therefore, in one embodiment, playback device 200 may include, within the same housing, processor 202, software components 204, memory 206, audio processing components 208, audio amplifier(s) 210, speaker(s) 212, a network interface 214 including wireless interface(s) 216 and wired interface(s) 218 and a microphone 220. The housing may be a speaker cabinet. Other arrangements are possible as well.

As noted above, in some embodiments, the playback device may be arranged as part of a media playback system that includes two or more playback devices. In such embodiments, the playback device may detect audio signals emitted by other playback devices (as an alternative to or in addition to detecting the second audio signal). Referring to the example media playback system above that includes the first playback device and the second playback device, after the second playback device emits a third audio signal, the first playback device may detect the third audio signal and/or reflections thereof as a fourth audio signal. In some embodiments, the first playback device may then determine that at least a portion of the fourth audio signal is the third audio signal (or a reflection thereof) using, for example, any of the techniques described above.

Detecting audio signals emitted by other playback devices may include functions similar to those of detecting the second audio signal. Further, devices within the media playback system may exchange messages to coordinate the functions described herein. For instance, as noted above, a first playback device may trigger a second playback device to emit a third audio signal. As another example, the second playback device may send an indication of the third audio signal to the first playback device. The indication may assist the first playback device in determining that a portion of the fourth audio signal is the third audio signal (or a reflection thereof), for example. Alternatively, receiving the indication may trigger the first playback device to start listening for an audio signal from the second playback device.

In some embodiments, the first media playback may detect a plurality of audio signals. For instance, the plurality of audio signals may include a reflection of a signal emitted by the first playback device. The plurality of audio signals may also include signals (or reflections thereof) emitted by other playback devices within the media playback system. Other examples are possible as well.

c. Determining One or More Reflection Characteristics.

At block 506, the playback device determines one or more reflection characteristics. Each of the one or more reflection characteristics may indicate an aspect of the environment surrounding the playback device. For instance, one reflection characteristic may indicate that the playback device is inside, or that the playback device is outside. The reflection characteristic may also indicate a relative size of the room that the playback device is currently located within. Another reflection characteristic may indicate the amount of sound absorbing material in the environment. A third reflection characteristic may indicate one or more resonant frequencies of the environment. Many examples are possible.

In some embodiments, each of the one or more reflection characteristics may be based on at least the second audio signal. For instance, the processor 202 may determine one or more reflection characteristics based on the recording of the second audio signal. The one or more reflection characteristics may be further based on the first audio signal such as in a comparison of the second audio signal to the first audio signal.

One of the one or more reflection characteristics may be an amount of time elapsed from emitting the first audio signal to detecting the second audio signal. For instance, the processor 202 may assign to the first audio signal a first timestamp at the time of emitting the first audio signal and may further assign to the second audio signal a second time stamp at the time of detecting the second audio signal. The processor 202 may then determine a difference between the second time stamp and the first time stamp. Since each of the first audio signal and the second audio signal may be emitted and detected, respectively, over a duration of time, the time stamp may be assigned to a particular point in each of the first audio signal and the second audio signal. For instance, the time stamp may be assigned to the respective peaks of the first and second audio signals.

The reflection characteristic may be a qualitative characteristic. For instance, the qualitative characteristic may describe different types of operating environments, such as a "small room," a "large room," or "outdoors." The qualitative characteristic may be based upon a quantitative value, such as an amount of time elapsed from emitting the first signal to detecting the second audio signal. For example, the playback device may determine the qualitative characteristic (e.g. "small room," "large room," or "outdoors") based on a range of values for the amount of time elapsed from emitting the first signal. For example, an amount of time elapsed from emitting the first signal to detecting the second audio signal of 15-20 milliseconds (ms) may indicate a "small room," 20-30 ms may indicate a "large room," and an amount of time greater than 30 ms may indicate "outdoors."

The qualitative characteristics may describe additional features of the room. For instance, the qualitative characteristic may describe a number of objects within the room. Alternatively, the qualitative characteristic may further describe the shape of the room. For example, a qualitative characteristic may indicate "high ceilings" in a "small room" or that the room is relatively much longer than it is wide (i.e. the room is long and narrow).

One or more of the reflection characteristics may relate to a frequency response of a system that includes the playback device and the environment surrounding the playback device. Such a frequency response may be determined based on the emitted first audio signal and detected second audio signal. In particular, the first audio signal (i.e. the stimulus) may excite the system. The detected second audio signal then represents the response of the system in the time domain. The playback device may then determine the frequency response by transforming the time domain response to the frequency domain, such as by determining a Laplace transform on the second audio signal, or the portion thereof that is a reflection of the first audio signal. In some embodiments, determining the Laplace transform may involve determining, by the processor 202, a fast Fourier transform (FFT), such as when the second audio signal is represented as discrete data points. While the FFT is provided by way of example, alternative transformations, such as a Hilbert transform, may be determined as well.

The determined frequency response of the system may indicate aspects of the environment. For instance, the processor 202 may determine that the bass frequencies within the frequency response are attenuated relative to the mid and/or treble frequencies, which may indicate that the playback device is outdoors. As another example, the processor 202 may determine that the frequency response has one or more resonant frequencies (which may be caused by the room or objects therein), which may be indicated by one or more peaks and/or one or more valleys. In addition, the number of peaks and valleys may indicate a degree of irregularity of the environment (i.e. a number of objects within the environment and/or an irregularity of the arrangement of the walls).

Within examples, one of the one or more reflection characteristics may relate to a variance between the frequency response of the system and an "ideal" frequency response of the playback device. For instance, the reflection characteristic may be a difference between the "ideal" frequency response and the frequency response of the system. In some embodiments, the reflection characteristic may be a difference between the ideal frequency response and the current frequency response at a particular frequency range, such as bass, mid, or treble frequencies.

Determining the difference between the "ideal" frequency response and the current frequency response may involve, for each frequency response, integrating the respective frequency response over frequency for a portion of the frequency range. For instance, the processor 202 may integrate each frequency response over bass frequencies (e.g. 16 to 512 Hz). The processor 202 may then determine a difference between the integrated frequencies.

The "ideal" frequency response may be a frequency response of the playback device in a particular configuration. Further, the ideal frequency response may not be truly ideal, but rather an approximation of a playback device that is operating as designed. For instance, the "ideal" frequency response may be a frequency response of the playback device as determined in open space. Alternatively, the "ideal" frequency response may be a frequency response determined in an anechoic chamber. Further, the "ideal" frequency response of the playback device may be an approximation of a factory configured frequency response. For instance, the "ideal" frequency response may be a typical or average frequency response of playback devices of a particular type produced by a manufacturer.

In another embodiment, the playback device may determine the "ideal" frequency response as an aspect of a set-up procedure. For example, during the set-up procedure, a user of the playback device may be instructed to place the playback device in a particular arrangement so that the playback device may determine a frequency response. The particular arrangement may be, for instance, in the center of a room, among other examples.

Figure 7:
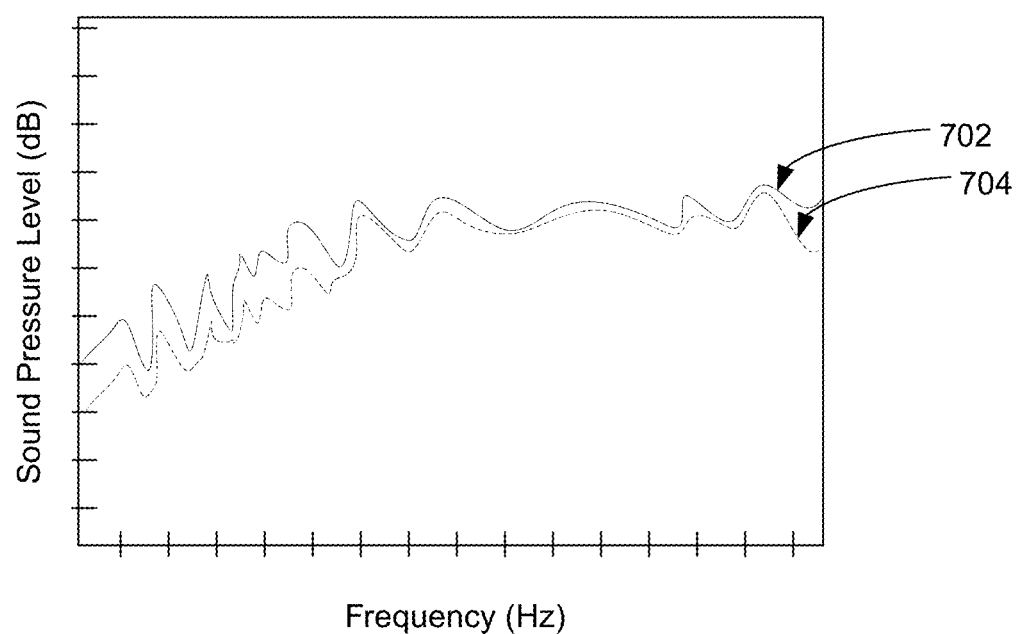
FIG. 7 shows illustrative frequency responses of the playback device.

FIG. 7 shows an illustrative plot of a frequency response of a playback device in a small room. Frequency response 702 shows the frequency response without an adjusted equalization setting. In a small room, the frequency response tends to have more peaks and valleys at bass frequencies, as shown, because bass frequencies may resonate more in a smaller room. Frequency response 704 shows the frequency response after an equalization setting for the small room has been applied. Compared to frequency response 702, the peaks and valleys are attenuated in frequency response 704, as shown.

One or more of the reflection characteristics may relate to an impulse response. For instance, an impulse response may indicate one or more reflections of the first audio signal. The impulse response may also indicate characteristics of the reflections, such as an amount of time elapsed between two reflections.

Figure 8A:
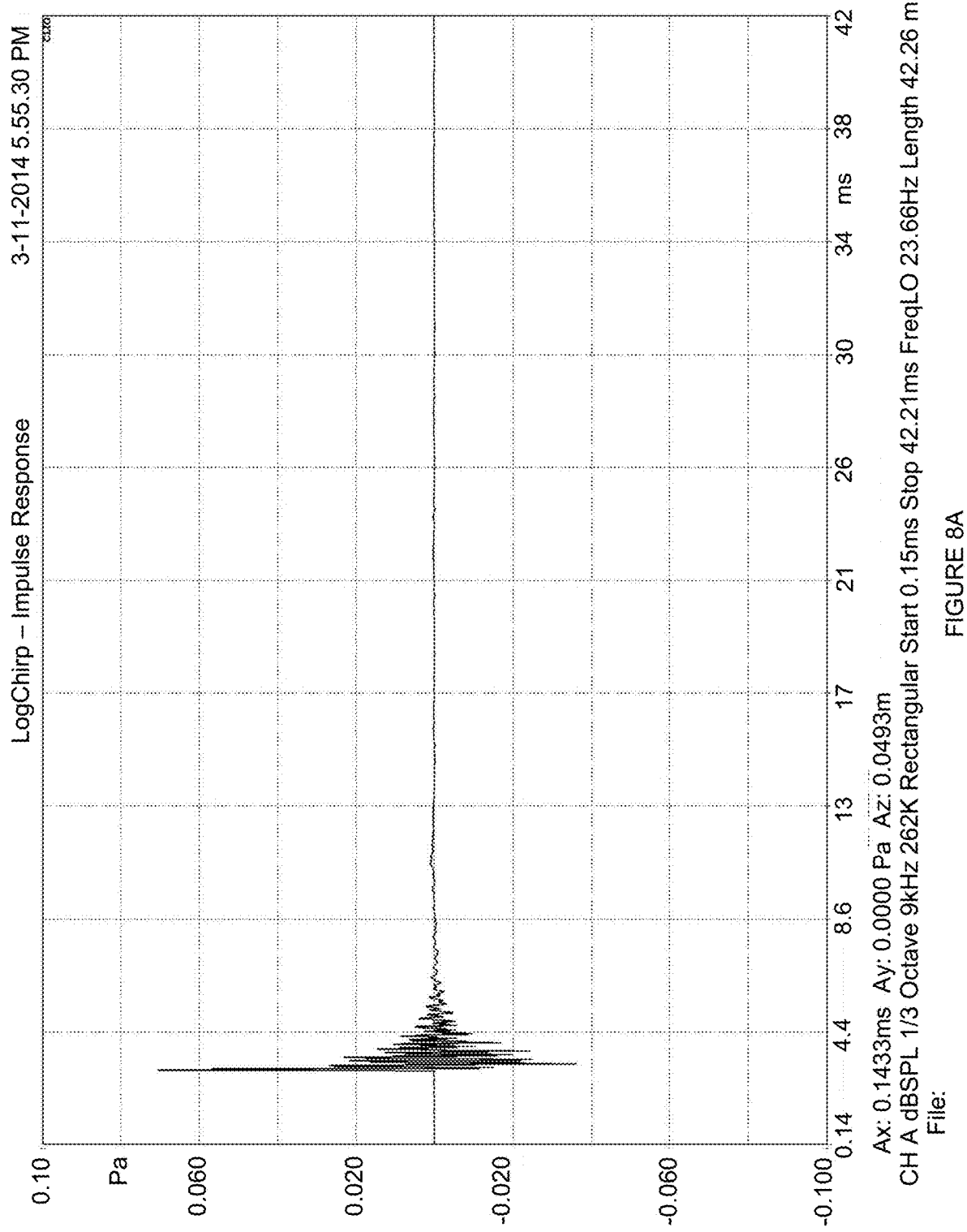
FIGS. 8A, 8B, and 8C show example impulse responses of a playback device.
Figure 8B:
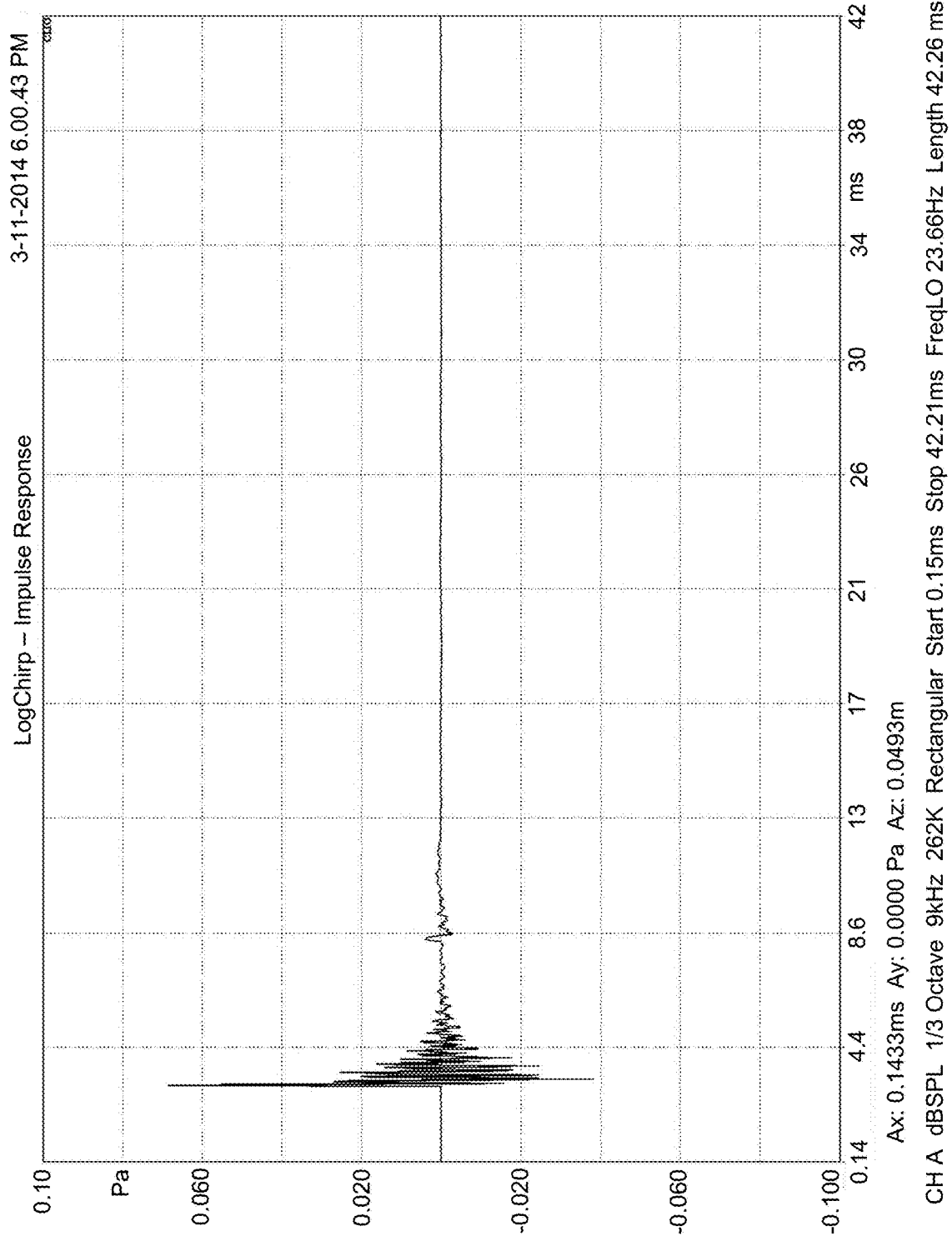
Figure 8C:
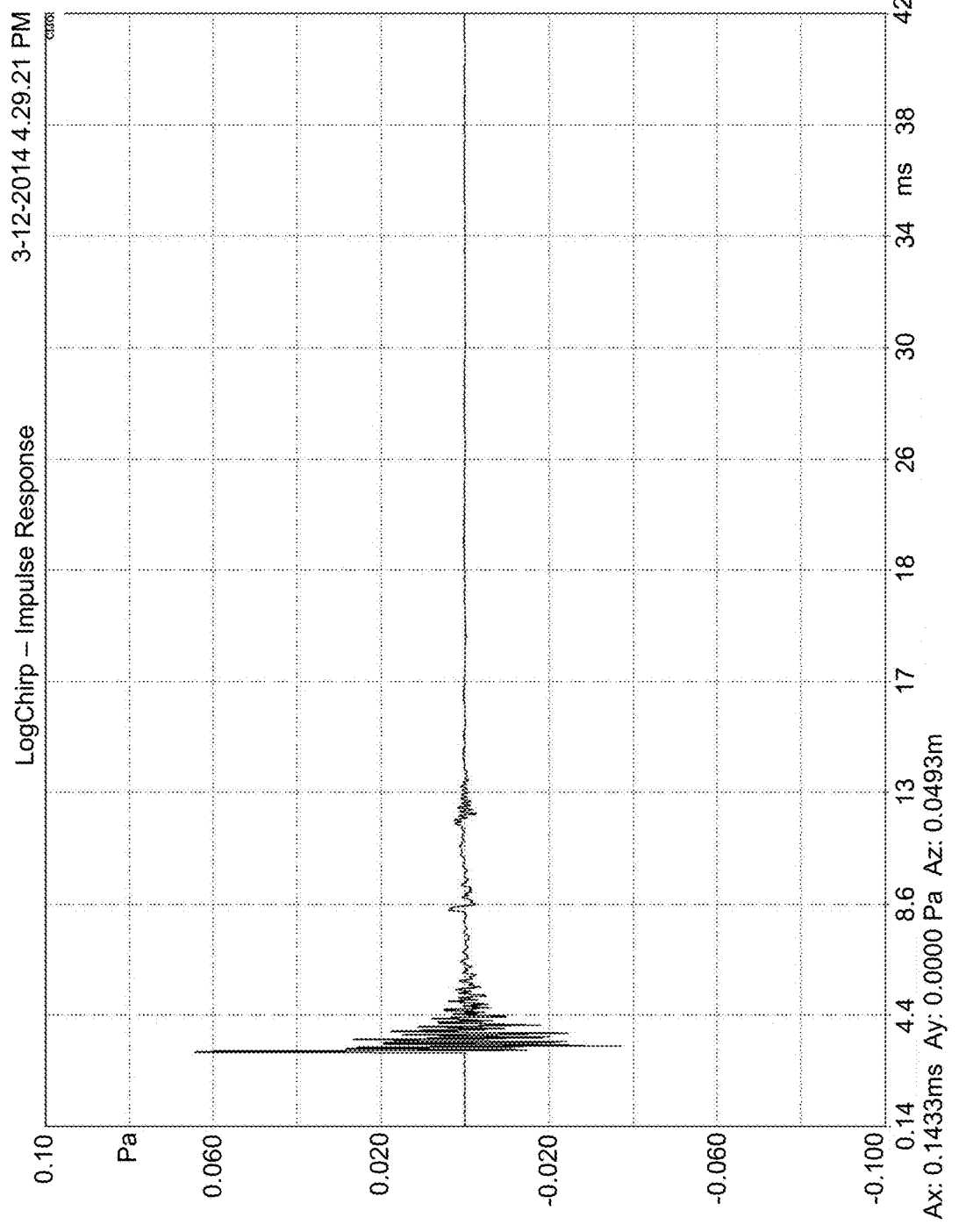

FIGS. 8A-8C show example impulse responses of a playback device. FIG. 8A shows an example impulse response of a playback device in (relatively) open space. After the initial excitation, the impulse response does not show a reflection, which may indicate that the playback device is outdoors, for example. FIG. 8B shows another example impulse response of a playback device that is near a wall. As shown in FIG. 8B, this impulse response includes a reflection of the impulse (near 8.6 ms), which may indicate the presence of a wall. FIG. 8C shows yet another example impulse response of a playback device. As shown in FIG. 8C, the impulse response includes two similar reflections of the impulse (near 8.6 ms and 12 ms). Such similarity may indicate that the two similar reflections are each off of the same wall.

As noted above, in some examples, the first media playback may detect a plurality of audio signals including audio signals emitted by the first media playback and/or audio signals emitted by other playback devices within the media playback system. In some embodiments, the playback device may determine one or more reflection characteristics for each of the detected audio signals (or a portion thereof). Alternatively, a reflection characteristic may be based on two or more audio signals in the plurality of detected audio signals. Other examples are possible as well.

Referring back to the example media playback system that include the first playback device and the second playback device, after detecting the fourth audio signal, the first playback device may then determine one or more reflection characteristics based on the fourth audio signal. Determining the one or more reflection characteristics based on the fourth audio signal may involve, for instance, any of the techniques described above for determining one or more reflection characteristics based on the second audio signal as discussed above.

While characteristics of detected audio signals have been referred to herein as reflection characteristics, in some embodiments, the audio signals may be detected before a reflection occurs. For instance, as noted above, an audio signal may propagate directly, such as from a first playback device to a second playback device.

d. Adjusting an Equalization Setting of the Playback Device Based on the One or More Reflection Characteristics.

At block 508, the playback device adjusts an equalization setting of the playback device based on the one or more reflection characteristics. For instance, one or more of the audio processing components 208 may be configured to alter the frequency response of the playback device. Specifically, the one or more audio components 208 may include one or more filters. When audio content passes through the one or more filters, the amplitude of certain frequencies (or frequency ranges) may be increased. The amplitude of other frequencies (or frequency ranges) may be decreased. Alternatively, the processor 202 may be configured to alter the frequency response of the playback device. The processor 202 may, for example, apply digital signal processing, such as a digital filter, to audio content.

As noted above, one of the one or more reflections characteristics may indicate a frequency or frequency range. The playback device may adjust an equalization setting based on the frequency or frequency range. For instance, if the reflection characteristic indicates bass frequencies are attenuated, the equalization setting may boost bass frequencies (as noted above, 16-512 Hz). Alternatively, if a particular frequency, such as (2 kHz) is a peak or a valley, the equalization may responsively attenuate or boost that frequency.

Adjusting the equalization setting may involve disabling a speaker of the playback device. For instance, the processor 202 may disable the a speaker 212 when the one or more reflection characteristics indicate that the listening experience may be improved by disabling the speaker. For example, an object in close proximity to the front of the speaker may cause distortion, such as muffling, of audio outputted by the speaker. Due to the distortion, the listening experience may be improved by disabling the speaker. In such a circumstance, one or more particular reflection characteristics may indicate that the first audio signal reflected off a close object, such as an object within 10 centimeters of the playback device. Alternatively, the one or more particular reflection characteristics may indicate that the frequency response of the playback device is distorted by the object.

Within examples, adjusting the equalization setting may involve selecting a particular equalization preset from a plurality of equalization presets based on at least one of the one or more reflection characteristics. Some of the equalization presets may be pre-determined. For example, each of the plurality of equalization presets may be a respective bass gain setting. For instance, a "small room" equalization preset may be pre-determined to attenuate bass frequencies. As another example, an "outdoors" equalization preset may be pre-determined to boost bass frequencies. The playback device may then adjust the equalization setting according to the selected particular equalization preset.

e. Causing an Audio Track to Play According to the Adjusted Equalization Setting.

In some embodiments, the playback device may perform block 510. At block 510, the playback device may cause an audio track to play according to the adjusted equalization setting. For instance, the playback device may provide the audio track to the audio processing components 208, which may be adjusted based on the equalization setting. The audio processing components 208 may alter frequency components of the audio track according to the equalization setting. The audio amplifier 210 may then amplify the signal which may cause the speaker(s) 212 to emit the audio track.

f. Sending to a Second Media Playback Device an Indication of the Reflection Characteristic In some embodiments, the playback device may perform block 512. At block 512, the playback device may send to a second media playback device an indication of the reflection characteristic.

Playback devices of the media playback system may share their one or more respective reflection characteristics with the other playback devices in the media playback system. In some configurations, a particular playback device may share its one or more reflection characteristics with all of the playback devices in the media playback system. In other configurations, the particular playback device may share with a subset of playback devices. For example, the particular playback device may be grouped into a zone with three other playback devices, and the particular playback device may share its one or more reflection characteristics with the three other playback devices in its zone.

For instance, referring to FIG. 1, playback device 104 may send a particular reflection characteristic to playback devices 106, 108, and 110 that are grouped with playback device 104 into a zone. In turn, each of playback devices 106, 108, and 110 may receive the particular reflection characteristic. Playback devices 106, 108, and 110 may then send a respective particular reflection characteristic to playback device 104 and to each of the other playback devices in the zone. Each of the playback devices may send and/or receive reflection characteristics via a respective network interface, such as network interface 214 in FIG. 2.

In some circumstances, the playback device may adjust the equalization setting based on determined reflection characteristics from other playback devices within the media playback system. For instance, a particular playback device may adjust its equalization setting based on reflection characteristics from other playback devices grouped with the particular playback device in a zone. Basing the equalization setting on reflection characteristics from other playback devices may result in an equalization setting that is more appropriate for the environment.

Figure 6:
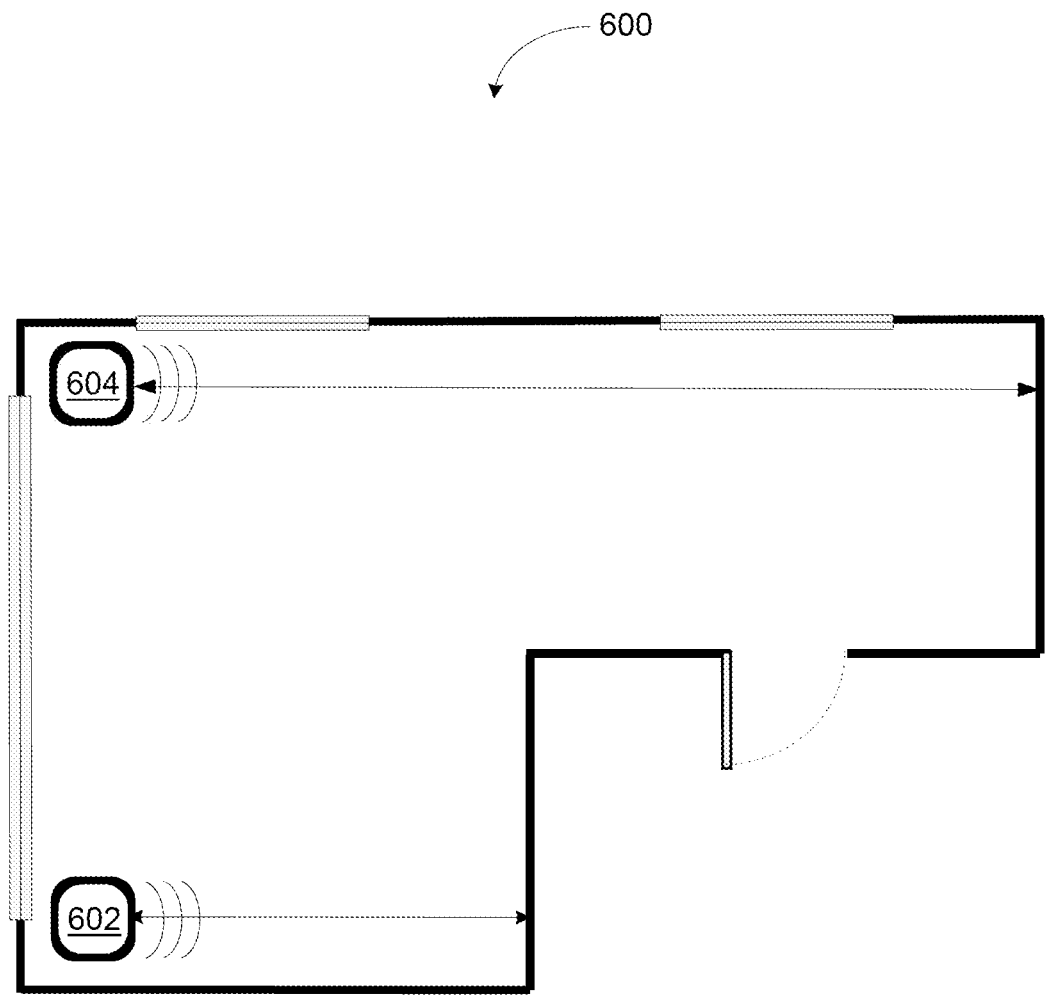
FIG. 6 shows another example media playback system configuration in which certain embodiments may be practiced.

For example, FIG. 6 shows an example configuration of a media playback system 100 that includes playback devices 602 and 604 that are grouped into a zone. Playback devices 602 and 604 may each emit a respective first audio signal, detect a respective second audio signal, and then determine a respective reflection characteristic that indicates the size of the room. Further, playback devices 602 and 604 may exchange respective reflection characteristics by sending and receiving the reflection characteristics over respective network interfaces.

The reflection characteristic determined by playback device 602 may indicate a smaller room than the reflection characteristic determined by playback device 604 because of the relative difference in how far the each emitted first audio signal travels before coming into contact with a respective wall that reflects the first audio signal, as shown. If playback devices 602 and 604 each base their respective equalization setting on their own respective reflection characteristic, then playback device 602 may adjust the equalization to a setting that is appropriate for a small room, while playback device 604 may adjust the equalization to a setting that is appropriate for a large room. In some circumstances, this difference in relative configurations may result in a mismatch in the frequency responses between playback device 602 and 604, which may worsen the listening experience for some users (yet, in other circumstances, this difference may be minor and may not have a significant impact on the listening experiences of users). However, as noted above, playback devices 602 and 604 may adjust the equalization setting based on determined reflection characteristics from one another. For instance, playback devices 602 and 604 may each average their determined reflection characteristic with the determined reflection characteristic of the other playback device. In this manner, the resulting adjusted equalization setting for each of playback devices 602 and 604 may be somewhere between that of a large room and a small room.

Within examples, each playback device of a media playback system may share its adjusted equalization setting with the other playback devices in the media playback system, such as by sending the adjusted equalization setting to other playback devices in the media playback system. In turn, one or more of the other playback devices may adjust their equalization setting based on the received equalization settings.

For instance, a first playback device and a second playback device that are grouped into a zone may each send to one another their respective adjusted equalization setting. Then, each of the first and second playback devices may adjust their respective equalization setting based on the received equalization setting. For example, the first playback device may determine that a particular one of the two adjusted equalization settings from either the first playback device or the second playback device is preferable for the environment. The first playback device may then (i) adjust its equalization setting based on the particular one of the two adjusted equalization settings and/or (ii) instruct the second playback device to adjust its equalization setting based on the particular one of the two adjusted equalization settings.

IV. Conclusion

The description above discloses, among other things, various example systems, methods, apparatus, and articles of manufacture including, among other components, firmware and/or software executed on hardware. It is understood that such examples are merely illustrative and should not be considered as limiting. For example, it is contemplated that any or all of the firmware, hardware, and/or software aspects or components can be embodied exclusively in hardware, exclusively in software, exclusively in firmware, or in any combination of hardware, software, and/or firmware. Accordingly, the examples provided are not the only way(s) to implement such systems, methods, apparatus, and/or articles of manufacture.

As indicated above, the present application involves dynamically adjusting the equalization of a playback device based on the environment in which the playback device is operating. In one aspect, a method is provided. The method involves emitting, by a playback device, a first audio signal, detecting, by the playback device, a second audio signal, wherein at least a portion of the second audio signal is a reflection of the first audio signal, in response to the detecting, determining one or more reflection characteristics, wherein each of the one or more reflection characteristics are based on at least the second audio signal, adjusting an equalization setting of the playback device based on the one or more reflection characteristics; and causing an audio track to play according to the adjusted equalization setting.

In another aspect, a second method is provided. The second method is operable in a media playback system comprising a plurality of playback devices, wherein each playback device comprises a respective microphone and a respective speaker. The second method involves receiving an indication of a first audio signal, detecting, by a microphone of the first playback device, a second audio signal, wherein at least a portion of the second audio signal is indicative of the first audio signal, in response to the detecting, determining a first reflection characteristic based on the second audio signal, adjusting an equalization setting of the first playback device based on at least the first reflection characteristic, and sending to a second media playback device an indication of the first reflection characteristic.

In another aspect, a device is provided. The device includes a speaker, a microphone that is physically coupled to the speaker, a processor, a network interface, a data storage, and a program logic stored in the data storage. The program logic is executable by the processor to emit a first audio signal from the speaker, detect, via the microphone, a second audio signal, wherein at least a portion of the second audio signal is a reflection of the first audio signal, in response to the detecting, determine a first reflection characteristic based on at least the second audio signal, adjust an equalization setting of the playback device based on at least the first reflection characteristic, and play, via the speaker, an audio track according to the equalization setting.

In yet another aspect, a non-transitory computer readable memory is provided. The non-transitory computer readable memory has stored thereon instructions executable by a computing device to cause the computing device to perform functions. The functions include emitting, by a playback device, a first audio signal, detecting, by the playback device, a second audio signal, wherein at least a portion of the second audio signal is a reflection of the first audio signal, in response to the detecting, determining one or more reflection characteristics, wherein each of the one or more reflection characteristics are based on at least the second audio signal, adjusting an equalization setting of the playback device based on the one or more reflection characteristics; and causing an audio track to play according to the adjusted equalization setting.

Additionally, references herein to "embodiment" means that a particular feature, structure, or characteristic described in connection with the embodiment can be included in at least one example embodiment of an invention. The appearances of this phrase in various places in the specification are not necessarily all referring to the same embodiment, nor are separate or alternative embodiments mutually exclusive of other embodiments. As such, the embodiments described herein, explicitly and implicitly understood by one skilled in the art, can be combined with other embodiments.

The specification is presented largely in terms of illustrative environments, systems, procedures, steps, logic blocks, processing, and other symbolic representations that directly or indirectly resemble the operations of data processing devices coupled to networks. These process descriptions and representations are typically used by those skilled in the art to most effectively convey the substance of their work to others skilled in the art. Numerous specific details are set forth to provide a thorough understanding of the present disclosure. However, it is understood to those skilled in the art that certain embodiments of the present disclosure can be practiced without certain, specific details. In other instances, well known methods, procedures, components, and circuitry have not been described in detail to avoid unnecessarily obscuring aspects of the embodiments. Accordingly, the scope of the present disclosure is defined by the appended claims rather than the forgoing description of embodiments.

When any of the appended claims are read to cover a purely software and/or firmware implementation, at least one of the elements in at least one example is hereby expressly defined to include a tangible, non-transitory medium such as a memory, DVD, CD, Blu-ray, and so on, storing the software and/or firmware.

The invention claimed is:

1. A system comprising a playback device, a server, and a control device,
   wherein the playback device comprises a first network interface, at least one microphone within a housing of the playback device, an audio transducer within the housing, at least one first processor and at least one first non-transitory computer-readable medium including instructions that are executable by the at least one first processor such that the playback device is configured to:
   play back first audio content via the audio transducer;
   during playback of at least a portion of the first audio content in a particular environment, detect, via the at least one microphone, a first audio signal, wherein at least a portion of the detected first audio signal comprises a reflection of the first audio content played back by the playback device;
   determine one or more first reflection characteristics based on at least the detected first audio signal, wherein the one or more first reflection characteristics comprise a response representing acoustic characteristics of the particular environment;
   determine an equalization setting that at least partially offsets the acoustic characteristics of the particular environment when applied to playback by the playback device;
   apply the determined equalization setting during playback of second audio content via the audio transducer;
   during playback of at least a first portion of the second audio content, detect, via the at least one microphone, a second audio signal, wherein at least a portion of the detected second audio signal comprises a reflection of the second audio content played back by the playback device;
   determine one or more second reflection characteristics based on at least the detected second audio signal, wherein the one or more second reflection characteristics comprise noise in the particular environment;
   adjust the equalization setting to boost one or more frequency ranges that include the noise in the particular environment; and
   apply the adjusted equalization setting during playback of at least a second portion of the second audio content via the audio transducer, and
   wherein the control device comprises a second network interface, at least one second processor and at least one second non-transitory computer-readable medium including instructions that are executable by the at least one second processor such that the control device is configured to:
   send, via the second network interface to the playback device, data representing one or more instructions to play the second audio content;
   wherein the server comprises a third network interface, at least one third processor and at least one third non-transitory computer-readable medium including instructions that are executable by the at least one third processor such that the server is configured to:
   send, via the third network interface to the playback device, data representing the second audio content.

2. The system of claim 1, wherein the at least one second non-transitory computer-readable medium further comprises instructions that are executable by the at least one second processor such that the control device is configured to:
   receive input data representing a user-defined equalization setting; and
   send, via the second network interface, data representing the user-defined equalization setting, wherein the at least one first non-transitory computer-readable medium further comprises instructions that are executable by the at least one first processor such that the playback device is further configured to:
   apply the determined equalization setting and the user-defined equalization setting concurrently during playback of the second audio content via the audio transducer.

3. The system of claim 1, wherein the instructions that are executable by the at least one first processor such that the playback device is configured to determine the equalization setting comprise instructions that are executable by the at least one first processor such that the playback device is configured to:
   based on the determined one or more first reflection characteristics, determine that the acoustic characteristics boosted or attenuated one or more frequency ranges during playback of the first audio content; and
   adjust the equalization setting to offset the boost or attenuation within the one or more frequency ranges via the audio transducer.

4. The system of claim 1, wherein the instructions that are executable by the at least one first processor such that the playback device is configured to determine the equalization setting comprise instructions that are executable by the at least one first processor such that the playback device is configured to:
   based on the determined one or more first reflection characteristics, determine that bass frequencies during playback of the first audio content were boosted; and adjust the equalization setting to attenuate bass frequencies during playback of the second audio content via the audio transducer.

5. The system of claim 1, wherein the instructions that are executable by the at least one first processor such that the playback device is configured to determine the equalization setting comprise instructions that are executable by the at least one first processor such that the playback device is configured to:
based on the determined one or more first reflection characteristics, determine that treble frequencies during playback of the first audio content were attenuated; and
adjust the equalization setting to boost treble frequencies during playback of the second audio content via the audio transducer.

6. The system of claim 1, wherein the instructions that are executable by the at least one first processor such that the playback device is configured to determine the one or more first reflection characteristics comprise instructions that are executable by the at least one first processor such that the playback device is configured to:
determine at least one first reflection characteristic based on differences between a portion of the first audio content and the detected first audio signal.

7. The system of claim 6, wherein the instructions that are executable by the at least one first processor such that the playback device is configured to determine the at least one first reflection characteristic comprise instructions that are executable by the at least one first processor such that the playback device is configured to:
determine a difference between the response representing the acoustic characteristics of the particular environment and a reference response of the playback device in an anechoic environment.

8. The system of claim 1, wherein the instructions that are executable by the at least one first processor such that the playback device is configured to determine the one or more first reflection characteristics comprise instructions that are executable by the at least one first processor such that the playback device is configured to:
determine one or more qualitative characteristics corresponding to the detected first audio signal.

9. The system of claim 1, wherein the at least one first non-transitory computer-readable medium further comprises that are executable by the at least one first processor such that the playback device is configured to:
detect that the playback device has been physically moved to another location; and
based on the detection that the playback device has been physically moved, re-adjust the equalization setting of the playback device, wherein the instructions that are executable by the at least one first processor such that the playback device is configured to re-adjust the equalization setting of the playback device comprise instructions that are executable by the at least one first processor such that the playback device is configured to:
during playback of at least a portion of additional audio content in another environment, detect, via the at least one microphone, an additional audio signal;
determine one or more additional reflection characteristics based on at least the detected additional audio signal, wherein the one or more additional reflection characteristics comprise a response representing acoustic characteristics of the another environment;
determine an additional equalization setting that at least partially offsets the acoustic characteristics of the another environment when applied to playback by the playback device; and
apply the determined additional equalization setting during playback of the additional audio content via the audio transducer.

10. The system of claim 9, wherein the playback device further comprises an accelerometer, and wherein the instructions that are executable by the at least one first processor such that the playback device is configured to detect that the playback device has been physically moved to another location comprise instructions that are executable by the at least one first processor such that the playback device is configured to:
receive, via the accelerometer, accelerometer data indicating that the playback device has experienced a change in acceleration representing a change in position or orientation.

11. The system of claim 1, wherein the playback device further comprises an accelerometer, wherein the at least one first non-transitory computer-readable medium further comprises instructions are executable by the at least one first processor such that the playback device is configured to:
detect, via the accelerometer, accelerometer data indicating movement of the playback device; and
based on the detection of the accelerometer data, re-adjust the equalization setting of the playback device, wherein the instructions that are executable by the at least one first processor such that the playback device is configured to re-adjust the equalization setting of the playback device comprise instructions that are executable by the at least one first processor such that the playback device is configured to:
during playback of at least a portion of additional audio content in another environment, detect, via the at least one microphone, an additional audio signal;
determine one or more additional reflection characteristics based on at least the detected additional audio signal, wherein the one or more additional reflection characteristics comprise a response representing acoustic characteristics of the another environment;
determine an additional equalization setting that at least partially offsets the acoustic characteristics of the another environment when applied to playback by the playback device; and
apply the determined additional equalization setting during playback of the additional audio content via the audio transducer.

12. The system of claim 11, wherein the instructions that are executable by the at least one first processor such that the playback device is configured to detect the accelerometer data indicating movement comprise instructions that are executable by the at least one first processor such that the playback device is configured to:
detect particular accelerometer data indicating that the playback device has been physically moved to another location.

13. The system of claim 1, wherein the first audio content is a first portion of an audio track, and wherein the second audio content is a second portion of the audio track.

14. A system comprising a playback device and a control device, wherein the playback device comprises a first network interface, at least one microphone within a housing of the playback device, an audio transducer within the housing, at least one first processor and at least one first non-transitory computer-readable medium including instructions that are executable by the at least one first processor such that the playback device is configured to:

play back first audio content via the audio transducer;
   during playback of at least a portion of the first audio content in a particular environment, detect, via the at least one microphone, a first audio signal, wherein at least a portion of the detected first audio signal comprises a reflection of the first audio content played back by the playback device;
   determine one or more first reflection characteristics based on at least the detected first audio signal, wherein the one or more first reflection characteristics comprise a response representing acoustic characteristics of the particular environment;
   determine an equalization setting that at least partially offsets the acoustic characteristics of the particular environment when applied to playback by the playback device;
   obtain, via the first network interface, data representing second audio content; and
   apply the determined equalization setting during playback of the second audio content via the audio transducer;
   during playback of at least a first portion of the second audio content, detect, via the at least one microphone, a second audio signal, wherein at least a portion of the detected second audio signal comprises a reflection of the second audio content played back by the playback device;
   determine one or more second reflection characteristics based on at least the detected second audio signal, wherein the one or more second reflection characteristics comprise noise in the particular environment;
   adjust the equalization setting to boost one or more frequency ranges that include the noise in the particular environment; and
   apply the adjusted equalization setting during playback of at least a second portion of the second audio content via the audio transducer, and
   wherein the control device comprises a second network interface, at least one second processor and at least one second non-transitory computer-readable medium including instructions that are executable by the at least one second processor such that the control device is configured to:
   send, via the second network interface to the playback device, data representing one or more instructions to play the second audio content.

15. The system of claim 14, wherein the system further comprises a server, wherein the server comprises a third network interface, at least one third processor and at least one third non-transitory computer-readable medium including instructions that are executable by the at least one third processor such that the control device is configured to:
   send, via the third network interface, the data representing the second audio content.

16. The system of claim 14, wherein the at least one second non-transitory computer-readable medium further comprises instructions that are executable by the at least one second processor such that the control device is configured to:
   receive input data representing a user-defined equalization setting; and
   send, via the second network interface, data representing the user-defined equalization setting, wherein the at least one first non-transitory computer-readable medium further comprises instructions that are executable by the at least one first processor such that the playback device is configured to:
   apply the determined equalization setting and the user-defined equalization setting concurrently during playback of the second audio content via the audio transducer.

17. The system of claim 14, wherein the instructions that are executable by the at least one first processor such that the playback device is configured to determine the equalization setting comprise instructions that are executable by the at least one first processor such that the playback device is configured to:
   based on the determined one or more first reflection characteristics, determine that the acoustic characteristics boosted or attenuated one or more frequency ranges during playback of the first audio content; and
   adjust the equalization setting to offset the boost or attenuation within the one or more frequency ranges via the audio transducer.

18. The system of claim 14, wherein the instructions that are executable by the at least one first processor such that the playback device is configured to determine the equalization setting comprise instructions that are executable by the at least one first processor such that the playback device is configured to:
   based on the determined one or more first reflection characteristics, determine that bass frequencies during playback of the first audio content were boosted; and
   adjust the equalization setting to attenuate bass frequencies during playback of the second audio content via the audio transducer.

19. The system of claim 14, wherein the instructions that are executable by the at least one first processor such that the playback device is configured to determine the equalization setting comprise instructions that are executable by the at least one first processor such that the playback device is configured to:
   based on the determined one or more first reflection characteristics, determine that treble frequencies during playback of the first audio content were attenuated; and
   adjust the equalization setting to boost treble frequencies during playback of the second audio content via the audio transducer.

20. The system of claim 14, wherein the instructions that are executable by the at least one first processor such that the playback device is configured to determine the one or more first reflection characteristics comprise instructions that are executable by the at least one first processor such that the playback device is configured to:
   determine at least one first reflection characteristic based on differences between a portion of the first audio content and the detected first audio signal.

21. The system of claim 20, wherein the instructions that are executable by the at least one first processor such that the playback device is configured to determine the at least one first reflection characteristic comprise instructions that are executable by the at least one first processor such that the playback device is configured to:
   determine a difference between the response representing the acoustic characteristics of the particular environment and a reference response of the playback device in an anechoic environment.

22. The system of claim 14, wherein the at least one first non-transitory computer-readable medium further comprises instructions that are executable by the at least one first processor such that the playback device is configured to:

detect that the playback device has been physically moved to another location; and based on the detection that the playback device has been physically moved, re-adjust the equalization setting of the playback device, wherein the instructions that are executable by the at least one first processor such that the playback device is configured to re-adjust the equalization setting of the playback device comprise instructions that are executable by the at least one first processor such that the playback device is configured to:

during playback of at least a portion of additional audio content in another environment, detect, via the at least one microphone, an additional audio signal;

determine one or more additional reflection characteristics based on at least the detected additional audio signal, wherein the one or more additional reflection comprise a response representing acoustic characteristics of the another environment;

determine an additional equalization setting that at least partially offsets the acoustic characteristics of the another environment when applied to playback by the playback device; and apply the determined additional equalization setting during playback of the additional audio content via the audio transducer.

23. The system of claim 22, wherein the playback device further comprises an accelerometer, and wherein the instructions that are executable by the at least one first processor such that the playback device is configured to detect that the playback device has been physically moved to another location comprise instructions that are executable by the at least one first processor such that the playback device is configured to:

receive, via the accelerometer, accelerometer data indicating that the playback device has experienced a change in acceleration representing a change in position or orientation.

24. The system of claim 14, wherein the playback device further comprises an accelerometer, wherein the at least one first non-transitory computer-readable medium further comprises instructions that are executable by the at least one first processor such that the playback device is configured to:

detect, via the accelerometer, accelerometer data indicating movement of the playback device; and based on the detection of the accelerometer data, re-adjust the equalization setting of the playback device, wherein the instructions that are executable by the at least one first processor such that the playback device is configured to re-adjust the equalization setting of the playback device comprise instructions that are executable by the at least one first processor such that the playback device is configured to:

during playback of at least a portion of additional audio content in another environment, detect, via the at least one microphone, an additional audio signal;

determine one or more additional reflection characteristics based on at least the detected additional audio signal, wherein the one or more additional reflection characteristics comprise a response representing acoustic characteristics of the another environment;

determine an additional equalization setting that at least partially offsets the acoustic characteristics of the another environment when applied to playback by the playback device; and apply the determined additional equalization setting during playback of the additional audio content via the audio transducer.

25. The system of claim 24, wherein the instructions that are executable by the at least one first processor such that the playback device is configured to detect accelerometer data indicating movement comprise instructions that are executable by the at least one first processor such that the playback device is configured to:

detect particular accelerometer data indicating that the playback device has been physically moved to another location.

26. The system of claim 14, wherein the first audio content is a first portion of an audio track, and wherein the second audio content is a second portion of the audio track.

27. A system comprising a playback device and a server, wherein the playback device comprises a first network interface, at least one microphone within a housing of the playback device, an audio transducer within the housing, at least one first processor and at least one first non-transitory computer-readable medium including instructions that are executable by the at least one first processor such that the playback device is configured to:

play back first audio content via the audio transducer;

during playback of at least a portion of the first audio content in a particular environment, detect, via the at least one microphone, a first audio signal, wherein at least a portion of the detected first audio signal comprises a reflection of the first audio content played back by the playback device;

determine one or more first reflection characteristics based on at least the detected first audio signal, wherein the one or more first reflection characteristics comprise a response representing acoustic characteristics of the particular environment;

determine an equalization setting that at least partially offsets the acoustic characteristics of the particular environment when applied to playback by the playback device;

receive, via the first network interface, data representing one or more instructions to play second audio content;

obtain, via the first network interface from the server, data representing the second audio content;

apply the determined equalization setting during playback of second audio content via the audio transducer;

during playback of at least a first portion of the second audio content, detect, via the at least one microphone, a second audio signal, wherein at least a portion of the detected second audio signal comprises a reflection of the second audio content played back by the playback device;

determine one or more second reflection characteristics based on at least the detected second audio signal, wherein the one or more second reflection characteristics comprise noise in the particular environment;

adjust the equalization setting to boost one or more frequency ranges that include the noise in the particular environment; and apply the adjusted equalization setting during playback of at least a second portion of the second audio content via the audio transducer, and wherein the server comprises a second network interface, at least one second processor and at least one second non-transitory computer-readable medium including instructions that are executable by the at least one second processor such that the server is configured to:

send, via the second network interface to the playback device, the data representing the second audio content.

28. The system of claim 27, wherein the system further comprises a control device, wherein the control device comprises a third network interface, at least one third processor and at least one third non-transitory computer-readable medium including third instructions that are executable by the at least one third processor such that the control device is configured to:
send, via the third network interface to the playback device, the data representing the one or more instructions to play the second audio content.

29. The system of claim 28, wherein at least one third non-transitory computer-readable medium further comprises instructions that are executable by the at least one third processor such that the control device is configured to:
receive input data representing a user-defined equalization setting; and
send, via the third network interface to the playback device, data representing the user-defined equalization setting, wherein the at least one first non-transitory computer-readable medium further comprises instructions that are executable by the at least one first processor such that the playback device is configured to:
apply the determined equalization setting and the user-defined equalization setting concurrently during playback of the second audio content via the audio transducer.

30. The system of claim 27, wherein the instructions that are executable by the at least one first processor such that the playback device is configured to determine the equalization setting comprise instructions that are executable by the at least one first processor such that the playback device is configured to:
based on the determined one or more first reflection characteristics, determine that the acoustic characteristics boosted or attenuated one or more frequency ranges during playback of the first audio content; and
adjust the equalization setting to offset the boosting or attenuation within the one or more frequency ranges via the audio transducer.

31. The system of claim 27, wherein the instructions that are executable by the at least one first processor such that the playback device is configured to determine the equalization setting comprise instructions that are executable by the at least one first processor such that the playback device is configured to:
based on the determined one or more first reflection characteristics, determine that bass frequencies during playback of the first audio content were boosted; and
adjust the equalization setting to attenuate bass frequencies during playback of the second audio content via the audio transducer.

32. The system of claim 27, wherein at least one first comp the instructions that are executable by the at least one first processor such that the playback device is configured to determine the equalization setting comprise instructions that are executable by the at least one first processor such that the playback device is configured to:
based on the determined one or more first reflection characteristics, determine that treble frequencies during playback of the first audio content were attenuated; and
adjust the equalization setting to boost treble frequencies during playback of the second audio content via the audio transducer.

33. The system of claim 27, wherein the instructions that are executable by the at least one first processor such that the playback device is configured to determine the one or more first reflection characteristics comprise instructions that are executable by the at least one first processor such that the playback device is configured to:
determine at least one first reflection characteristic based on differences between a portion of the first audio content and the detected first audio signal.

34. The system of claim 27, wherein the instructions that are executable by the at least one first processor such that the playback device is configured to determine at least one reflection characteristic based on differences between a portion of the first audio content and the detected first audio signal comprise instructions that are executable by the at least one first processor such that the playback device is configured to:
determine a difference between the response representing the acoustic characteristics of the particular environment and a reference response of the playback device in an anechoic environment.

35. The system of claim 27, wherein the at least one first non-transitory computer-readable medium further comprises instructions that are executable by the at least one first processor such that the playback device is configured to:
detect that the playback device has been physically moved to another location; and
based on the detection that the playback device has been physically moved, re-adjust the equalization setting of the playback device, wherein the instructions that are executable by the at least one first processor such that the playback device is configured to re-adjust the equalization setting of the playback device comprise instructions that are executable by the at least one first processor such that the playback device is configured to:
during playback of at least a portion of additional audio content in another environment, detect, via the at least one microphone, an additional audio signal;
determine one or more additional reflection characteristics based on at least the detected additional audio signal, wherein the one or more additional reflection characteristics comprise a response representing acoustic characteristics of the another environment;
determine an additional equalization setting that at least partially offsets the acoustic characteristics of the another environment when applied to playback by the playback device; and
apply the determined additional equalization setting during playback of the additional audio content via the audio transducer.

36. The system of claim 35, wherein the playback device further comprises an accelerometer, and wherein the instructions that are executable by the at least one first processor such that the playback device is configured to detect that the playback device has been physically moved to another location comprise instructions that are executable by the at least one first processor such that the playback device is configured to:
receive, via the accelerometer, accelerometer data indicating that the playback device has experienced a change in acceleration representing a change in position or orientation.

37. The system of claim 27, wherein the playback device further comprises an accelerometer, wherein the at least one first non-transitory computer-readable medium further comprises instructions that are executable by the at least one first processor such that the playback device is configured to:

detect, via the accelerometer, accelerometer data indicating movement of the playback device; and based on the detection of the accelerometer data, re-adjust the equalization setting of the playback device, wherein the instructions that are executable by the at least one first processor such that the playback device is configured to re-adjust the equalization setting of the playback device comprise instructions that are executable by the at least one first processor such that the playback device is configured to:

during playback of at least a portion of additional audio content in another environment, detect, via the at least one microphone, an additional audio signal;

determine one or more additional reflection characteristics based on at least the detected additional audio signal, wherein the one or more additional reflection characteristics comprise a response representing acoustic characteristics of the another environment;

determine an additional equalization setting that at least partially offsets the acoustic characteristics of the another environment when applied to playback by the playback device; and apply the determined additional equalization setting during playback of the additional audio content via the audio transducer.

38. The system of claim 37, wherein the instructions that are executable by the at least one first processor such that the playback device is configured to detect accelerometer data indicating movement comprise instructions that are executable by the at least one first processor such that the playback device is configured to:

detect particular accelerometer data indicating that the playback device has been physically moved to another location.

* * * * *

UNITED STATES PATENT AND TRADEMARK OFFICE
CERTIFICATE OF CORRECTION

PATENT NO. : 11,696,081 B2
APPLICATION NO. : 17/113799
DATED : July 4, 2023
INVENTOR(S) : William H. Bush It is certified that error appears in the above-identified patent and that said Letters Patent is hereby corrected as shown below:

In the Claims

In Column 26, in Claim 11, Line 23, delete "are" and insert -- that are --, therefor.

In Column 29, in Claim 22, Line 18, delete "reflection" and insert -- reflections --, therefor.

In Column 31, in Claim 32, Lines 56-57, delete "wherein at least one first comp the instructions" and insert -- wherein the instructions --, therefor.

Signed and Sealed this
Fifteenth Day of August, 2023

Katherine Kelly Vidal
*Director of the United States Patent and Trademark Office*